(12) United States Patent
Baek et al.

(10) Patent No.: US 7,507,994 B2
(45) Date of Patent: Mar. 24, 2009

(54) THIN FILM TRANSISTOR ARRAY PANELS FOR A LIQUID CRYSTAL DISPLAY AND A METHOD FOR MANUFACTURING THE SAME

(75) Inventors: Bum-Ki Baek, Suwon (KR); Mun-Pyo Hong, Seongnam (KR); Jang-Soo Kim, Suwon (KR); Sung-Wook Hao, Seoul (KR); Jong-Soo Yoon, Cheonan (KR); Doug-Gyu Kim, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 39 days.

(21) Appl. No.: 11/625,694

(22) Filed: Jan. 22, 2007

(65) Prior Publication Data

US 2007/0126005 A1    Jun. 7, 2007

Related U.S. Application Data

(63) Continuation of application No. 11/080,612, filed on Mar. 16, 2005, now Pat. No. 7,176,496, which is a continuation of application No. 10/302,927, filed on Nov. 25, 2002, now Pat. No. 6,887,742, which is a continuation of application No. 09/545,891, filed on Apr. 7, 2000, now Pat. No. 6,524,876.

(30) Foreign Application Priority Data

| Apr. 8, 1999 | (KR) | 1999-12287 |
| Jul. 8, 1999 | (KR) | 1999-27550 |
| Aug. 12, 1999 | (KR) | 1999-33091 |

(51) Int. Cl.
*H01L 29/04*    (2006.01)
(52) U.S. Cl. .............. 257/59; 257/72; 257/40; 257/149; 257/E21.414
(58) Field of Classification Search .............. 257/59, 257/40, 72, 149, E21.414
See application file for complete search history.

(56) References Cited

U.S. PATENT DOCUMENTS

| 6,195,140 B1 * | 2/2001 | Kubo et al. | 349/44 |
| 6,259,119 B1 * | 7/2001 | Ahn et al. | 257/72 |

* cited by examiner

*Primary Examiner*—Evan Pert
*Assistant Examiner*—Tan N Tran
(74) *Attorney, Agent, or Firm*—F. Chau & Associates, LLC

(57) ABSTRACT

A conductive layer, including a lower layer made of refractory metal such as chromium, molybdenum, and molybdenum alloy and an upper layer made of aluminum or aluminum alloy, is deposited and patterned to form a gate wire including a gate line, a gate pad, and a gate electrode on a substrate. At this time, the upper layer of the gate pad is removed using a photoresist pattern having different thicknesses depending on position as etch mask. A gate insulating layer, a semiconductor layer, and an ohmic contact layer are sequentially formed. A conductive material is deposited and patterned to form a data wire including a data line, a source electrode, a drain electrode, and a data pad.

7 Claims, 54 Drawing Sheets

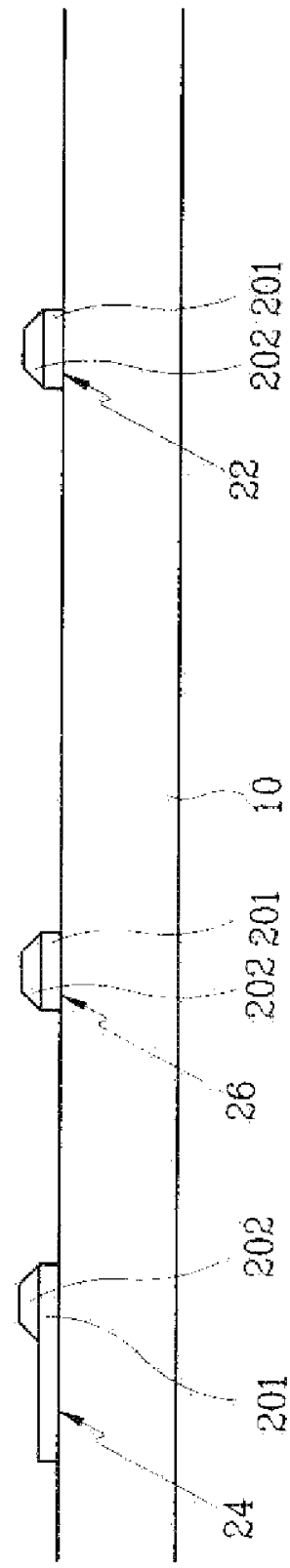

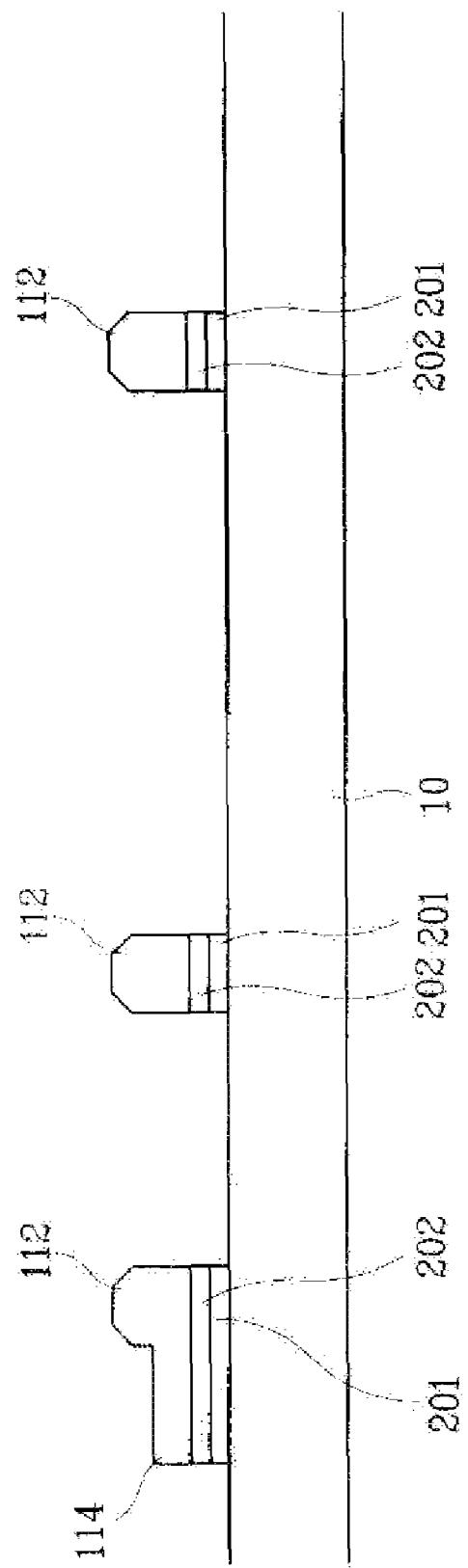

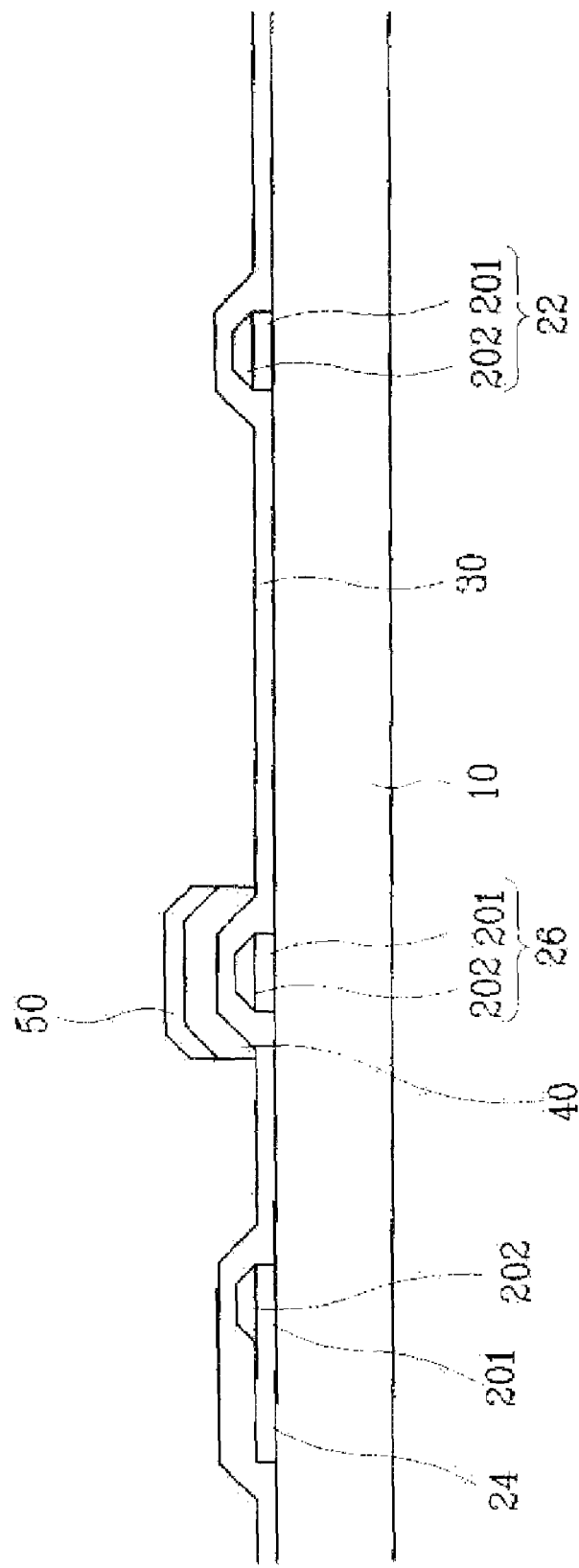

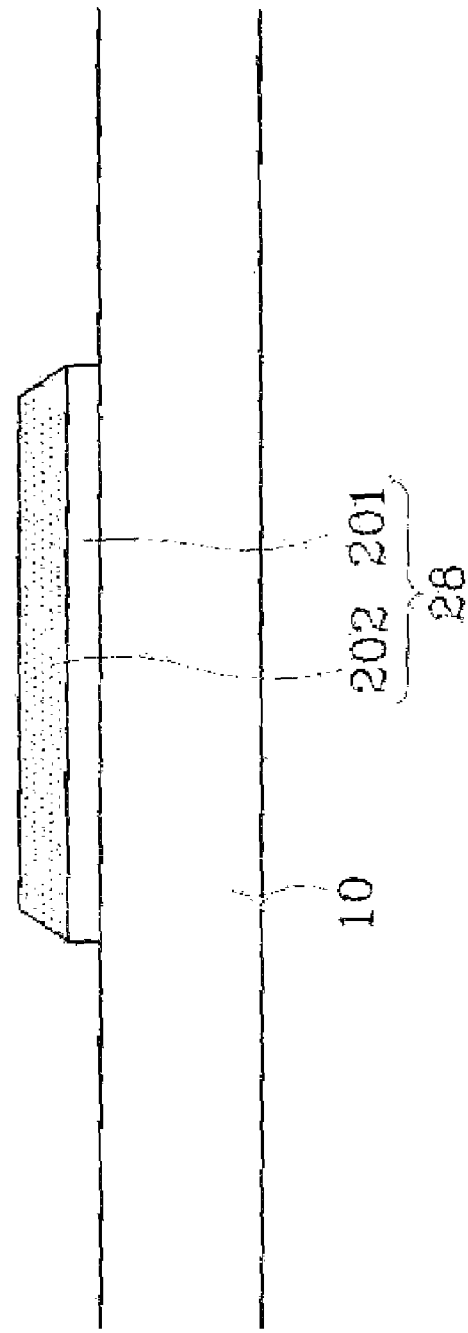

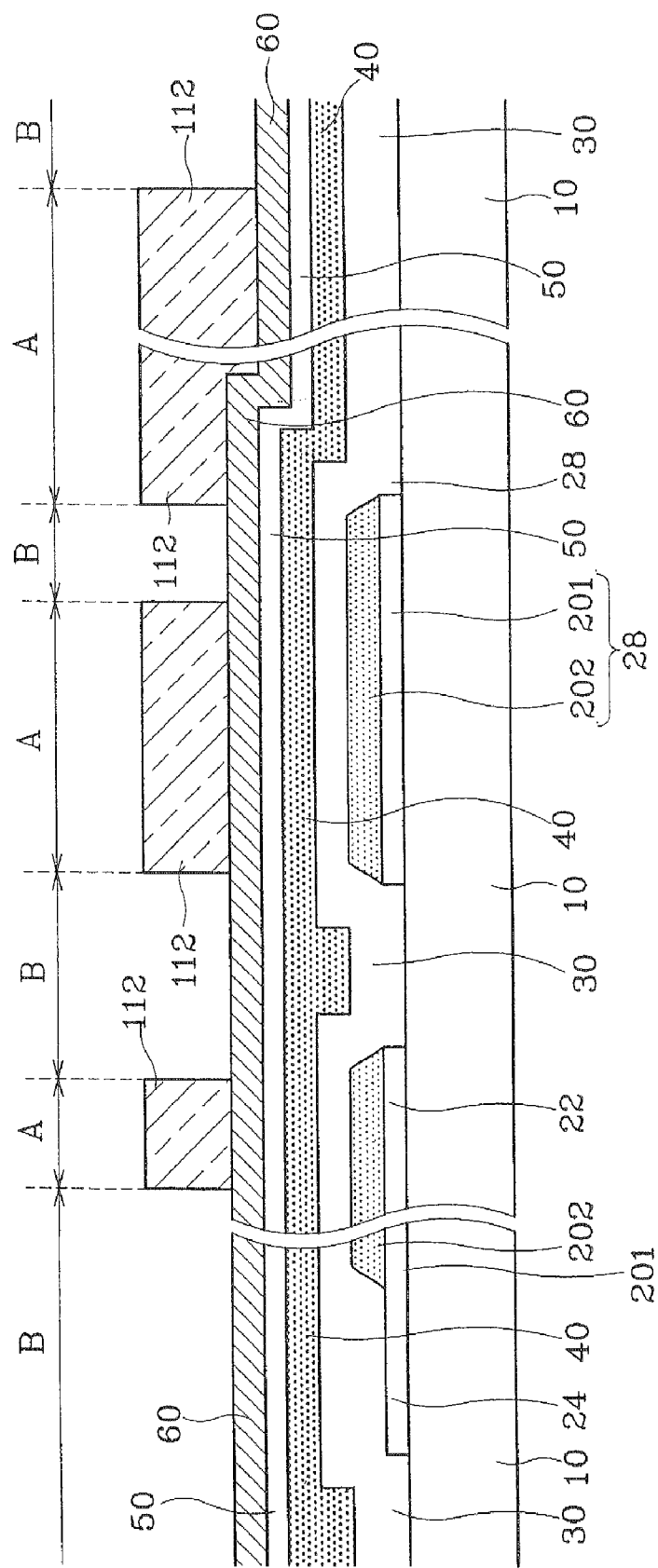

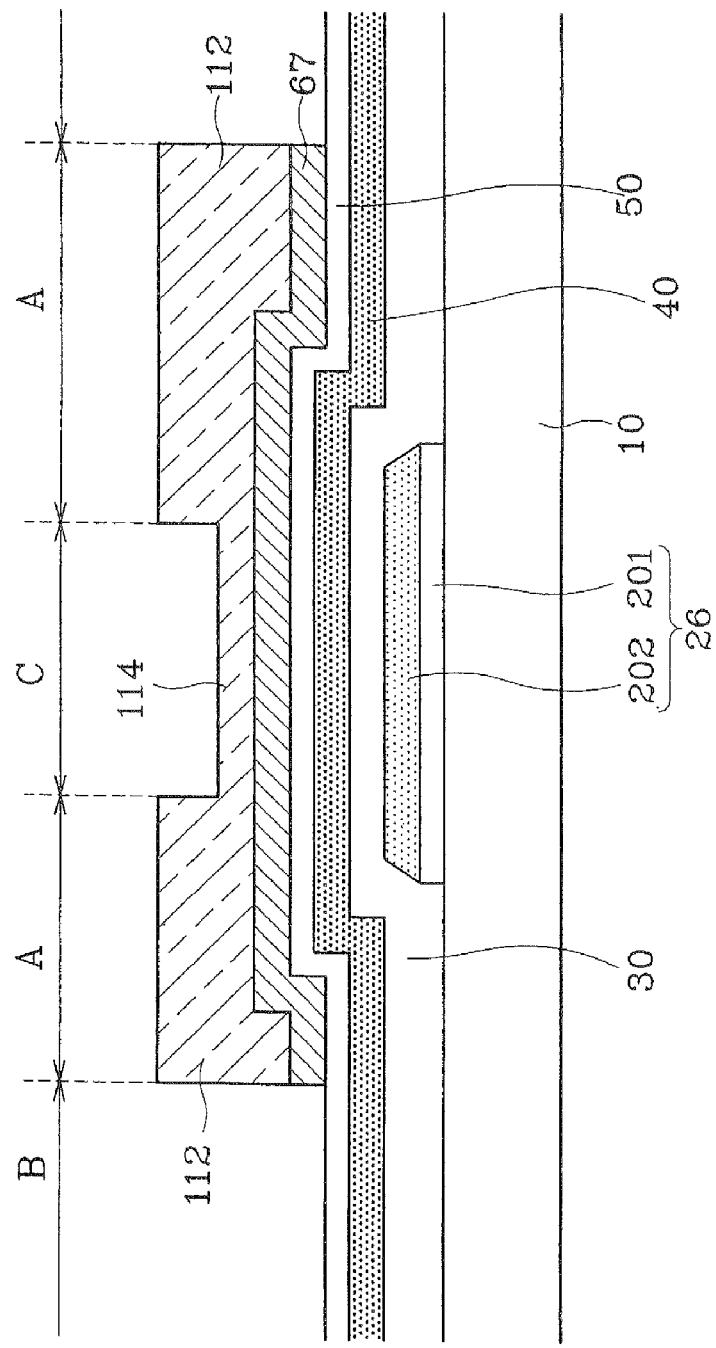

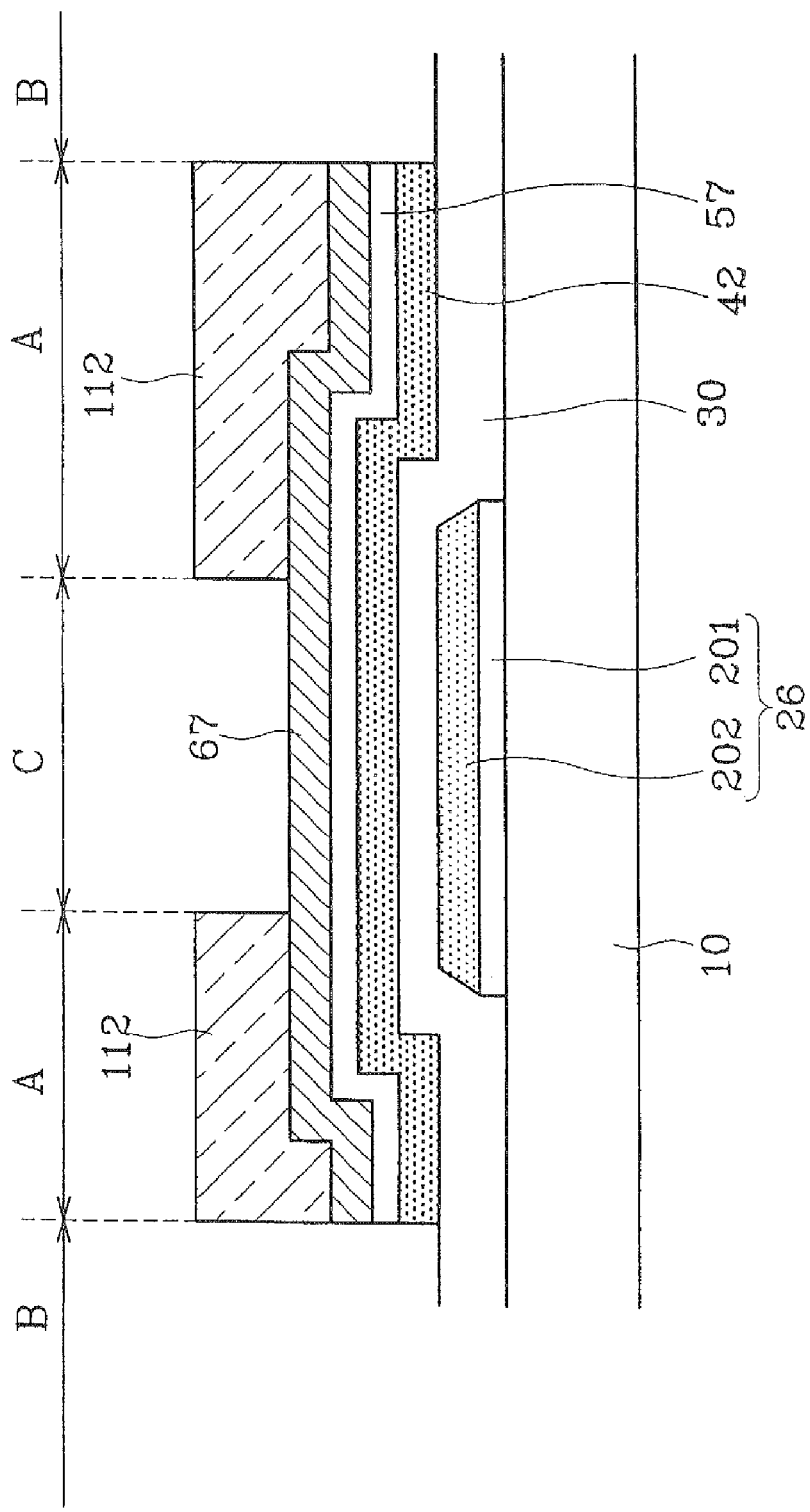

THIN FILM TRANSISTOR ARRAY PANELS FOR A LIQUID CRYSTAL DISPLAY AND A METHOD FOR MANUFACTURING THE SAME

CROSS REFERENCE TO RELATED APPLICATIONS

This application is a continuation of U.S. application Ser. No. 11/083,612 filed on Mar. 16, 2005, now U.S. Pat. No. 7,176,496 which is a continuation of U.S. application Ser. No. 10/302,927 filed on Nov. 25, 2002 and issued as U.S. Pat. No. 6,887,742, which is a continuation of U.S. application Ser. No. 09/545,891 filed on Apr. 7, 2000 and issued as U.S. Pat. No. 6,524,876, which claims priority to Korean Patent Application Nos. 1999-12287 filed on Apr. 8, 1999, 1999-33091 filed on Aug. 12, 1999, and 1999-27550 filed on Jul. 8, 1999, the disclosures of which are incorporated herein by reference in their entirety.

BACKGROUND OF THE INVENTION (a) Field of the Invention

The present invention relates to a thin film transistor array panel and a method for manufacturing the same.

(b) Description of the Related Art

A liquid crystal display (LCD) is one of the most popular flat panel displays (FPD), The liquid crystal display has two panels having electrodes for generating electric fields and a liquid crystal layer interposed therebetween.

The transmittance of incident light is controlled by the intensity of the electric field applied to the liquid crystal layer.

In the most widely used liquid crystal display, the field-generating electrodes are provided at both of the panels, and one of the panels has switching elements such as thin film transistors.

In general, a thin film transistor array panel is manufactured by photolithography using a plurality of photomasks. Since the photolithography process is expensive, the number of the photolithography steps needs to be minimized.

In order to prevent the delay or distortion of signals applied to wires, materials having a low resistivity, such as aluminum or aluminum alloy, are generally used. However, because of the poor contact properties between aluminum or aluminum alloy and indium tin oxide (ITO), which is used as a transparent electrode in a pad portion of a liquid crystal display, the aluminum or aluminum alloy is removed to prevent the corrosion of aluminum and aluminum alloy and a different material is then inserted therebetween. Accordingly, the manufacturing process is complicated and production costs are increased, Also, it is desirable that a data wire transmitting image signals is made of aluminum or aluminum alloy. However, since such a data wire is connected to an ITO pixel electrode, the data wire is made of material having good contact properties such as chromium and molybdenum. Unfortunately, because material such as chromium and molybdenum has a higher resistivity than aluminum or aluminum alloy, signals are often delayed or distorted in a large scale liquid crystal display.

Also, when combining a completed thin film transistor panel and a completed color filter panel in the manufacturing process, if there are conductive particles between the two panels, the pixel electrode or the data wire of the thin film transistor panel and a common electrode of the color filter panel may be shorted.

SUMMARY OF THE INVENTION

It is therefore an object of the present invention to simplify a method for manufacturing a thin film transistor array panel for a liquid crystal display.

It is another object of the present invention to provide a method for manufacturing a thin film transistor array panel for a liquid crystal display having a good contact structure.

It is still another object of the present invention to prevent the disconnection and corrosion of wires and to minimize the delay or distortion of signals in a large scale liquid crystal display.

It is still yet another object of the present invention to reduce defects of liquid crystal displays by preventing conductive particles from shorting two panels.

These and other objects are provided, according to the present invention, by forming at least two patterns through one photolithography process. A photoresist pattern has different thickness on various positions of an etch mask. Wires are formed by a conductive layer of aluminum or aluminum alloy. In this way, a layer of aluminum or aluminum alloy only on a pad portion may be removed by the photoresist pattern. A redundant line of aluminum or aluminum alloy may be laid on the layer different from the wire. A passivation layer may be formed after the wires and a pixel electrode are formed.

According to the present invention, a conductive layer of a multi-layered structure is deposited on an insulating substrate, and then patterned to form a gate wire including a gate line and a gate electrode connected to the gate line. A gate insulating layer covering the gate wire and a semiconductor layer on the gate insulating layer opposite to the gate electrode are sequentially formed. A data wire including a data line intersecting the gate line, a source electrode connected to the data line and neighboring the gate electrode, and a drain electrode separated from the source electrode and opposite to the source electrode with respect to the gate electrode is formed. Next, a passivation layer covering the data wire is formed, and a pixel electrode connected to the drain electrode is formed. At this time, the conductive layer is selectively patterned by partially exposing the lower layer located at the middle portion of its multi-layered structure.

It is desirable that the gate wire is formed through one photolithography step using a photoresist pattern having different thickness depending on positions. The photoresist pattern may have a first portion having a first thickness, a second portion having a second thickness larger than the first portion, and a third portion having a third thickness smaller than the first thickness.

BRIEF DESCRIPTION OF THE DRAWINGS

The accompanying drawings, which are incorporated in and constitute a part of the specification, illustrate an embodiment of the invention, and, together with the description, serve to explain the principle of the invention.

FIGS. 3B, 3C, 4, and 5 are cross-sectional views taken along the line IIIB-IIIB' of FIG. 3A.

FIG. 6B is a cross-sectional view at the next step following FIG. 3B taken along the line VIB-VIB' of FIG. 6A.

FIGS. 12B and 12C are cross-sectional views taken along the lines XIIB-XIIB' and XIIC-XIIC' of FIG. 12A.

FIGS. 14B and 14C are respectively cross-sectional views taken along the lines XIVB-XIVB' and XIVC-XIVC' of FIG. 14A.

FIGS. 15B, 16B, and 17B are cross-sectional views in the next step following FIG. 14C taken along the line XIVC-XIVC' of FIG. 14A.

DETAILED DESCRIPTION OF THE PREFERRED EMBODIMENTS

Figure 1:
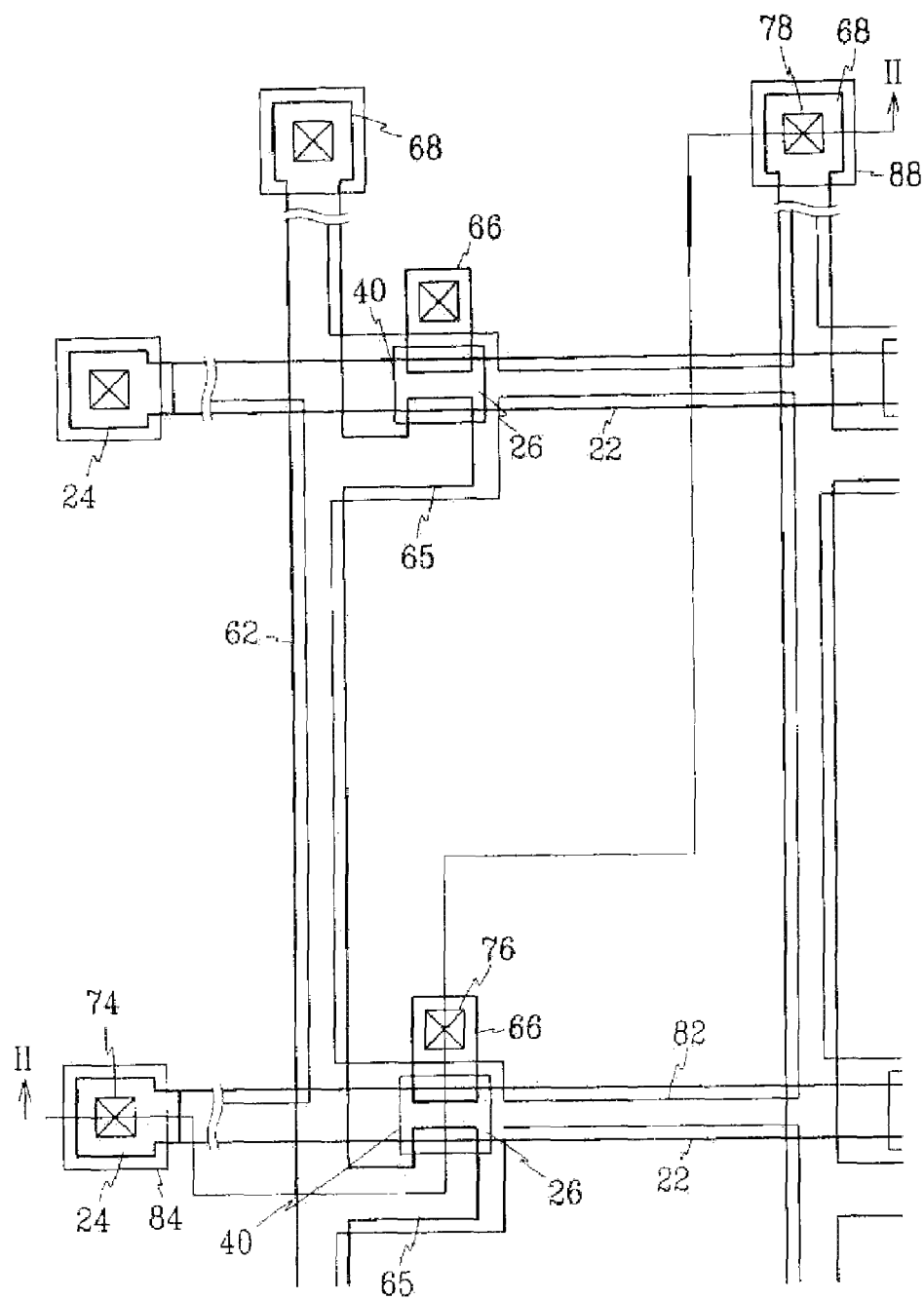
FIG. 1 is a layout view of a thin film transistor array panel for a liquid crystal display according to the first embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. In the drawings, the thickness of layers and regions are exaggerated for clarity. Like numerals refer to like elements throughout. It will be understood that when an element such as a layer, region, or substrate is referred to as being "on" another element, it can be directly on the other element or intervening elements may also be present. In contrast, when an element is referred to as being "directly on" another element, there are no intervening elements present.

First, the structure of the thin film transistor panel for a liquid crystal display (LCD) of the first embodiment according to the present invention will be described with reference to FIGS. 1 and 2.

Figure 2:
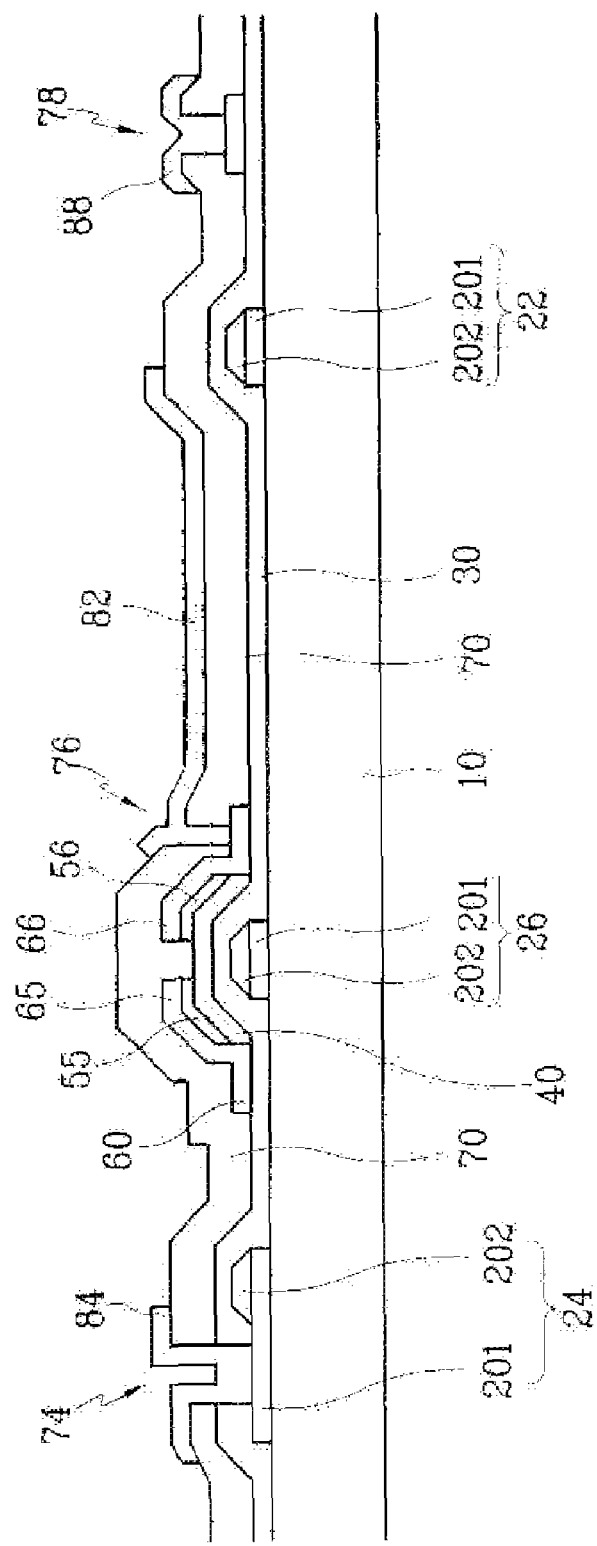
FIG. 2 is cross-sectional view taken along lines II-II" of FIG. 1.

FIG. 1 is a layout view of a thin film transistor array panel for a liquid crystal display according to the first embodiment of the present invention, and FIG. 2 is a cross-sectional view taken along line II-II' of FIG. 1.

Gate wires including a lower layer of conductive material having good contact properties with ITO, such as molybdenum (Mo) or molybdenum alloy (Mo alloy), and chromium (Cr), and an upper layer of conductive material having a low resistivity, such as aluminum (Al) or aluminum alloy (Al alloy), are formed on an insulating substrate 10. A gate wire includes a gate line (or scanning signal line) 22 extending in the horizontal direction in FIG. 1, a gate pad 24 that is connected to an end of the gate line 22 and transmits a scanning signal from an external circuit to the gate line 22, and a gate electrode 26 that is a part of a thin film transistor. At this time, the gate pad 24 is only formed of the lower layer 201.

A gate insulating layer 30 of silicon-nitride (SiNx) is formed on and covers the gate wire parts 22, 24, and 26. The gate insulating layer 30 has a contact hole 74 exposing the gate pad 24 along with a passivation layer 70, which will be formed later, and completely covers the upper layer 202 of the gate wires 22 and 26.

A semiconductor layer 40 such as hydrogenated amorphous silicon is formed in an island-like shape on the gate insulating layer 30 of the gate electrode 26. Ohmic contact layers 55 and 56 (made of such materials as silicide or hydrogenated amorphous silicon heavily doped with impurities like phosphorus) are formed on the semiconductor layer 40.

A data wire made of conductive materials such as Mo or Mo alloy and Cr is formed or the ohmic contact layer patterns 55 and 56 and the gate insulating layer 30. The data wire has a data line 62 extending in the vertical direction in FIG. 1 and defining a pixel along with the gate line 22, a data pad 68 that is connected to an end of data line 62 and transmits image signals from an external circuit to the data line 62, a source electrode 6.5 of a thin film transistor that is connected to the data line 62 and is extended on the ohmic contact layer 55, and a drain electrode 66 of the thin film transistor that is formed on the ohmic contact layer 56 opposite the source electrode 65 with respect to the gate electrode 26 and is separated from the source electrode 65.

A passivation layer 70 is formed on the data wire parts 62, 65, 66, and 68, and the semiconductor layer 40 which is not covered by the data wire parts 62, 65, 66, and 68. The passivation layer 70 has contact holes 76 and 78 respectively exposing the drain electrode 66 and the data pad 68, and also has (along with the gate insulating layer 30) another contact hole 74 exposing the lower layer 201 of the gate pad 24 The passivation layer 70 can be made of an insulating material such as SiNx, acrylic organic material, other transparent photo-definable material, or other organic material.

The pixel electrode 82, which receives an image signal and generates an electric field with a common electrode of an upper panel is formed on the passivation layer 70 of the pixel. The pixel electrode 82 is connected to the drain electrode 66 both physically and electrically through the contact hole 76, and receives the image signal from the drain electrode 66. A redundant gate pad 84 and a redundant data pad 88, respectively connected to the lower layer 201 of the gate pad 24 and to the data pad 68 through the contact holes 74 and 78, are formed on the passivation layer 70.

Here, as shown in FIGS. 1 and 2, the pixel electrode 82 overlaps the gate lines 22 or the data lines 62 to make a storage capacitor. If this configuration does not generate enough storage capacitance, a storage wire may be formed with the same layer as the gate wire parts 22, 24, and 26.

A method for manufacturing a thin film transistor array panel according to a first embodiment of the present invention will now be described with reference to the FIGS. 3A to 8B and FIGS. 1 to 2.

Figure 3A:
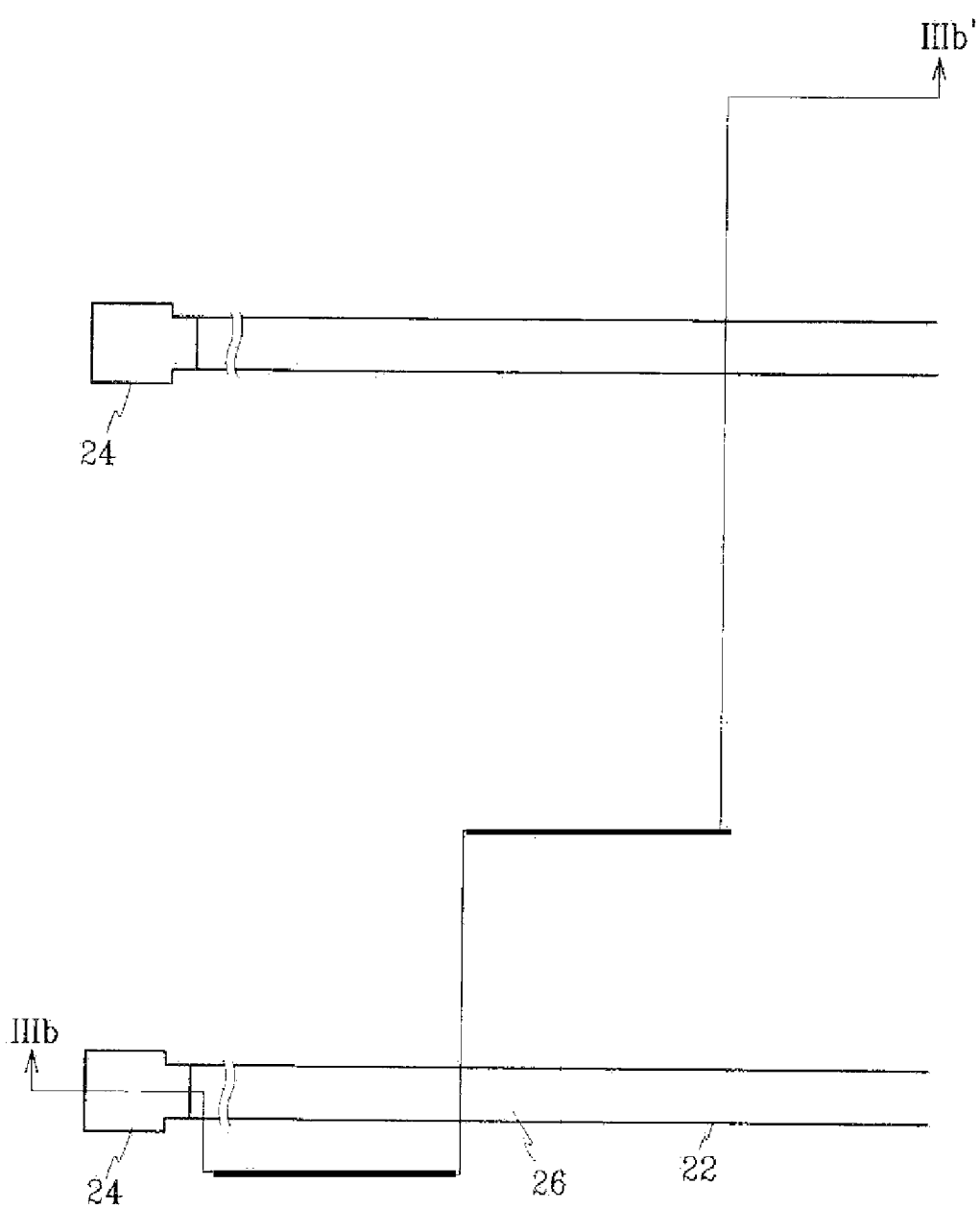
FIGS. 3A, 6A, 7A, and 8A are layout views of a thin film transistor array panel according to a first embodiment of the present invention showing manufacturing steps.
Figure 3C:
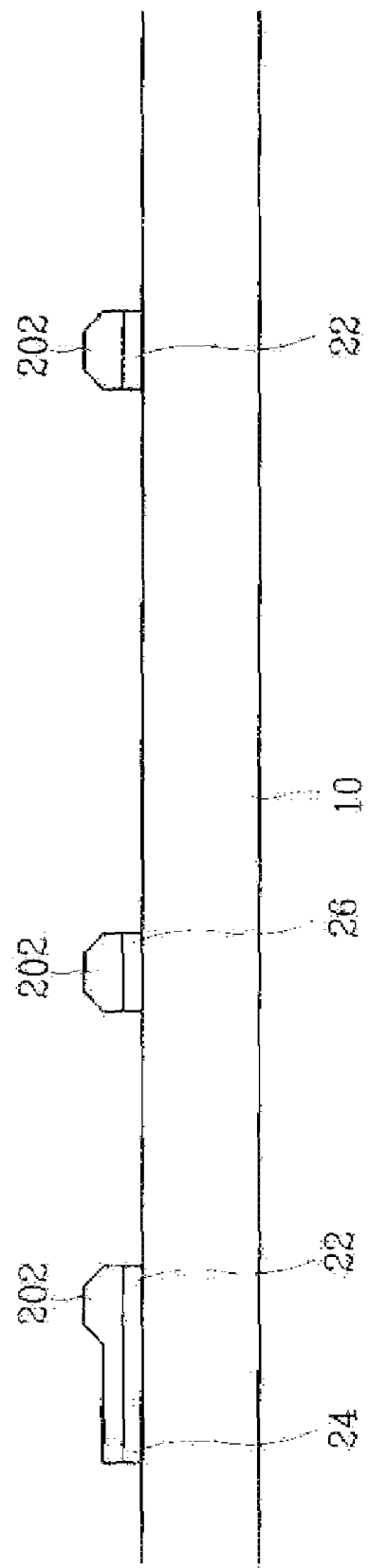

At first, as shown in FIGS. 3A and 3B, a lower layer 201 of a conductive layer having good contact properties with ITO such as chromium, molybdenum, molybdenum alloy and titanium, and an upper layer 202 of a conductive layer having a low resistivity such as aluminum or aluminum alloy are deposited on a substrate 10 by such methods as sputtering to a thickness of 500 Å to 2,500 Å. Then, gate wire parts including as gate line 22 and a gate electrode 26, which have the lower layer 201 and the upper layer 202, and a gate pad 24 made only of the lower layer 201 are formed by dry or wet etching through a photolithography process using a mask.

The lower layer 201 and the upper layer 202 that does not correspond to the gate wire parts 22, 24, and 26 must be all removed, while only the upper layer 202 must be removed on the portion corresponding to the gate pad 24. To achieve this, a photoresist pattern including at least three portions having different thicknesses must be used as etch mask in the photolithography process. A mask including at least three regions having different transmittance values may be used to form the photresist pattern and will be described with reference to FIGS. 4 and 5.

Figure 4:
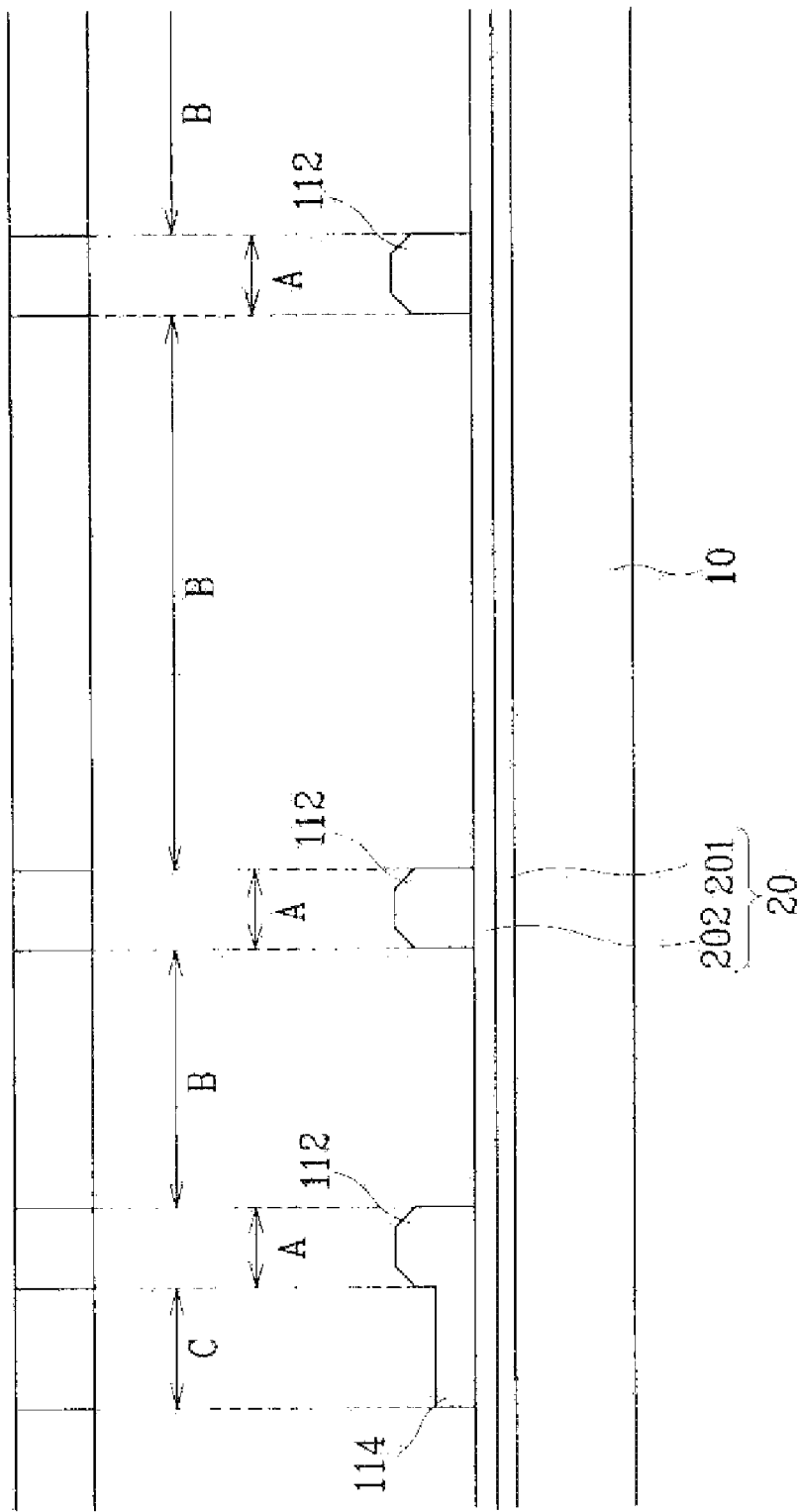

Firstly, as shown in FIG. 4, the lower and the upper layers 201 and 202 are sequentially deposited on the substrate 10, and a photoresist layer is coated on the upper layer 202. Next, the photoresist layer is exposed to light through a mask including three portions A, B, and C, which have different transmittance values, and developed to form photoresist pattern portions 112 and 114 that have different thickness. Here, positive or negative photoresist layers may be used, and it is desirable that the thickness of the photoresist layer is more than 1.9 μm. Also, it is preferable that the thickness of the first portion 114 is equal to or less than half of the second portion 112.

There are many ways to make the thickness of the photoresist layer different depending on positions. A pattern, such as a slit or a lattice, or a partly-transparent layer, may be formed on the C portion of the mask to control the amount of incident light.

At this time, it is desirable that the widths and the intervals of the slit and the lattice are smaller than the resolution of the exposure device. When using a partly-transparent lawyer, the mask including a plurality of thin films having different transmittance values, or a thin film having different thickness depending on positions may be used to control the amount of incident light.

When the photoresist layer is exposed to light, the polymers of the photoresist layer are disintegrated by the light, and the exposing step is finished when the portion of polymers that is directly exposed to the light are completely disintegrated. At this time, the polymers of a photoresist layer, which are exposed through slit patterns or a partly-transparent layer, are not completely dissolved because the amount of incident light is less than that of the directly exposed portion. Hence, the polymers of the photoresist layer hidden by the opaque portions of the mask are hardly dissolved at all. The non-disintegrated part 112 of the photoresist pattern is left after developing the photoresist layer, and a thinner portion 114 of the photoresist pattern is left at the part that was exposed to less light than the parts that received full exposure. However, if the exposure time is too long, all the polymers of the photoresist layer are disintegrated. Therefore, such an overexposure should be avoided.

The second way to make the thickness of the photoresist layer different is reflowing. The photoresist layer is exposed to light through a mask having substantially transparent portions and substantially opaque portions. Then, the photoresist layer is developed to form a photoresist pattern having portions of zero and non-zero thicknesses. The photoresist pattern is allowed to reflow such that the photoresist flows into the zero thickness portions to form a photoresist pattern having the thinner portion 114.

Using these methods, the photoresist pattern having different thickness at different positions is obtained.

Next, as shown in FIG. 5, the upper layer 202 and the lower layer 201 are etched using the photoresist patterns 114 and 112. At this time, when the lower 201 and the upper layer 202 are respectively made of aluminum or aluminum alloy and chromium, wet etching is desirable.

The remaining photoresist layer 114 on the upper layer 202 is then removed, by ashing, the upper layer 202 is etched using the photoresist layer 112 as an etch mask to form the gate electrode 24 of only the lower layer 201, and the remaining photoresist layer is removed. Here, it is preferable that the thickness of the photoresist layer 112 is about 2,000 Å after ashing. At this time, the edge of the upper layer 202 is tapered to have a sloping angle.

Figure 6A:
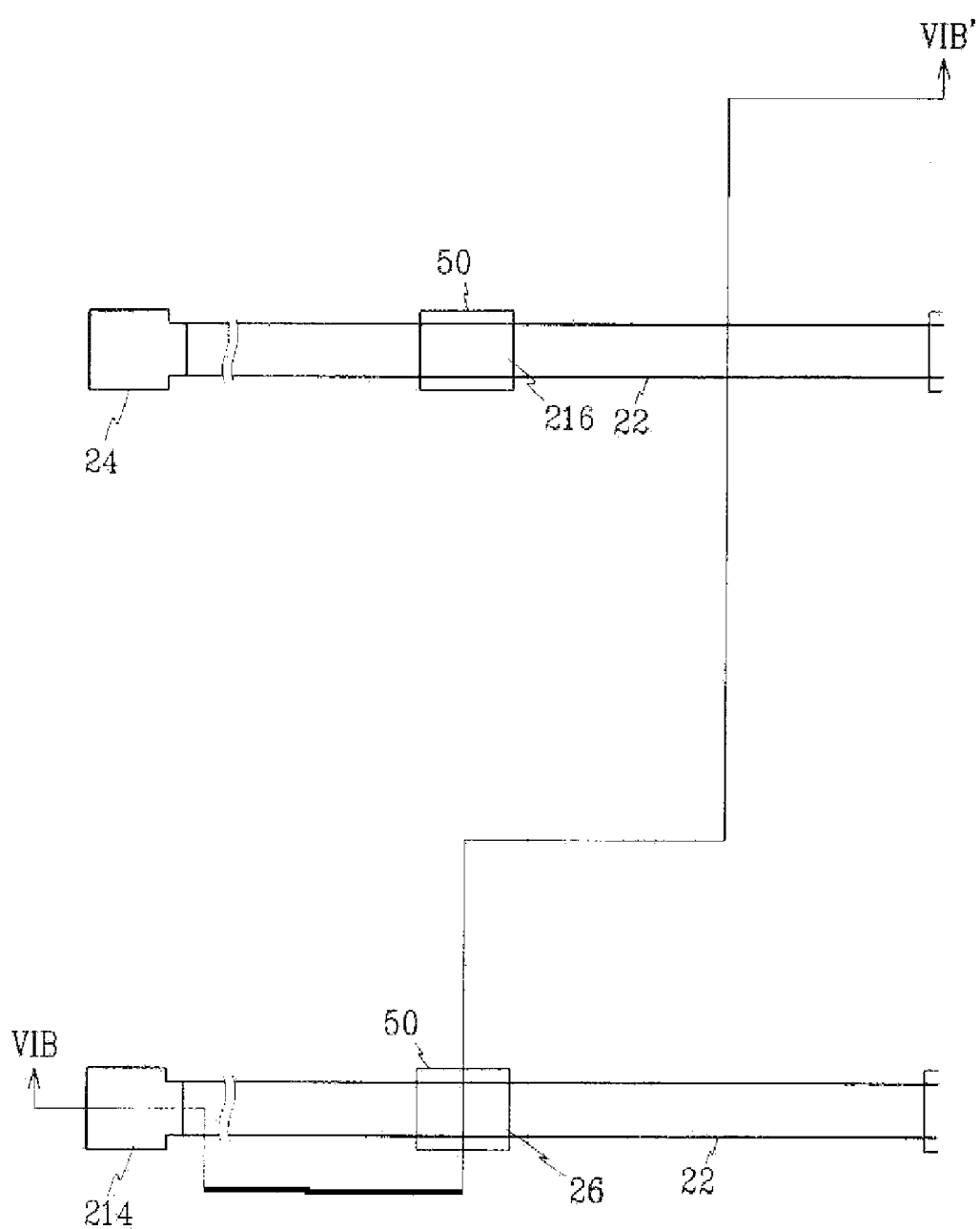

Next, as shown in FIGS. 6A and 6B, a gate insulating layer 30, an amorphous silicon semiconductor layer 40, and a doped amorphous silicon ohmic contact layer 50 are sequentially layered. Then, the semiconductor layer 40 and the ohmic contact layer 50, which are both island shaped, are formed on top of the gate electrode 26 and the opposing gate insulating layer 30 using a mask patterning process.

Figure 7A:
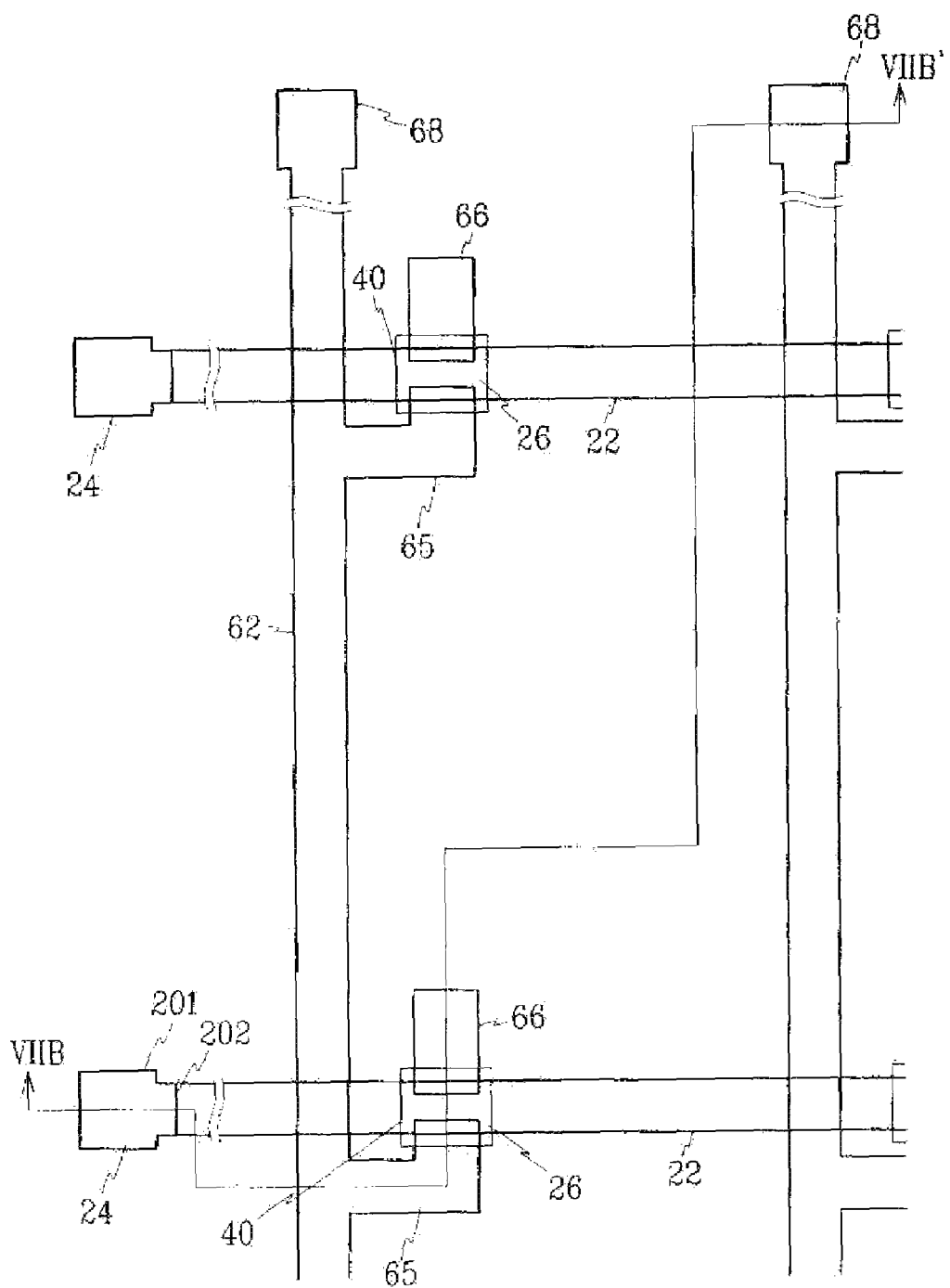
Figure 7B:
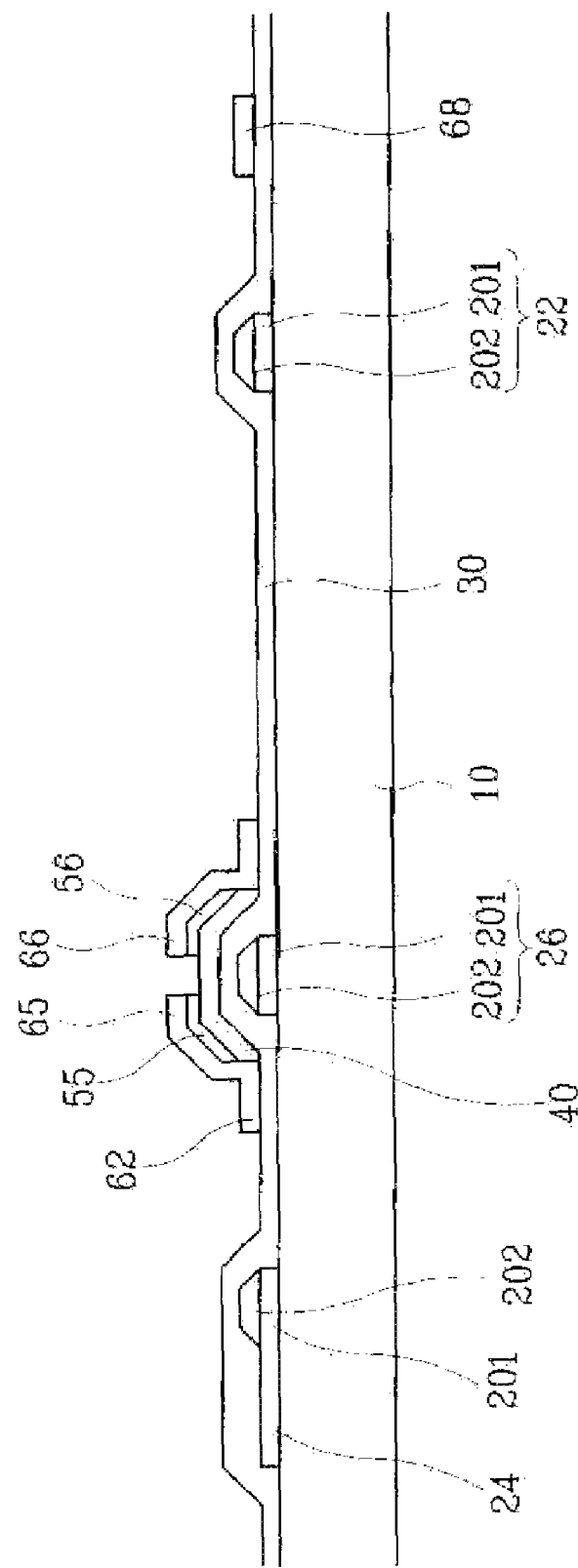
FIG. 7B is a cross-sectional view at the next step following FIG. 6B taken along the line VIIB-VIIB' of FIG. 7A.

Then, as shown in FIGS. 7A and 7B, a conductor layer such as chromium, aluminum, or aluminum alloy is deposited by such methods as sputtering and patterned through a photolithography process using a mask to form a data wire including a data line 62 intersecting the gate line 22, a source electrode 65 connected to the data line 62 and extended over the gate electrode 26, a drain electrode 66 separated from the source electrode 65 and opposite the source electrode 65 with respect to the gate electrode 22 and a data pad 68 connected to the end of the data line 62.

Then, the ohmic contact layer 50 is etched by a plasma dry etch method using the data wires 62, 65, and 68 as a mask to divide the ohmic contact layer 50 at the center of the gate electrode 26, and to expose the central portion of the amorphous silicon layer 40 between the ohmic contact layers 55 and 56.

Figure 8A:
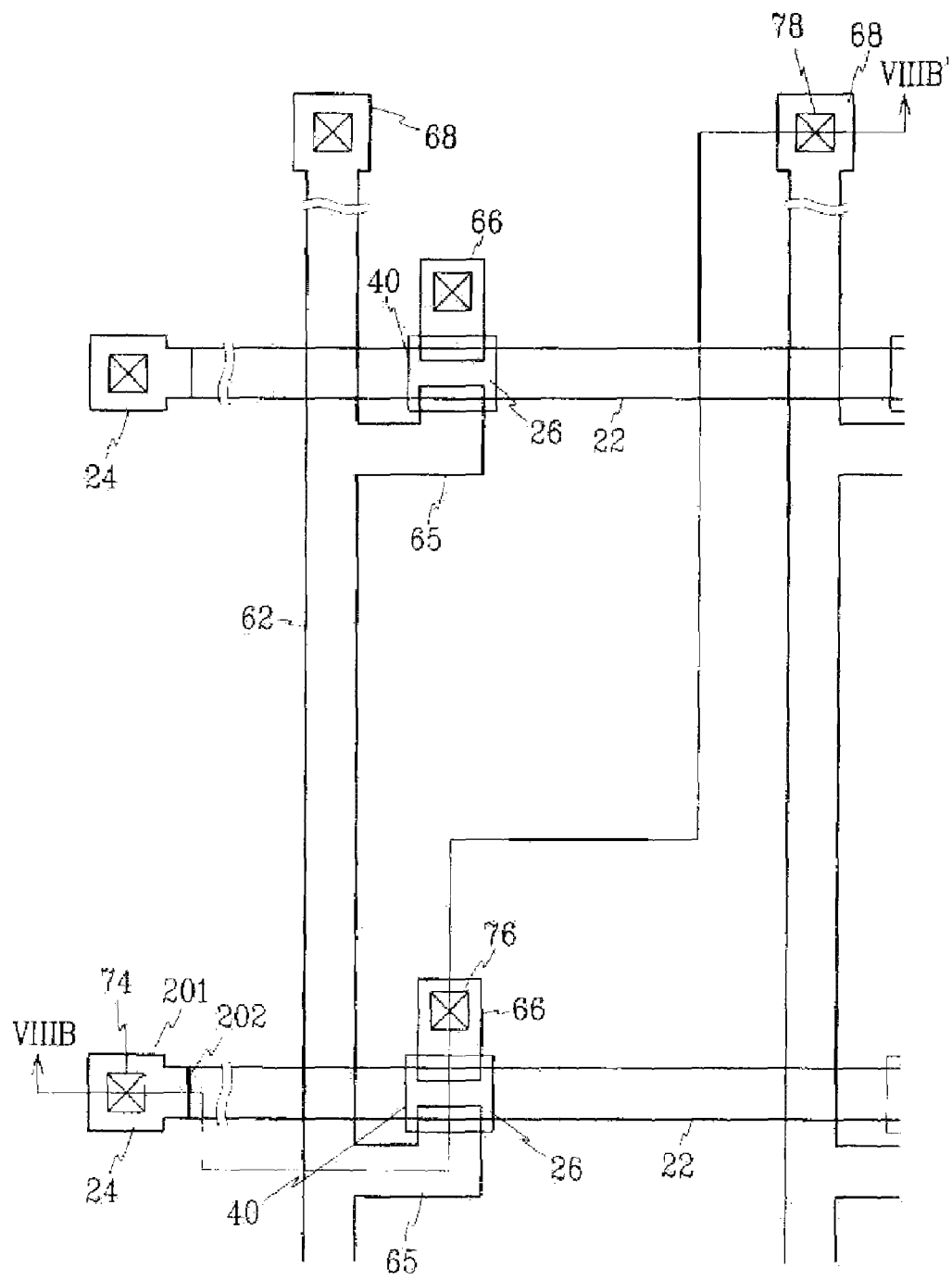
Figure 8B:
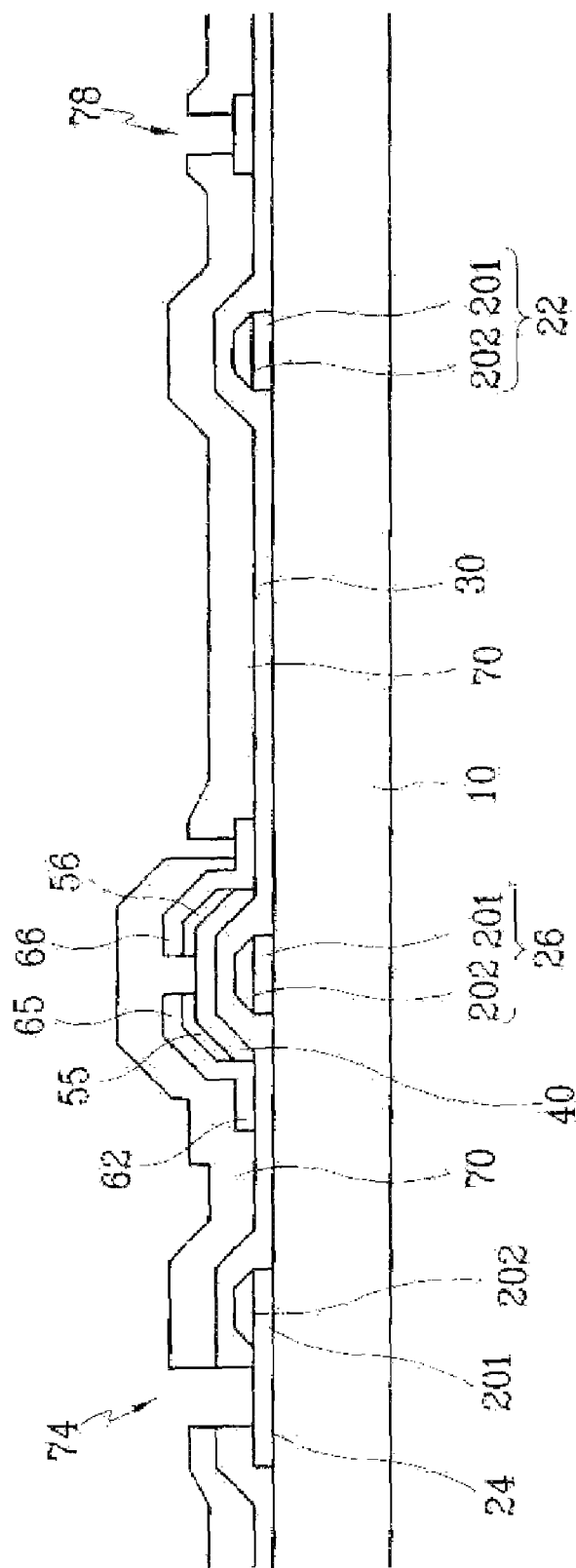
FIG. 8B is a cross-sectional view in the next step following FIG. 7B taken along the line VIIIB-VIIIB' of FIG. 8A.

After forming data wire parts 62, 65, 66, and 68, a passivation layer 70 is coated with an organic insulator, as shown in FIGS. 8A and 8B. Then, contact holes 74, 76, and 78 respectively exposing the gate pad 24, the drain electrode 66, and the data pad 68 are formed by etching the passivation layer 70 and the gate insulating layer 30 at the same time with a third mask. At this time, the upper layer 202 of the gate wire parts 22 and 26 made of aluminum or aluminum alloy is completely covered by the gate insulating layer 30, and only the lower layer 201 of the gate pad 24 is exposed through the contact hole 74.

Next, as shown in FIGS. 1 to 2, an ITO layer is deposited and etched by photolithography using a mask to form a pixel electrode 82, a redundant gate pad 84 and a redundant data pad 88 connected to the drain electrode 66, the gate pad 24 and the data pad 68 through the contact holes 76, 74 and 78, respectively.

As described above in the first embodiment, with the use of a photoresist pattern having different thicknesses depending on positions, contacts between aluminum metals and ITO is prevented so that the additional step of removing aluminum or aluminum alloy from the pad portion may be omitted and the reliability of the pad portion may be enhanced. Because the upper layer 202 made of aluminum alloy is completely covered by the insulating layer 30 and the passivation layer 70, corrosion of the gate wire may be prevented.

Furthermore, by forming the passivation layer, 70 made of an organic insulator having a low dielectric constant, even though the pixel electrode 82 and the data line 62 are overlapped, the distortion of signals may be minimized and the aperture ratio may be increased.

In the first embodiment, the thin film transistor array panel is manufactured by a photolithography process using five photomasks, but a thin film transistor array panel may be manufactured by a photolithography process using four photomasks, and this will be described with reference to FIGS. 9 to 11.

Figure 9:
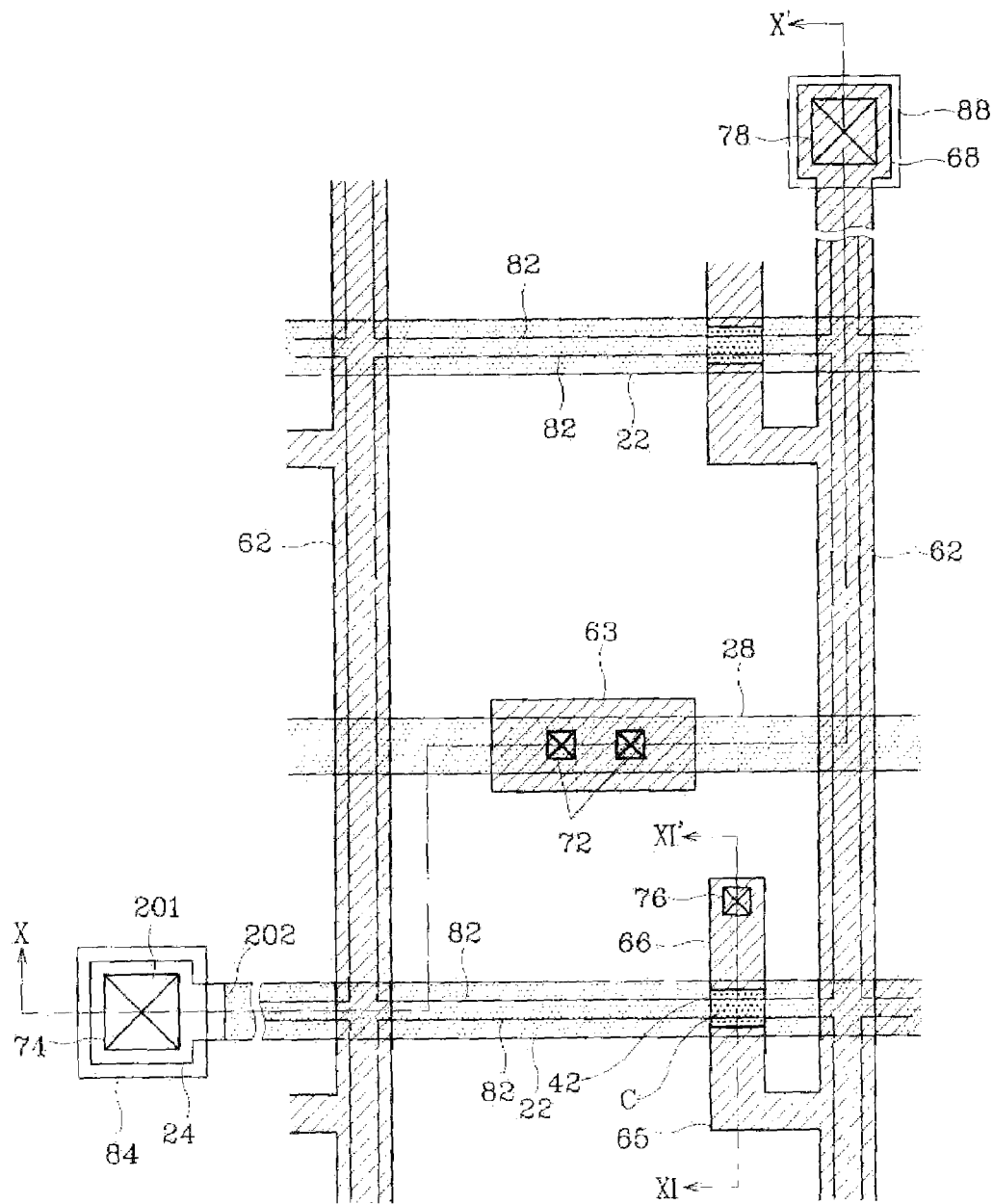
FIG. 9 is a layout view of a thin film transistor array panel for a liquid crystal display according to the second embodiment of the present invention.

FIG. 9 is a layout view of a thin film transistor array panel for a liquid crystal display according to the second embodiment of the present invention. FIGS. 10 and 11 are the cross-sectional views taken along lines X-X' and XI-XI' of FIG. 9.

Gate wires including a gate line (or scanning signal line) 22 and a gate electrode 26, which are made of a lower layer 201 and an upper layer 202, and a gate pad made only of the lower layer 201 are formed on an insulating substrate 10, as in the first embodiment. The gate wire further comprises a storage electrode 28 formed in parallel with the gate line 22 and supplied with a voltage such as a common voltage applied to a common electrode (not shown) on an upper panel of the liquid crystal display. The storage electrode 28 provides the storage capacitance along with a pixel electrode 82 that will be described later. The liquid crystal capacitor includes the pixel electrode 82 and the common electrode. The storage electrode 28 may not be necessary if the pixel electrode 82 and the gate line 22 generate sufficient storage capacitance.

A gate insulating layer 30 of silicon-nitride (SiNx) is formed on and covers the gate wire parts 22, 24, 26 and 28.

A semiconductor pattern 42 and 43 (made of semiconductor such as hydrogenated amorphous silicon) is formed on the gate insulating layer 30. An ohmic contact layer pattern 55, 56, and 53 (made of such materials as amorphous silicon heavily doped with impurities like phosphorus) is formed on the semiconductor patterns 42 and 43.

A data wire made of conductive materials such as Mo or MoW, Cr, Al or Al alloy, and Ta is formed on the ohmic contact layer patterns 55, 56 and 54. The data wire has data line parts including a data line 62 extending in the vertical direction on FIG. 9, a data pad 68 that is connected to an end of data line 62 and transmits image signals from an external circuit to the data line 62, and a source electrode 65 of a thin film transistor that is a branch of the data line 62. The data wire also includes a drain electrode 66 of the thin film transistor on the other side of the gate electrode 26 or the channel part C of a thin film transistor, as well as separate data line parts 62, 68, 65, and a conductor pattern 63 for a storage capacitor located on the storage electrode 28. When the storage electrode 28 is not provided, neither is the conductor pattern 63.

The data wire parts 62, 63, 65, 66, and 68 may have a multiple-layered structure like the gate wire parts 22, 24, 26, and 28. Of course, when the data wire has a multiple-layered structure, it is preferable that one layer is made of a material having a low resistivity and another is made of a material having good contacting properties with other materials.

The ohmic contact layer patterns 55, 56, and 53 reduce the contact resistance between the semiconductor patterns 42 and 43 and the corresponding data wire parts 62, 63, 65, 56, and 68, and have the same layout as the data wire parts 62, 63, 65, 66, and 68. In other words, a first ohmic contact layer portion 55 under the data line part has the same shape as the data line parts 62, 68, and 65, a second ohmic contact layer portion 56 under the drain electrode part has the same shape as the drain electrode 66, and a third ohmic contact layer portion 53 under the conductor pattern 63 has the same shape as the conductor pattern 63 for the storage capacitor.

The semiconductor patterns 42 and 43 have the same layout as the corresponding data wire parts 62, 63, 65, 66, and 68 and the corresponding ohmic contact layer patterns 55 and 56, and except for the channel part C of the thin film transistor. Or, more concretely, the semiconductor portion 43, the conductor pattern 63, and the third ohmic contact layer portion 53 all have the same shape, but the semiconductor portion 42 has a shape different from the data wire and the ohmic contact layer pattern. In other words, the data line parts 62, 68, and 65, especially the source electrode 65 and the drain electrode 66 are separated from each other by the channel part C of the thin film transistor and the portions 55 and 56 of the ohmic contact layer pattern thereunder are also separated from each other. However the semiconductor portion 42 is not divided into two pieces so that it can traverse the channel of a thin film transistor.

A passivation layer 70 is formed on the data wire parts 62, 63, 65, 66, and 68. The passivation layer 70 has contact holes 76, 78, and 72 respectively exposing the drain electrode 66, the data pad 68, and the conductor pattern 63 for the storage capacitor, and also has (along with the gate insulating layer 30) another contact hole 74 exposing the gate pad 24. The passivation layer 70 can be made of an insulating material such as SiNx, acrylic organic material, other transparent photo-definable material, or other organic material.

The pixel electrode 82 that receives an image signal and generates an electric field with a common electrode of an upper panel is formed on the passivation layer 70. The pixel electrode 82 is made of a transparent conductive material such as indium tin oxide (ITO). The pixel electrode 82 is connected to the drain electrode 66 both physically and electrically through the contact hole 76, and receives the image signal from the drain electrode 66. Even though the aperture ratio is increased when the pixel electrode 82 overlaps the gate lines 22 or the adjacent data lines, these lines are not required to overlap the pixel electrode. The pixel electrode 82 is connected to the conductor pattern 63 for the storage capacitor through the contact hole 72 and transmits the image signal to the conductor pattern 63.

A redundant gate pad 84 and a redundant data pad 88 are formed on the gate pad 24 and the data pad 68 and are respectively connected to the gate pad 24 and the data pad 68 through the contact holes 74 and 78. These redundant pads 84 and 88 are optional as they protect the pads 24 and 68 from corrosion caused by the ambient air and strengthen the adhesion between an external circuit and the pads 24 and 68.

In this embodiment, a transparent ITO layer is used as an example of the material of the pixel electrode 82, but an opaque-conductive material may also be used in a reflective type liquid crystal display.

A method for manufacturing a thin film transistor array panel according to an embodiment of the present invention will now be described with reference to the FIGS. 12A to 18C and FIGS. 9 to 11.

Figure 12A:
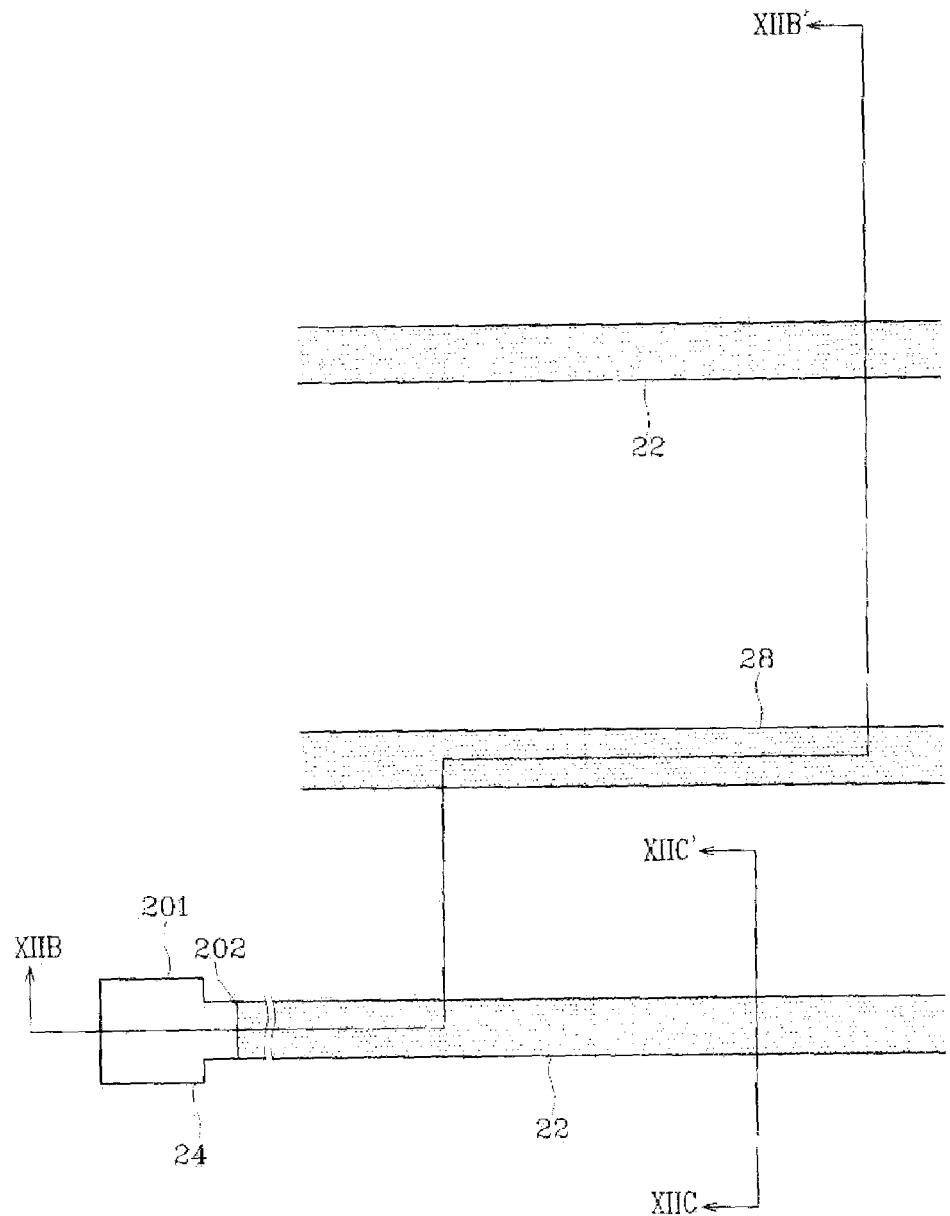
FIG. 12A is a layout view of the thin film transistor array panel according to the second embodiment of the present invention at a first manufacturing step.
Figure 12B:
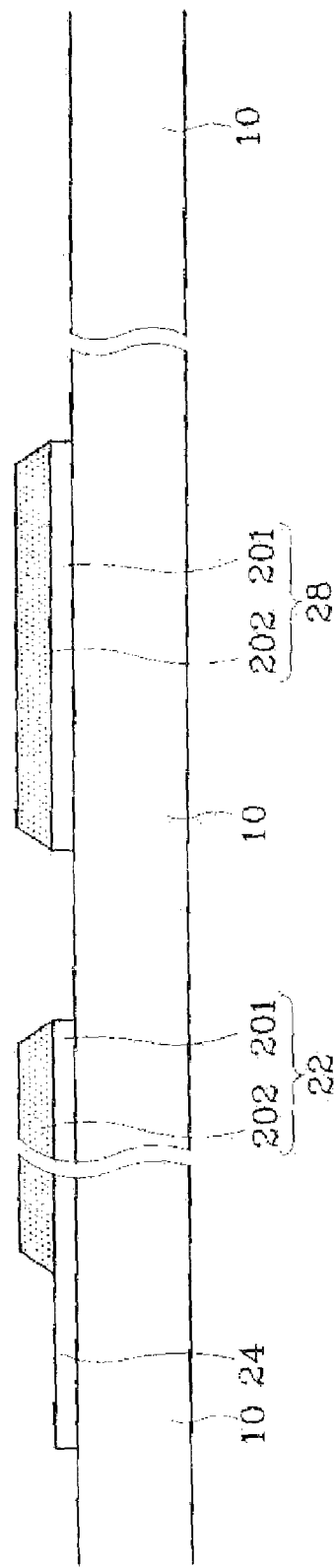

At first, as shown in FIGS. 12A to 12C, gate wire parts including a gate line 22, a gate pad 24, a gate electrode 26, and a storage electrode 28 are formed by dry or wet etching through a photolithography process using a first mask, as in the first embodiment.

The gate wire parts 22, 24, 26, and 28 may have a multiple-layered structure such as a double-layered structure. Also, in this case, it is desirable that a conductive layer made of aluminum or aluminum alloy of the gate pad 24 be removed by using a photoresist pattern having different thicknesses depending on positions.

Figure 13A:
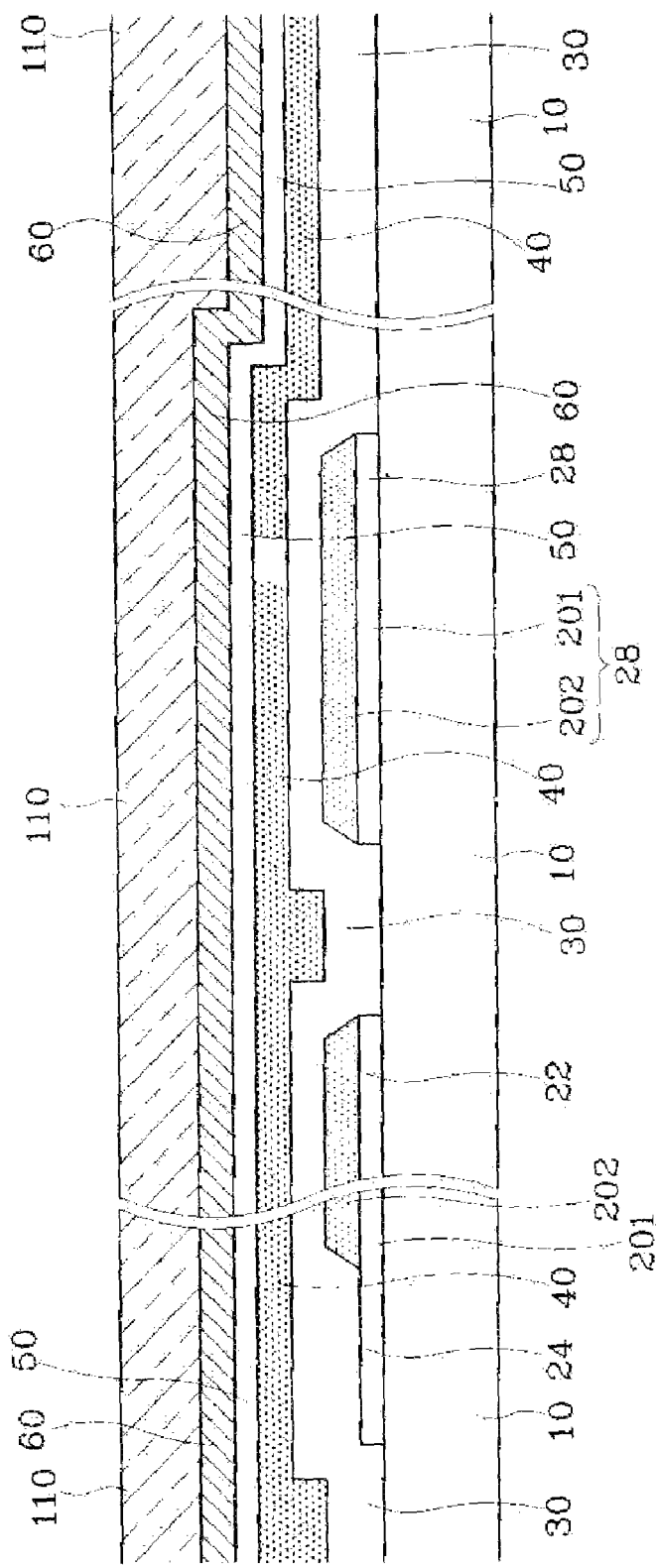
FIGS. 13A and 13B are cross-sectional views in the next step following FIGS. 12B and 12C taken along the lines XIIB-XIIB' and XIIC-XIIC' of FIG. 12A.
Figure 13B:
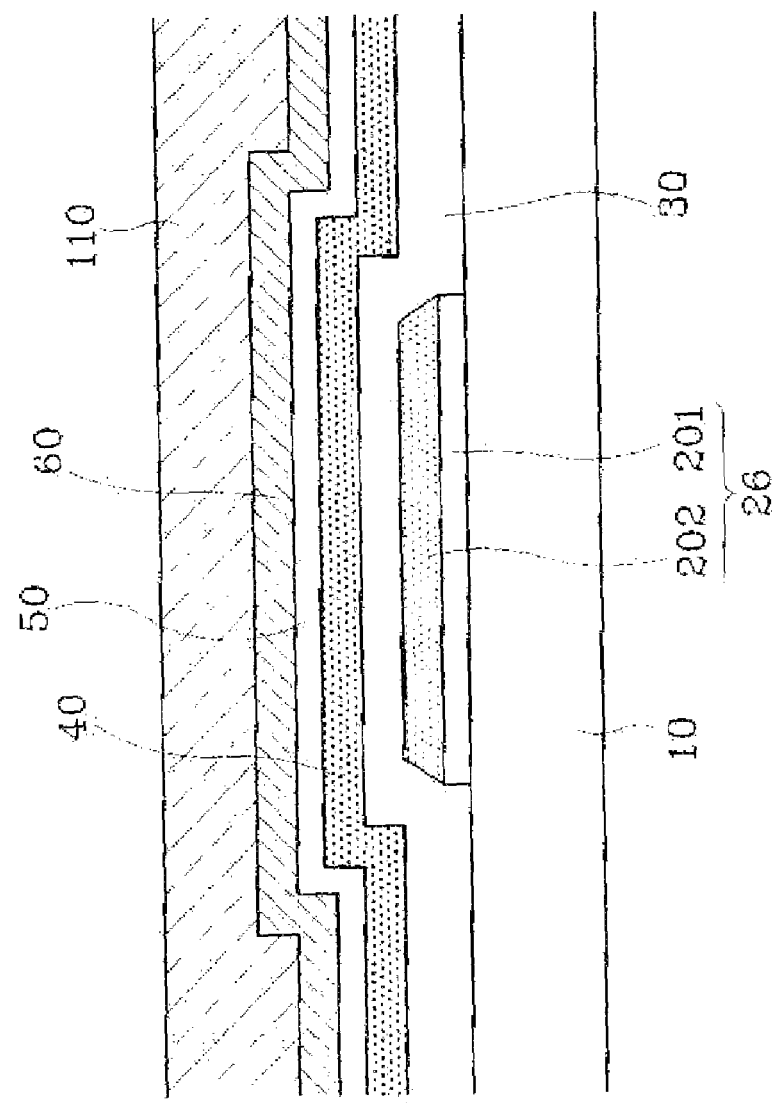

Next, as shown in FIGS. 13A and 13B, a gate insulating layer 30, a semiconductor layer 40, and an ohmic contact layer 50 are sequentially deposited to thicknesses of 1,500 Å to 5,000 Å, 500 Å to 2,000 Å, and 300 Å to 600 Å, respectively, by such methods as chemical vapor deposition (CVD). Then, a conductor layer 60, such as a metal, is deposited to a thickness of 1,500 Å to 3,000 Å by such methods as sputtering, and a photoresist layer 110 having a thickness of 1 μm to 2 μm is coated on the conductive layer 60.

Figure 14A:
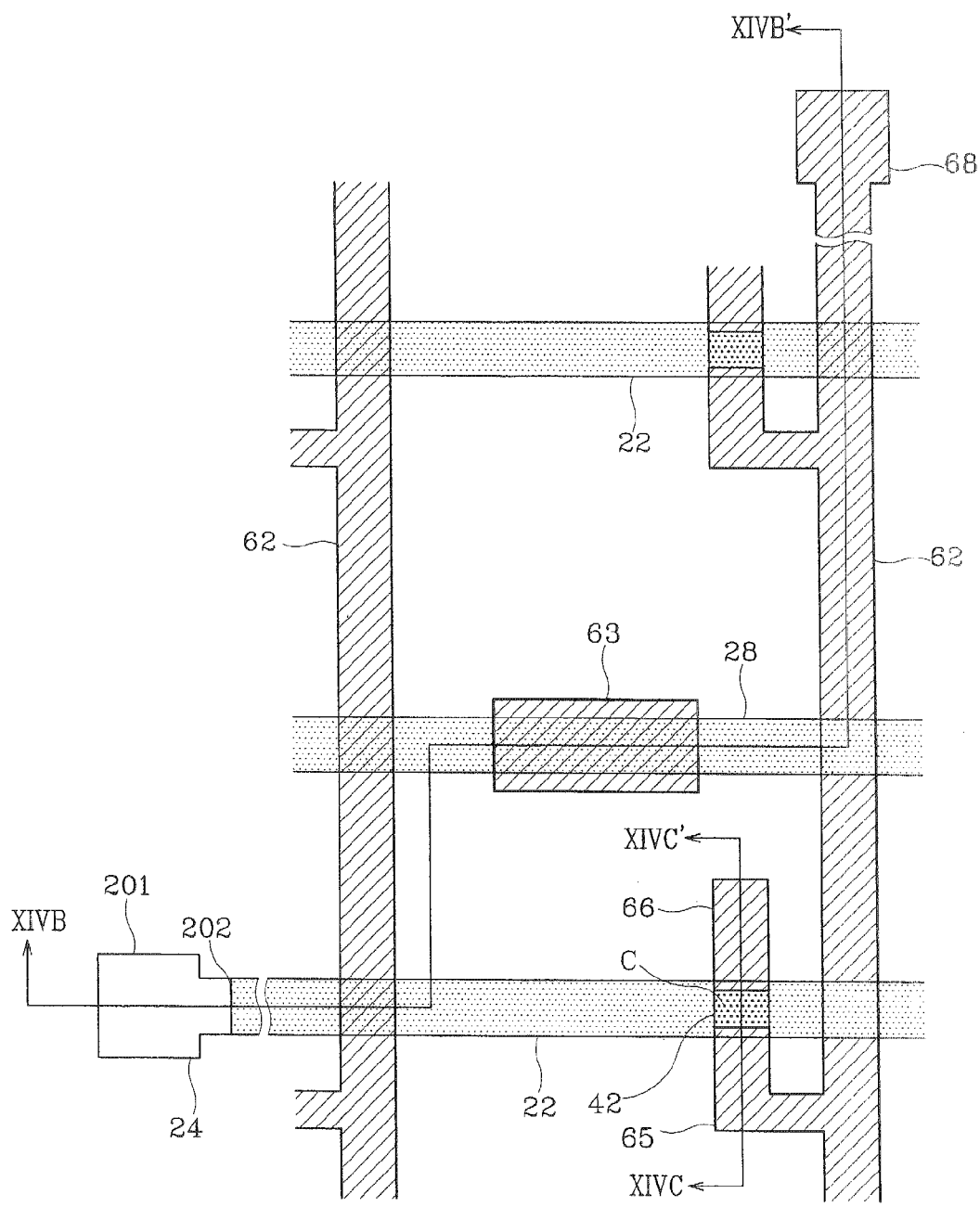
FIG. 14A is a layout view of thin film transistor array panel in the next step following FIGS. 13A and 13B.
Figure 14C:
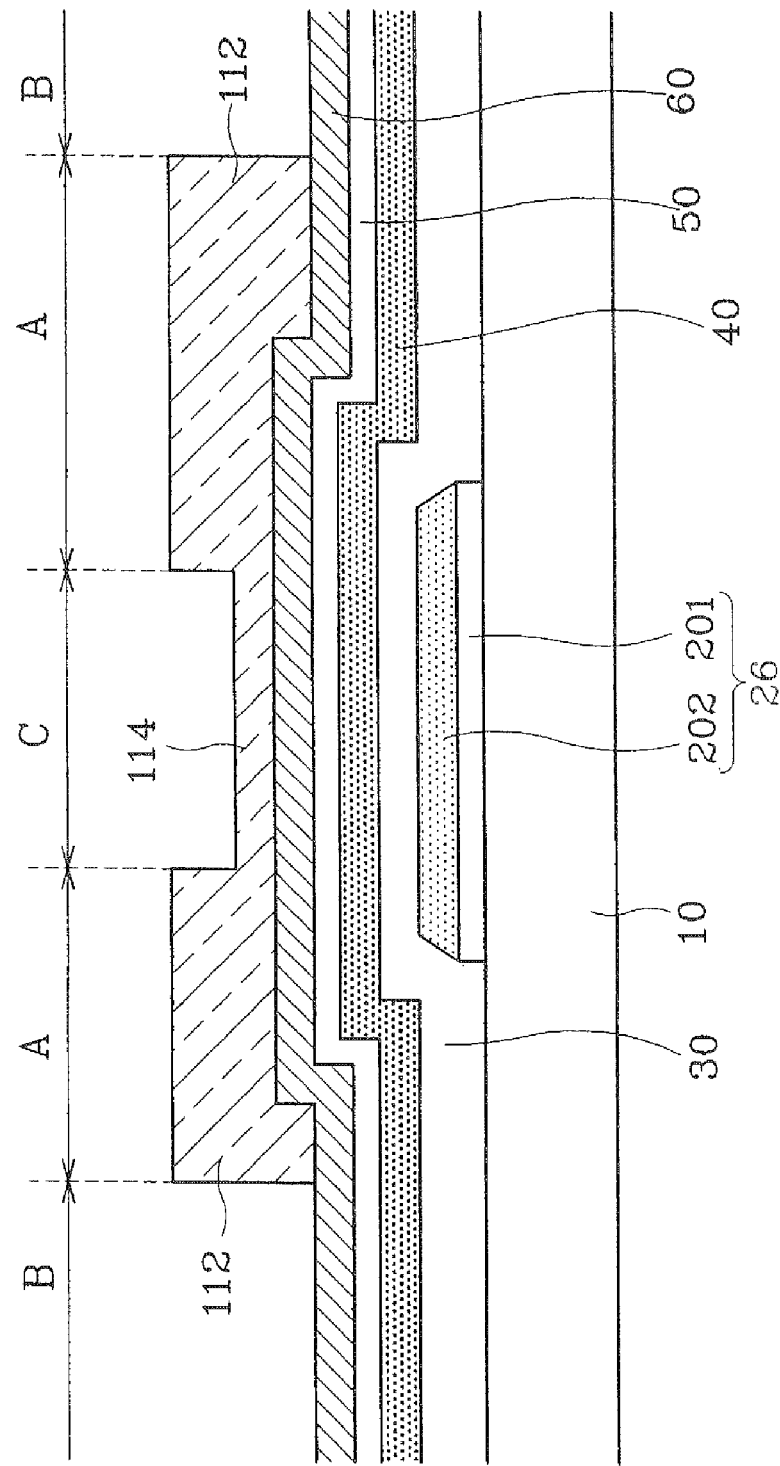

Thereafter, the photoresist layer 110 is exposed to light through a second mask and developed to form photoresist patterns 112 and 114 as shown in FIGS. 14B and 14C. At this time, the first portion 114 of the photoresist pattern located between a source electrode 65 and a drain electrode 66, i.e., a thin film transistor channel part C as shown in FIG. 14C, is thinner than the second portion 112 of photoresist pattern located over the data wire portion A where a data wires 62, 63, 65, 66, and 68 will be formed, and the third portion, the remaining portion of the photoresist pattern located at portion B, is thinner than the first portion. The third portion may have a thickness determined according to an etching method. For example, the third portion has substantially zero thickness when using a wet etch, but the third portion may have a non-zero thickness when using a dry etch. At this time, the thickness ratio between the first portion 114 and the second portion 112 depends on the etch conditions that will be described liter. However, it is preferable that the thickness of the first portion 114 is equal to or less than half of that of the second portion 112, or for example, less than 4,000 Å.

Next, the photoresist pattern 114 and the layers thereunder including the conductor layer 60, the ohmic contact layer 50, and the semiconductor layer 40 are subject to an etching process. After the etching process, a data wire and the underlying layers at the data wire part A, and only the semiconductor layer on the channel part C should remain. In addition, the three layers 60, 50, and 40 in the remaining part B are removed in order to expose the gate insulating layer 30.

Figure 15A:
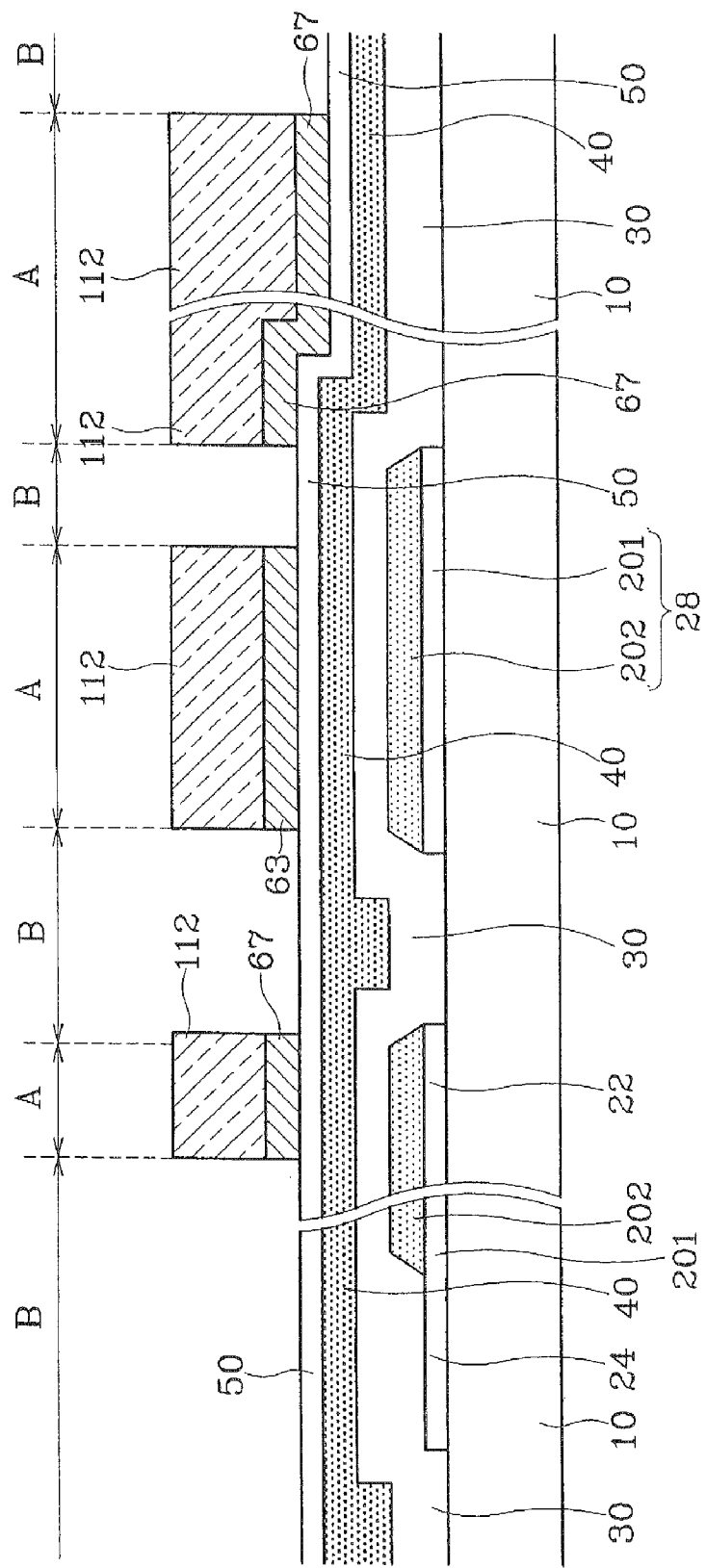
FIGS. 15A, 16A, and 17A are cross-sectional views in the next step following FIG. 14B taken along the line XIVB-XIVB' of FIG. 14A.

As shown in FIGS. 15A and 15B, the ohmic contact layer 50 of the part B is exposed by removing the conductor layer 60 thereon. At this time, both wet and dry etch can be used, and it is preferable that the etch is performed under a condition that the conductor layer 60 is etched but the photoresist layers 112 and 114 are not etched. However, due to its etch selectivity, the dry etch method may also etch the photoresist patterns 112 and 114 In this case, the first portion 114 may be made thicker than in the wet etch case so that the conductor layer 60 is not exposed.

If the conductor layer 60 is made of Mo or MoW alloy, Al or Al alloy, or Ta, both dry or wet etch methods can be used, However, if the conductor layer 60 is made of Cr, wet etch is better because Cr is not easily removed by dry etching. $CeNHO_3$ can be used as a wet etchant for etching a Cr conductor layer 60. The gas mixture of $CF_4$ and HCl or the mixture of $CF_4$ and $O_2$ can be used for dry etching a Mo or MoW conductor layer 60. The mixture of $CF_4$ and $O_2$ shows similar etch rate on the photoresist layer and on the conductor layer 60.

Referring to FIGS. 15A and 15B, it leaves only the portions of the conductor 60 under the photoresist portions 112 and 114 at the channel part C and the data wire part A for the source/drain electrodes and a storage capacitor. And the remaining portion of the conductor layer 60 at part B is wholly removed to expose the underlying ohmic contact layer 50. At this time, the conductor pattern 67 and 63 has the same layout as the data wire parts 62, 63, 65, 66 and 68 except that the source electrode 65 and the drain electrode 66 are connected to each other. When dry etch is used, the photoresist layers 112 and 114 are also etched to some degrees.

Figure 16A:
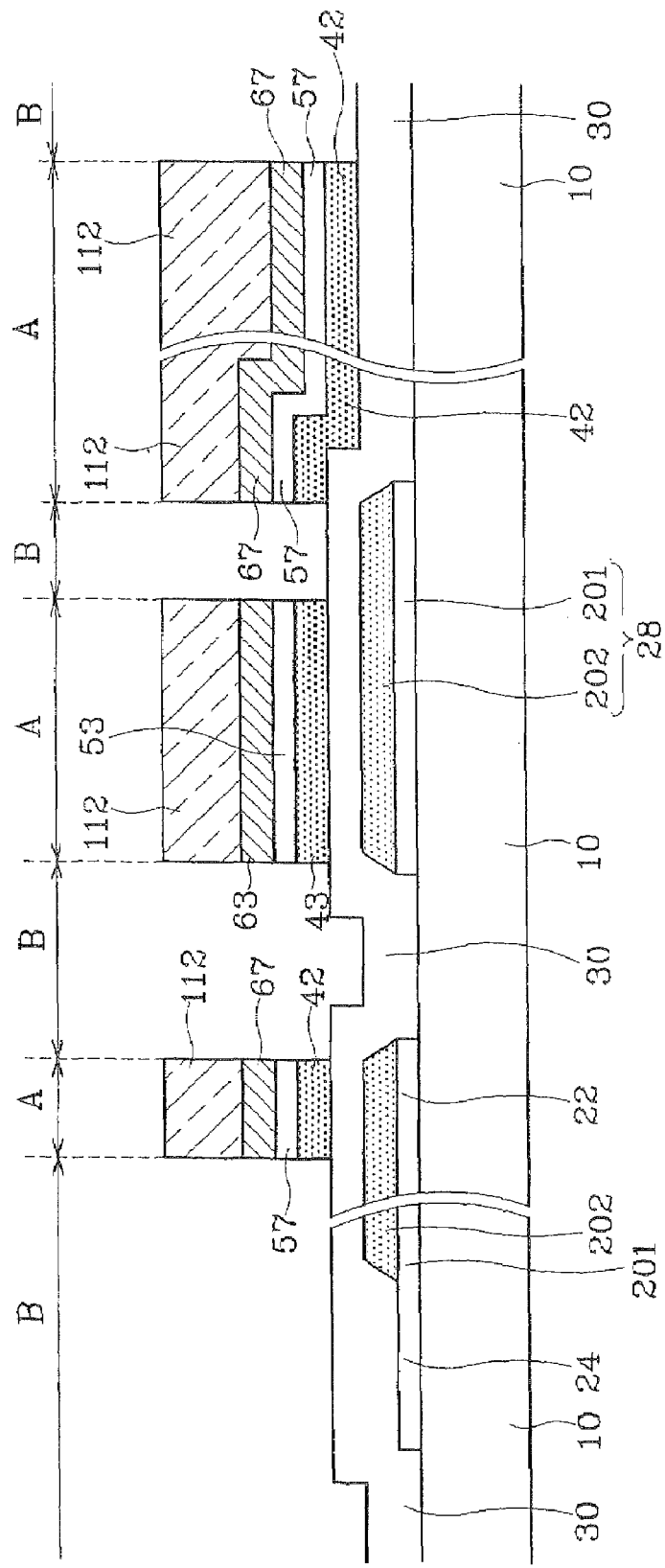
Figure 17A:
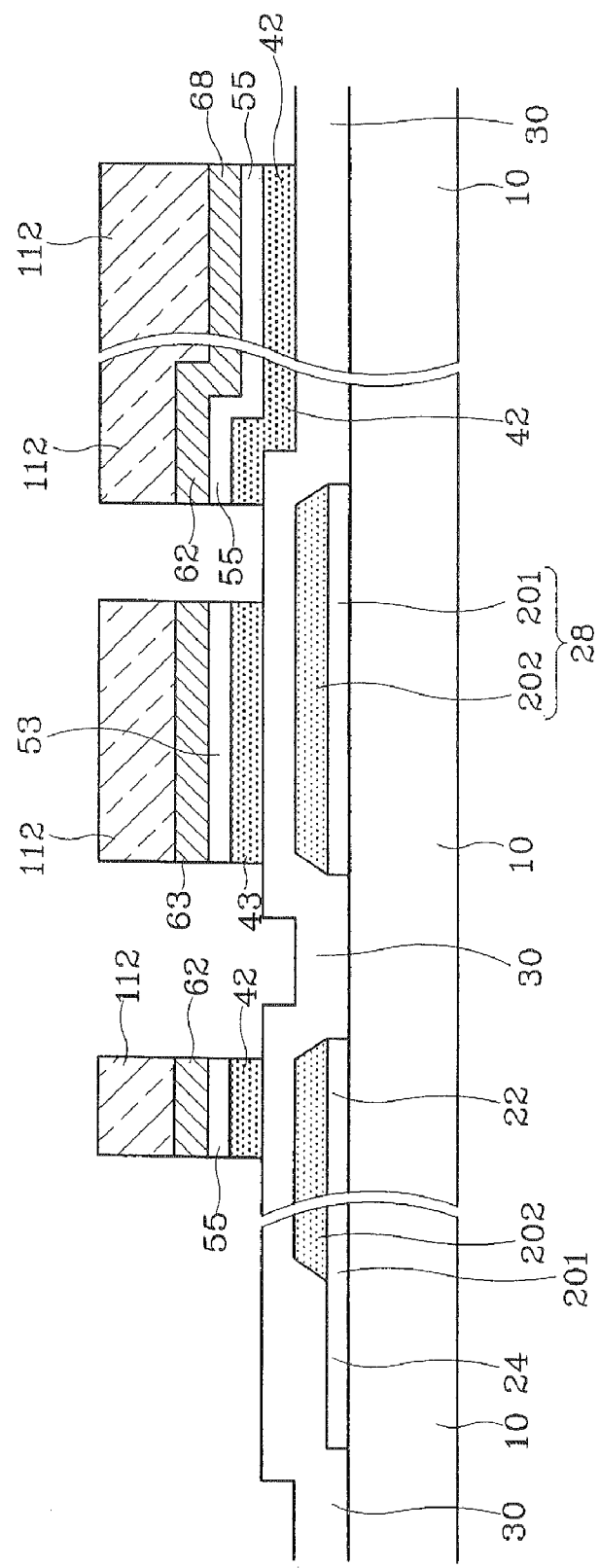
Figure 17B:
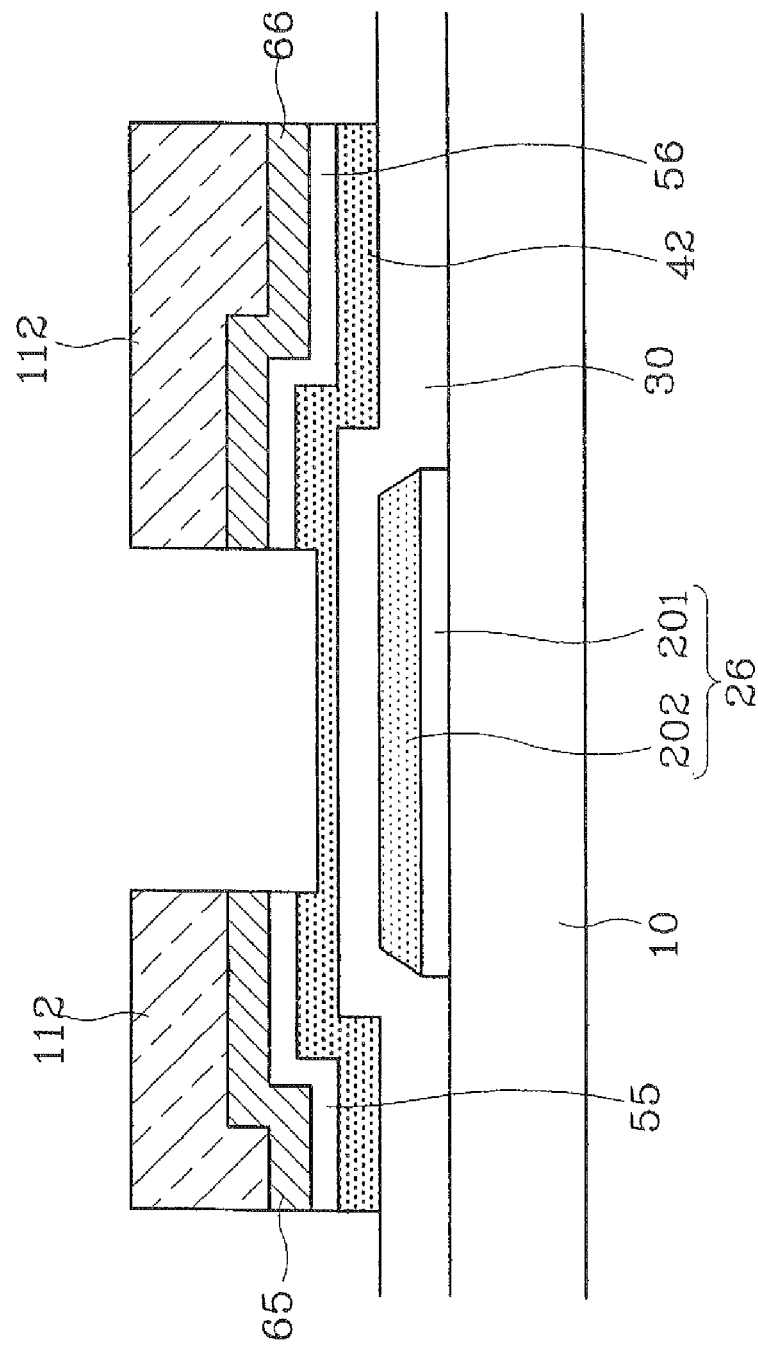

Next, the exposed portions of the ohmic conductor layer 50 at part B and its underlying semiconductor layer 40 of FIGS. 16A and 16B are removed by dry etching along with the first portion 114 of the photoresist layer as shown in FIGS. 16A and 16B. The etch condition should be set to etch all the photoresist patterns 112 and 114, the ohmic contact layer 50, and the semiconductor layer 40 (the semiconductor layer and the ohmic contact layer have almost the same etch rate), but to leave the gate insulating layer 30 not etched. It is preferable that the etch rates of the photoresist patterns 112 and 114 and the semiconductor layer 40 are almost the same. The gas mixture of $SF_6$ and HCl or the mixture $SF_6$ and $O_2$ may meet such conditions. When the etch rates of the photoresist patterns 112 and 114 and the semiconductor layer 40 are almost the same, the thickness of the first portion 114 may be equal to or less than the sum of the thicknesses of the semiconductor 40 and the ohmic contact layer 50.

Then, as shown in FIGS. 16A and 16B, the conductor pattern 67 is exposed by removing the first portion 114 of the channel part C, and the gate insulating layer 30 is exposed by removing the ohmic contact layer 50 and the semiconductor layer 40 of the part B shown in FIG. 11B. At the same time, the thickness of the second portion 112 over the data wire part A is reduced by etching. This step completes the semiconductor pattern 42 and 43 The reference numerals 57 and 53 respectively represent the ohmic contact layer pattern under the conductor patterns 67 and 63 for the source/drain electrodes and the storage capacitor.

The remaining photoresist layer on the conductor pattern 67 is then removed by ashing or plasma etching.

Next, as shown in 17A and 17B, the conductor pattern 67 for source/drain electrodes at the channel part C and the ohmic contact layer pattern 57 for source/drain electrodes of FIG. 16B are removed by etching. At this time, it is possible either to etch both the conductor pattern 67 and the ohmic contact layer 57 by a dry etching method, or to etch the conductor pattern 67 by a wet etching method and the ohmic contact layer 57 by a dry etching method. The first method is preferable when etch conditions have a large etch selectivity between the conductor pattern 67 and the ohmic contact layer pattern 57. This is because if the etch selectivity is not large enough, it is hard to detect the end point of the etch and control the thickness of the semiconductor pattern 42 around the channel part C. A gas mixture of $SF_6$ and $O_2$ can bring such a result. When doing a wet etch and a dry etch sequentially, the lateral sides of the conductor pattern 67 exposed to the wet etchant are also etched but those of the ohmic contact layer pattern 57, which is dry etched, are hardly etched at all. Thereby, the profile of these two patterns 67 and 57 makes a step like form. The gas mixture of $CF_4$ and $O_2$ may be used for etching the ohmic contact layer pattern 57 and the semiconductor pattern 42. The semiconductor pattern 42 may also be formed to have a uniform thickness by etching with a gas mixture of $CF_4$ and $O_2$. At this time, as shown in FIG. 12B, the thickness of the semiconductor pattern 42 may be reduced and the second portion 112 of photoresist pattern is also etched to a certain thickness. The etch conditions may also be set not to etch the gate insulating layer 30, and it is preferable to make the photoresist pattern thick enough not to expose the data wire parts 62, 63, 65, 66, and 68.

As a result, the source electrode 65 and the drain electrode 66 are divided, and the completed data wire parts 62, 63, 65, 66, and 68 and the completed contact layer pattern 55, 56, and 53 thereunder are obtained.

Next, the remaining second portion 112 of the photoresist layer on the data wire (Region A of FIG. 14C) is removed. However, the second portion 112 may be removed after removing the conductor pattern 67 for the source/drain electrodes on the channel part C of FIG. 16B and before removing the ohmic contact layer pattern 57 under the conductor pattern 67.

To summarize, this process can be done by using both wet etching and dry etching in turn, or by using only dry etching.

In the former case, the conductor layer of the part B is first removed by wet etching, and the ohmic contact layer and the underlying semiconductor layer are removed by dry etching. At this time, the photoresist layer of the part C is etched out to a certain thickness, and the part C may have or may not have any residual photoresist. It mainly depends on the initial thickness of the photoresist layer of the part C. When the part C has remaining photoresist, it is removed by ashing. Finally, the conductor layer of the part C is wet etched to separate the source and the drain electrodes, and the ohmic contact layer of the part C is removed by using dry etching.

In the latter case, the conductor layer, the ohmic contact layer and the semiconductor layer of the part B are removed by dry etching. As in the former case, the part C may have or may not have residual photoresist, and the residual photoresist is removed by ashing when the part C has residual photoresist. Finally, the conductor layer of the part C is dry etched to separate the source electrode and the drain electrode, and the ohmic contact layer of the part C is removed by dry etching.

Also, if the data wire is etched, the semiconductor pattern, the contact layer pattern, and the data wire may be completed with a single step. That is to say, it is desirable that the photoresist pattern 114 of the part C and the underlying contact layer 50 are dry etched, and the portion of the photoresist pattern 112 of the part A is dry etched during the dry etching of the conductor layer, the ohmic contact layer, and the semiconductor layer of part B.

Since the latter process uses only one type of etching method, it is simpler although it is hard to control proper etching conditions. On the other hand, the former process may achieve proper etching condition, but it is a more complicated process.

Figure 18A:
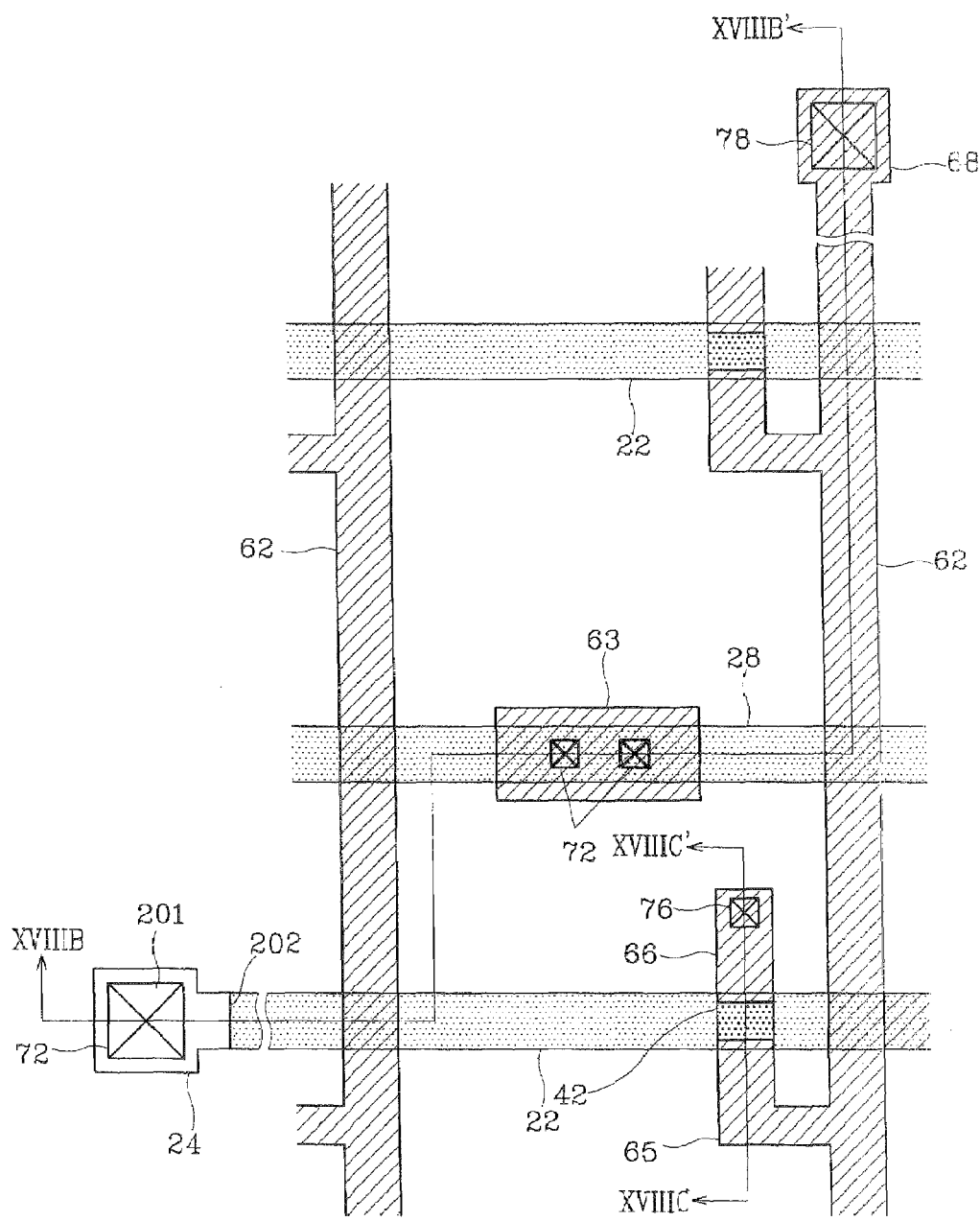
FIG. 18A is a layout view of a thin film transistor array panel in the next step following FIGS. 17A and 17B.
Figure 18B:
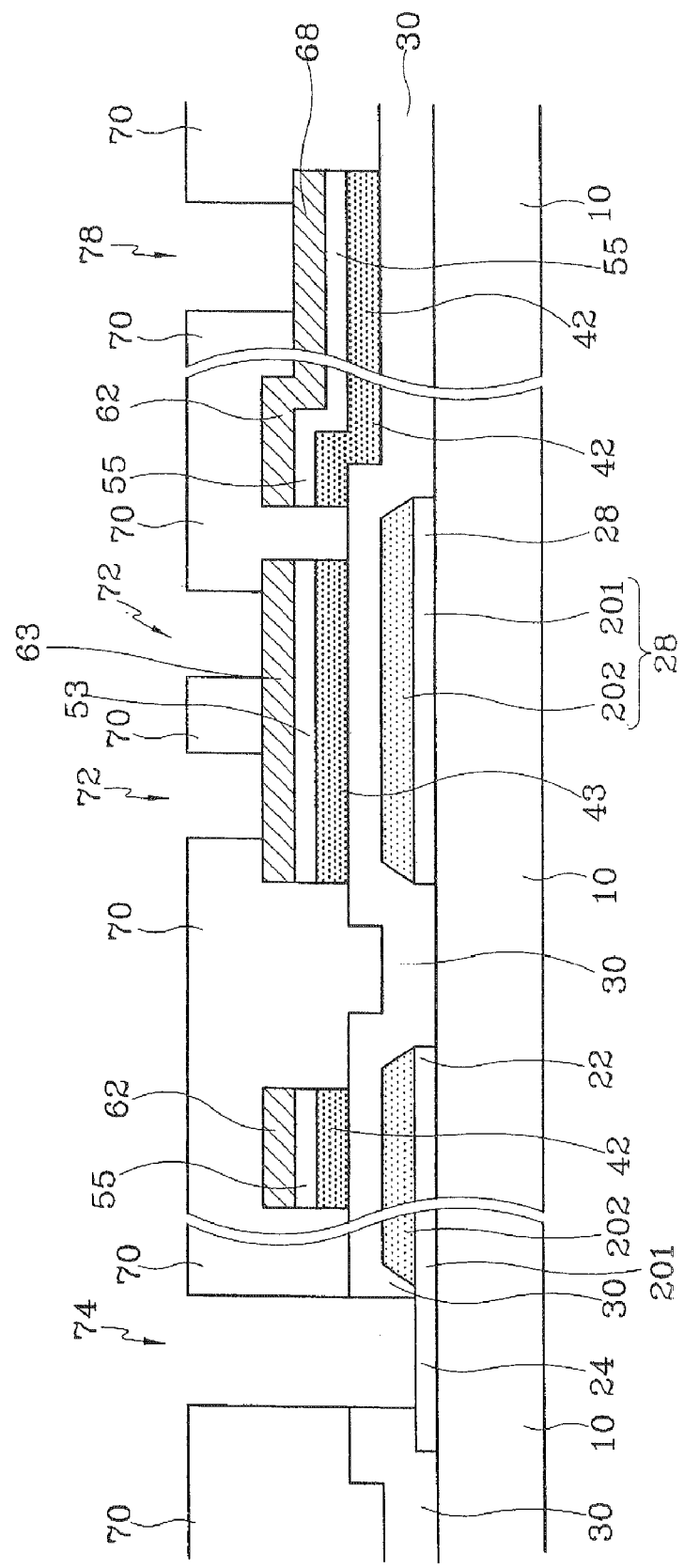
FIGS. 18B and 18C are the cross-sectional views taken along the lines XVIIIB-XVIIIB' and XVIIIC-XVIIIC' of FIG. 18A, respectively.
Figure 18C:
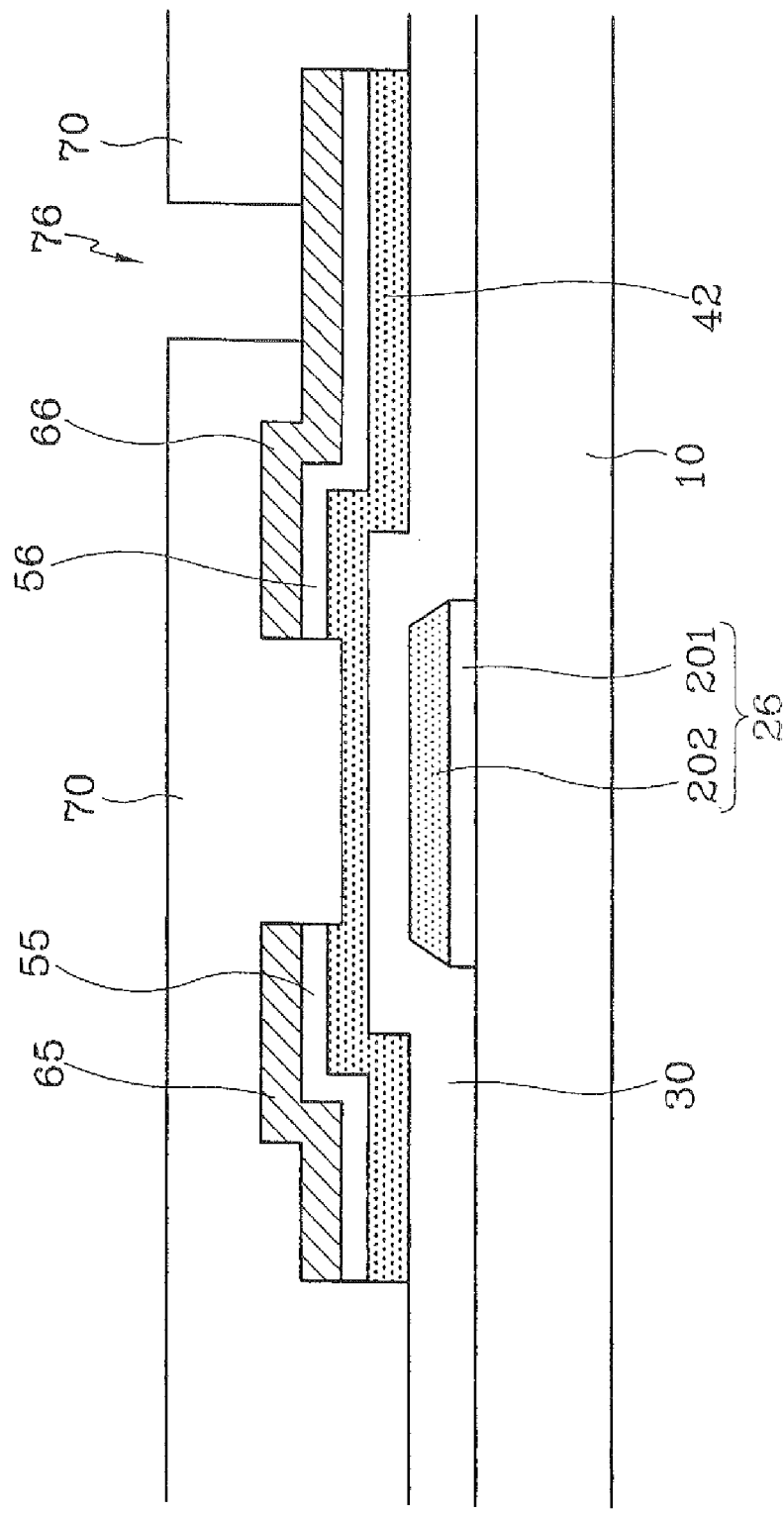

After forming data wire parts 62, 63, 65, 66, and 68 by the above steps, a passivation layer 70 having the thickness of over 2,000 Å is formed by CVD of SiNx or by spin coating of organic insulator, as shown in FIG. 18A to FIG. 18C. Then, contact holes 76, 74, 78, and 72 respectively exposing the drain electrode 66, the gate pad 24., the data pad 68, and the conductor pattern 63 for the storage capacitor are formed by etching the passivation layer 70 and the gate insulating layer 30 at the same time by using a third mask.

Figure 10:
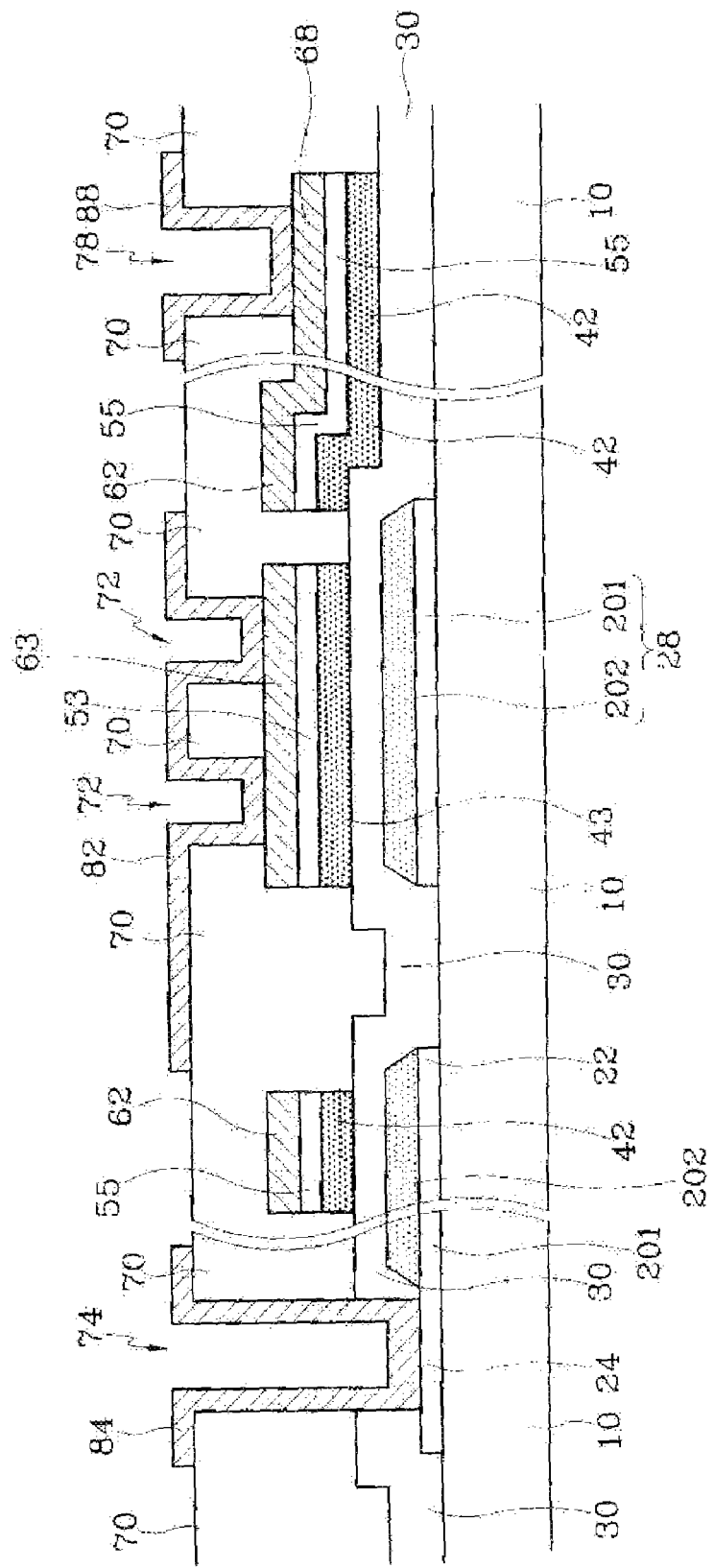
FIGS. 10 and 11 are cross-sectional views taken along lines X-X' and XI-XI' of FIG. 9, respectively.
Figure 11:
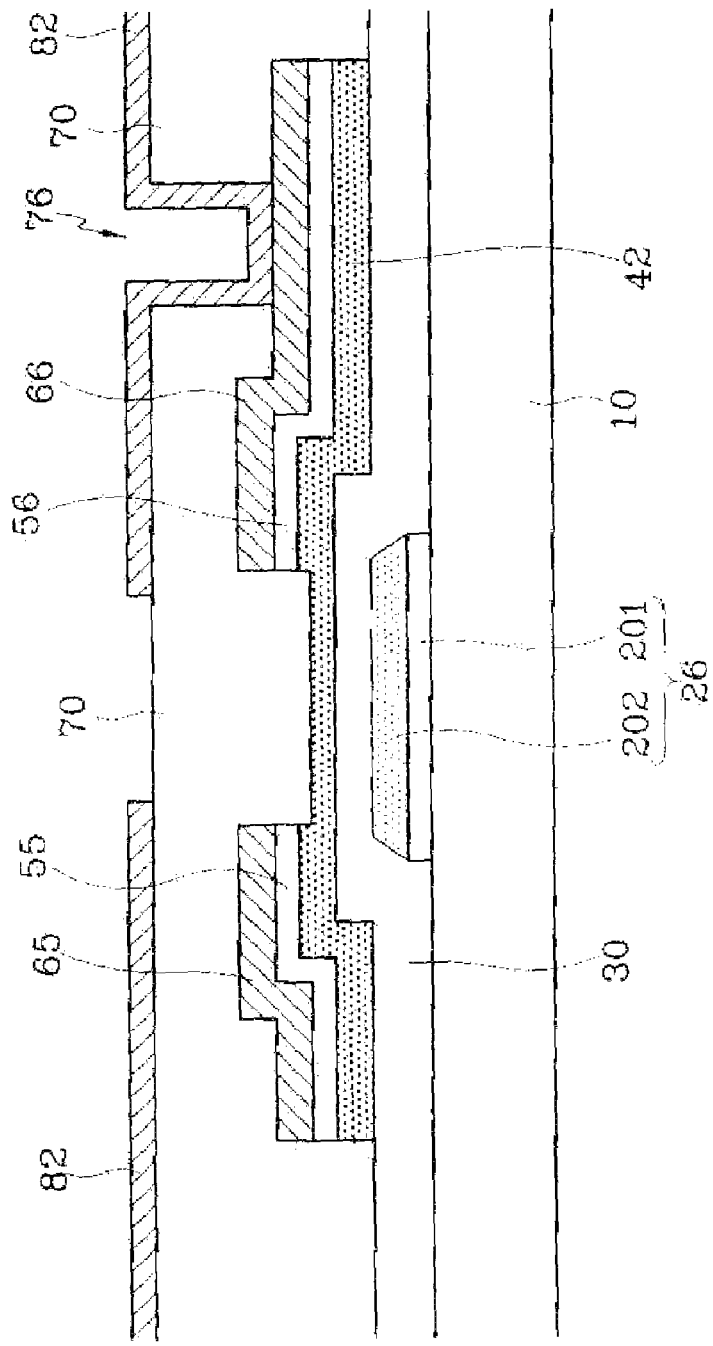

Next, as shown in FIGS. 9 to 11, an ITO layer is deposited to a thickness of 400 Å to 500 Å, and etched by using a fourth mask to form a pixel electrode 82, a redundant gate pad 84, and a redundant data pad 88.

As described above, the second embodiment is forming the data wires 62, 63, 65, 66, and 68, the ohmic contact patterns 55, 56, and 53, and the semiconductor patterns 42 and 43, by using one mask. Furthermore, by separating the source electrode 65 and the drain electrode 66 in this process, the second embodiment can achieve the structure of the first embodiment in a much simpler process.

A third embodiment according to the present invention, in order to simplify a manufacturing process for a thin film transistor panel for LCD, exposes a gate pad portion when forming a semiconductor layer by using a photoresist layer of different thickness, and lays a redundant data line made of metal having a low resistivity.

Figure 19:
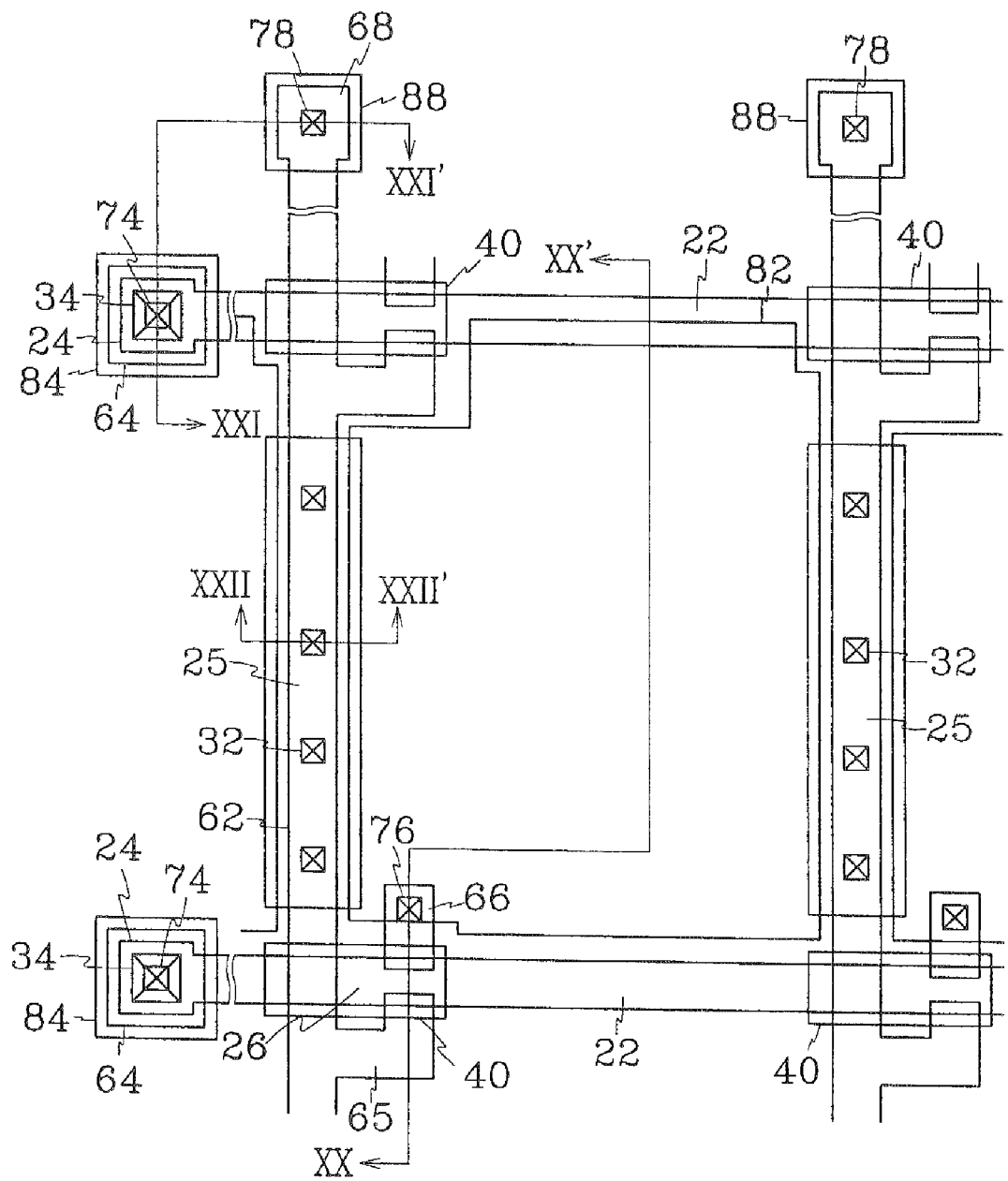
FIG. 19 is a layout view of a thin film transistor array panel for a liquid crystal display according to the third embodiment of the present invention.
Figure 20:
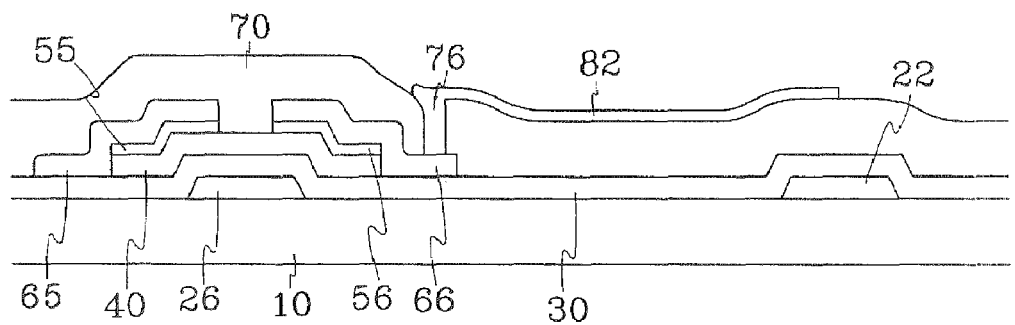
FIGS. 20, 21, and 22 are the cross-sectional view taken along the lines XX-XX', XXI-XXI', and XXII-XXII' of FIG. 19, respectively.
Figure 21:
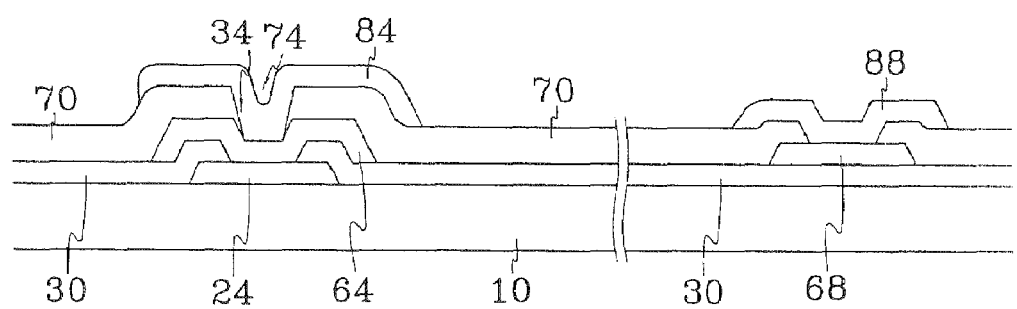
Figure 22:
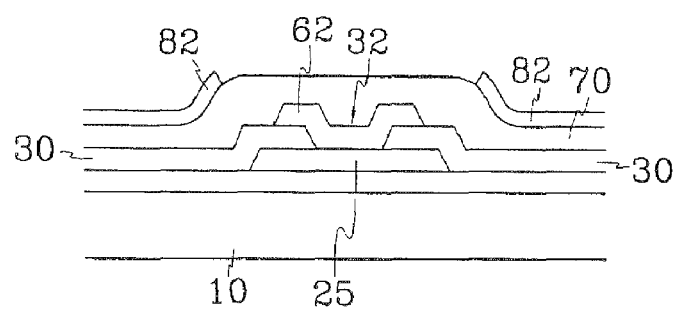
Figure 23A:
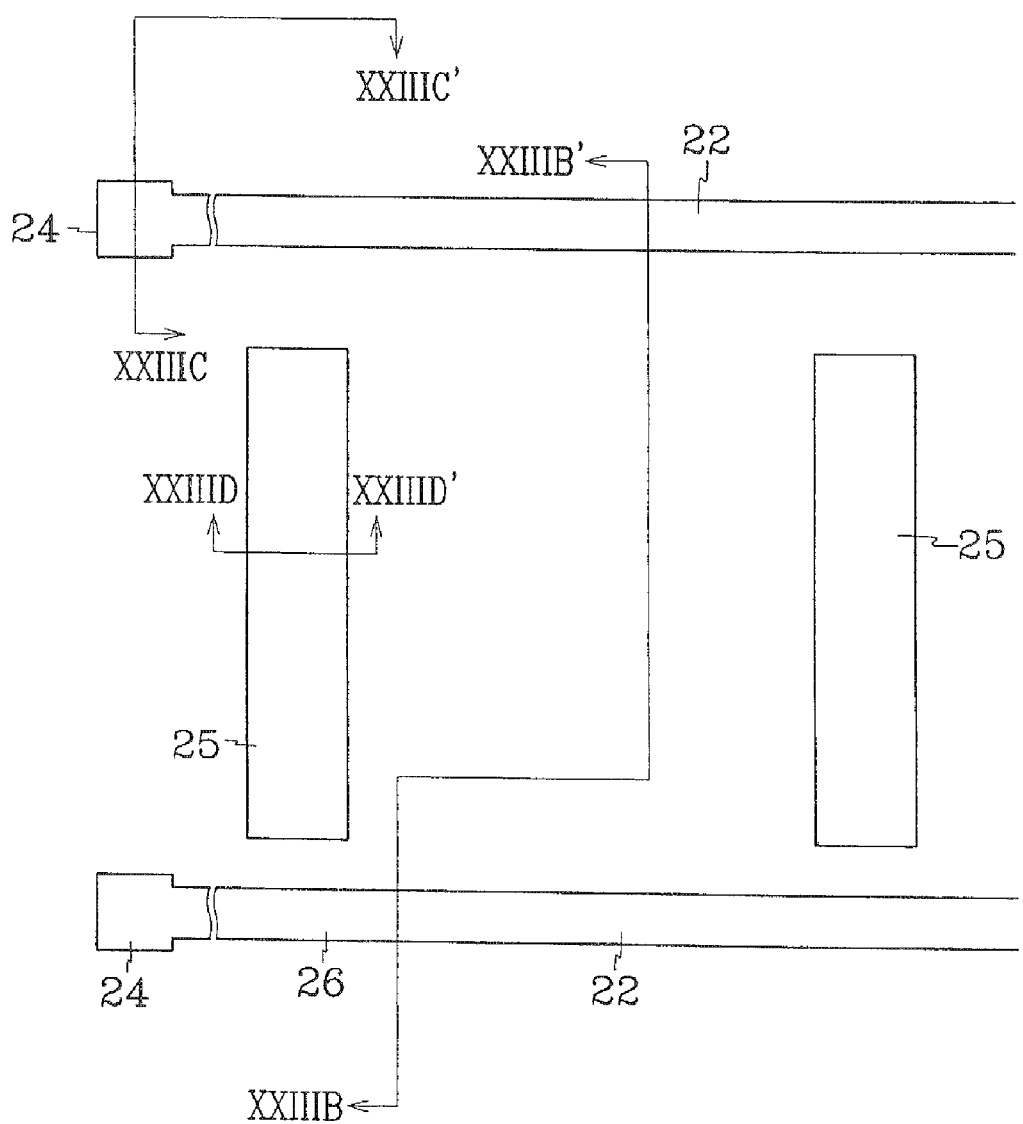
FIGS. 23A, 24A, 26A, and 27A are layout views of a thin film transistor array panel according to a third embodiment of the present invention showing manufacturing steps.
Figure 23B:
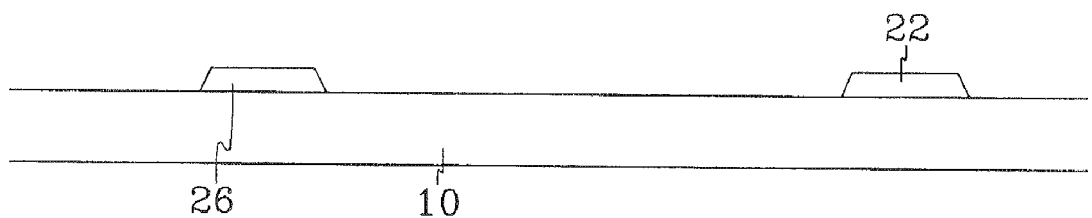
FIGS. 23B, 24B and 25A, 26B, and 27B are the cross-sectional views taken along the lines XXIIIB-XXIIIB', XXIVB-XXIVB', XXVIB-XXVIB', and XXVIIB-XXIIB' of FIGS. 23A, 24A, 26A, and 27A, respectively.
Figure 23C:
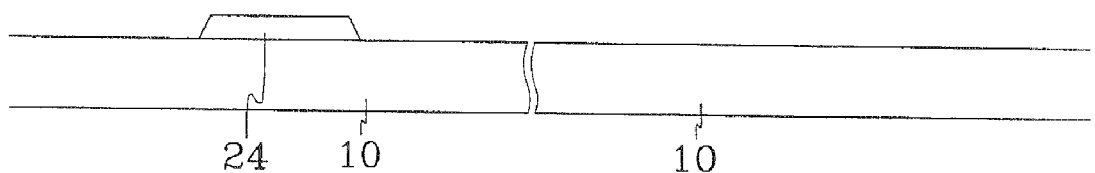
FIGS. 23C, 24C and 25B, 26C, and 27C are the cross-sectional views taken along the lines XXIIIC-XXIIIC', XXIVC-XXIVC', XXVIC-XXVIC', and XXVIIC-XXVIIC' of FIGS. 23A, 24A, 26A, and 27A, respectively.
Figure 23D:
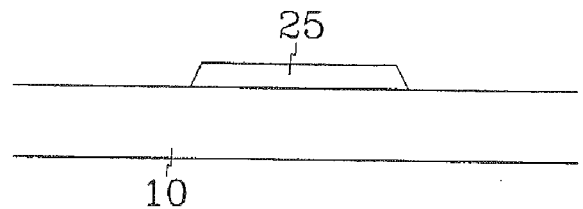
FIGS. 23D, 24D and 25C, 26D, and 27D are the cross-sectional views taken along the lines XXIIID-XXIIID', XXIVD-XXIVD', XXVID-XXVID', and XXVIIID-XXVIIID' of FIGS. 23A, 24A, 26A, and 27A, respectively.

FIG. 19 is a layout view of a thin film transistor array panel for a liquid crystal display according to the third embodiment of the present invention, and FIGS. 20, 21, and 22 are the cross-sectional views taken along the lines XX-XX', XXI-XXI' and XXII-XXII' of FIG. 19, respectively.

As shown in FIGS. 19 to 22, gate wire parts 22, 24, and 26, and a redundant data line 25 extending in a vertical direction, which are all made of aluminum or aluminum alloy are formed on an insulating substrate 10. Furthermore, the gate wire parts 22, 24, and 26, and the redundant data line 25 may also be made of metals such as chromium, molybdenum, and molybdenum alloy.

A gate insulating layer pattern 30 of silicon-nitride (SiNx) is formed on the gate wise parts 22, 24, 26, and the redundant data line 25. The gate insulating layer pattern 30 has contact holes 34 and 32 exposing the gate pad 24 and the redundant data line 25.

A semiconductor layer 40 and ohmic contact layers 55 and 56 are formed on the gate insulating layer 30 of the gate electrode 26 as in the first embodiment.

Data wire parts 62, 65, 66, and 68 are formed on the ohmic contact layer patterns 55 and 56, and the gate insulating layer 30. Here, the data line 62 overlaps the redundant data line 25 and is connected to the redundant data line 25 through the contact hole 32. A first redundant gate pad 64 is formed on the same layer as the data wire 62, 65, 66, and 68, is connected to the gate pad 24 through the contact hole 34, and completely covers the contact hole 34.

A passivation layer 70 is formed on the data wire parts 62, 65, 66, 68, the semiconductor layer 40 not covered by the data wire parts 62, 65, 66, and 68, and the first redundent gate pad 64. The passivation layer 70 has contact holes 76, 74, and 78 respectively exposing the drain electrode 66, the first redundant gate pad 64, and the data pad 68.

The pixel electrode 82 is formed on the passivation layer 70 of the pixel. The pixel electrode 82 is connected to the drain electrode 66 through the contact hole 76, and a redundant gate pad 84 and a redundant data pad 88 are respectively connected to the first redundant gate pad 24 and the data pad 68 through the contact holes 74 and 78 that are formed in the passivation layer 70.

A method for manufacturing a thin film transistor array panel according to a third embodiment of the present invention will now be described with reference to the FIGS. 23A to 27B and FIGS. 19 to 22.

FIGS. 23A, 24A, 26A, and 27A are layout views of a thin film transistor array panel according to the third embodiment of the present invention showing the manufacturing steps. FIGS. 23B, 24B and 25A, 26B, and 27B are cross-sectional views taken along lines XXIIIB-XXIIIB', XXIVB-XXIVB', XXVIB-XXVIB', and XXVIIB-XXVIIB' of FIGS. 23A, 24A, 26A, and 27A, respectively. Furthermore, FIGS. 23C, 24C and 25B, 26C, and 27C are cross-sectional views taken along lines XXIIIC-XXIIIC', XXIVC-XXIVC', XXVIC-XXVIC', and XXVIIC-XXVIIC' of FIGS. 23A, 24A, 26A, and 27A, respectively. Additionally FIGS. 23D, 24D and 25C, 26D, and 27D are cross-sectional viewes taken along lines XXIIID-XXIIID', XXIVD-XXIVD', XXVID-XXVID', and XXVIID-XXVIID' of FIGS. 23A, 24A, 26A, and 27A, respectively.

At first, as shown in FIGS. 12A to 12C, a conductive material is deposited and gate wire parts, including a gate line 22, a gate pad 24, and a gate electrode 26, and a redundant data line 25 are formed by dry or wet etching through a photolithography step using a first mask. The gate wire parts 22, 24, and 26, and the redundant data line 25 may be made of aluminum or aluminum alloy, and may also have a multi-layered structure including chromium, molybdenum, or molybdenum alloy.

Next, as shown in FIGS. 24A, and 25A to 25C, a gate insulating layer 30, a semiconductor layer 40, and an ohmic contact layer 50 are respectively deposited sequentially by such methods as chemical vapor deposition (CVD), and are sequentially patterned through a photolithography step using a second mask to form a gale insulating layer pattern having contact holes 34 and 32 exposing the gate pad 24 and the redundant data line 25. The semiconductor layer pattern 40 and an ohmic contact layer pattern 50, which both have an island-like shape, are located over the gate electrode 26. At this time, the gate insulating layer 30, the semiconductor layer 40 and the ohmic contact layer 50 must be all removed to form contact holes 32 and 34, and the semiconductor layer 40 and the ohmic contact layer 50 on the portions excluding the gate electrode 26 must be removed to form the semiconductor layer and the ohmic contact layer patterrns 40 and 50 having an island-like shape. To obtain this object, as in the above embodiment, a photoresist pattern including at least three portions having different thickness must be used as etch mask, and a mask including at least three regions having these different transmittance values must be used to form such a photoresist pattern.

Figure 24A:
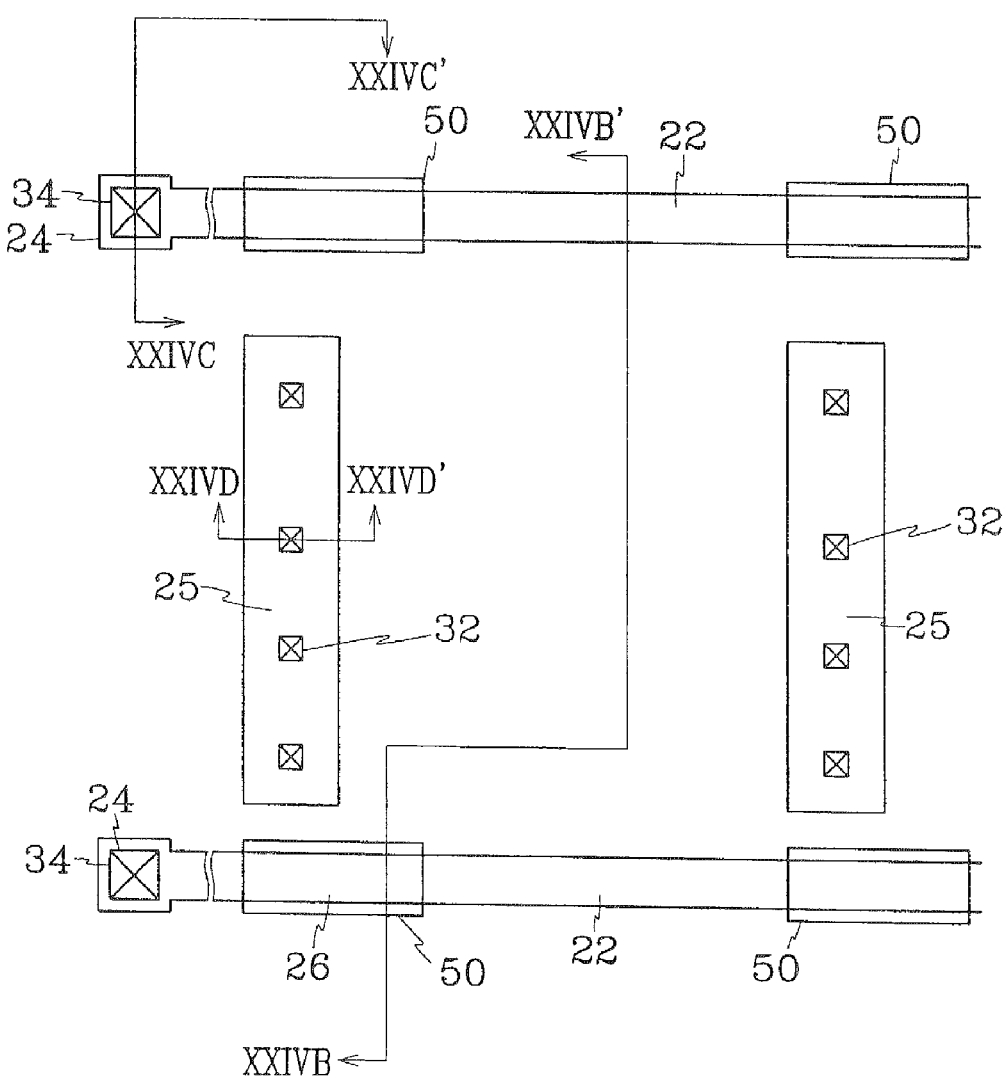
Figure 24B:
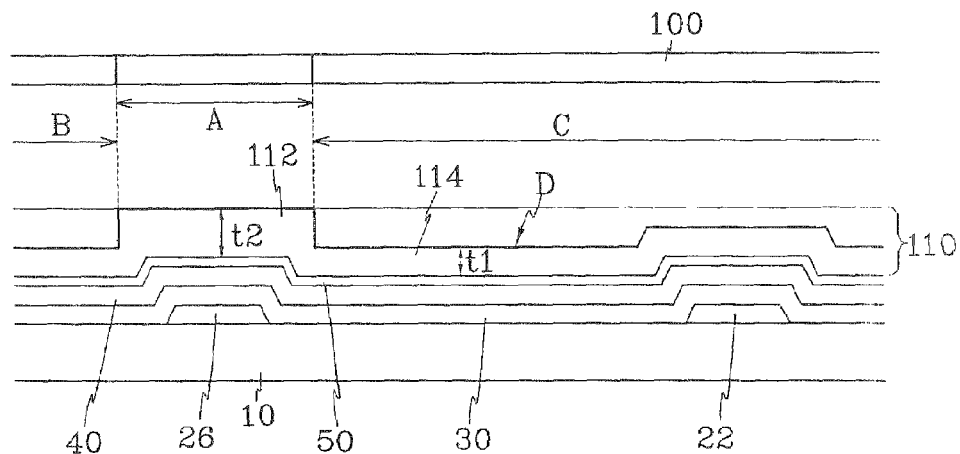
Figure 24C:
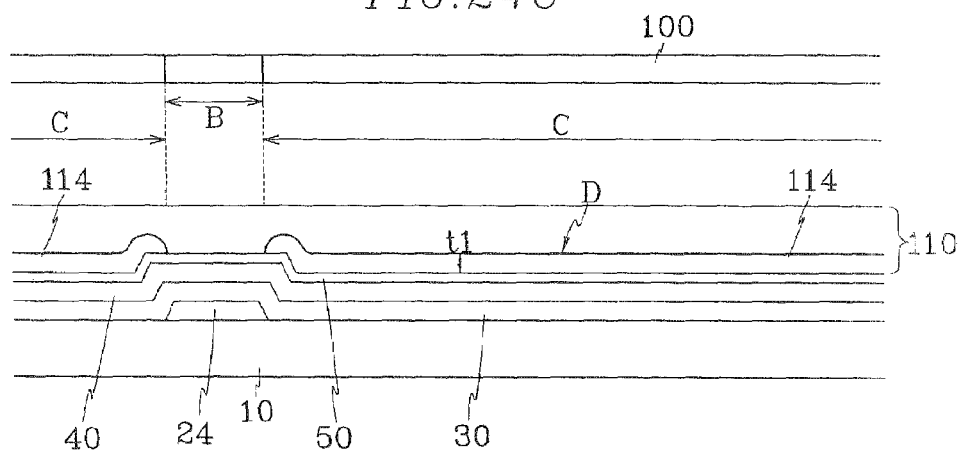
Figure 24D:
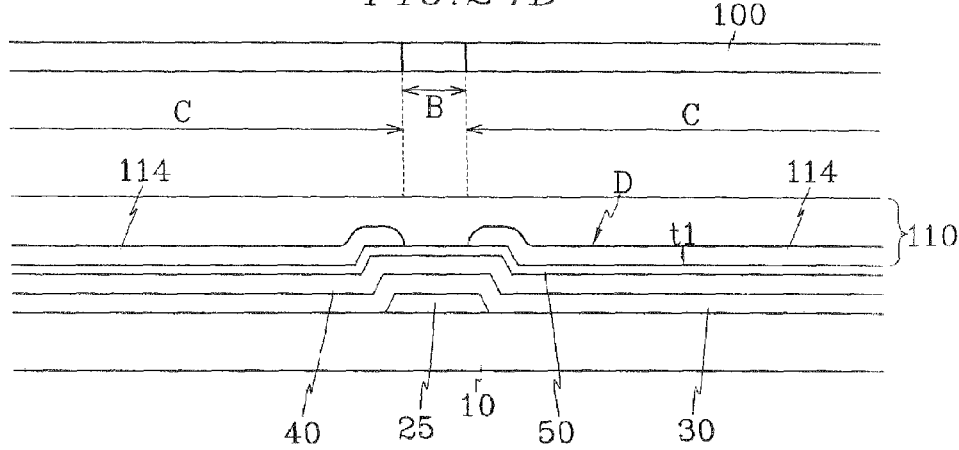
Figure 25A:
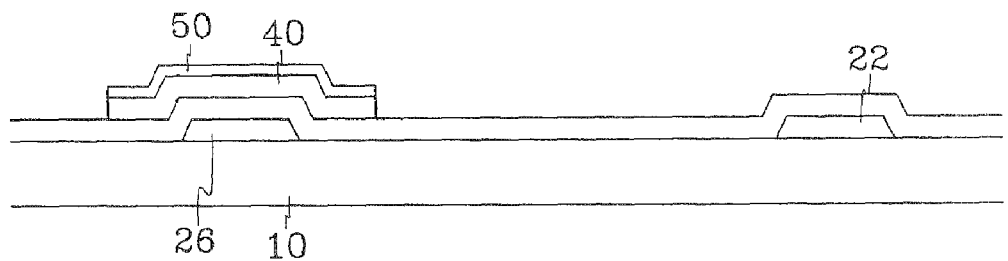
Figure 25B:
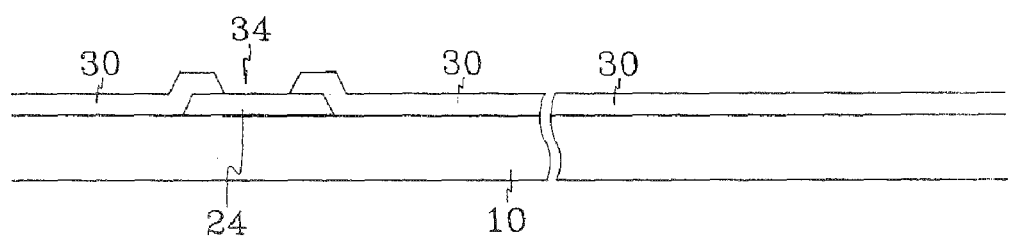
Figure 25C:
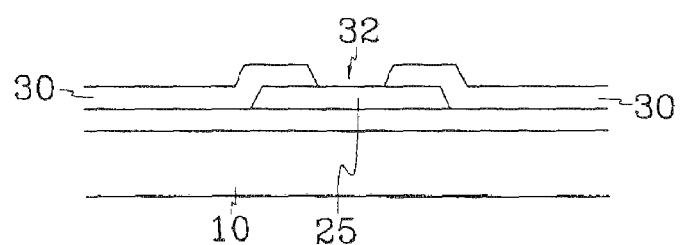
Figure 26A:
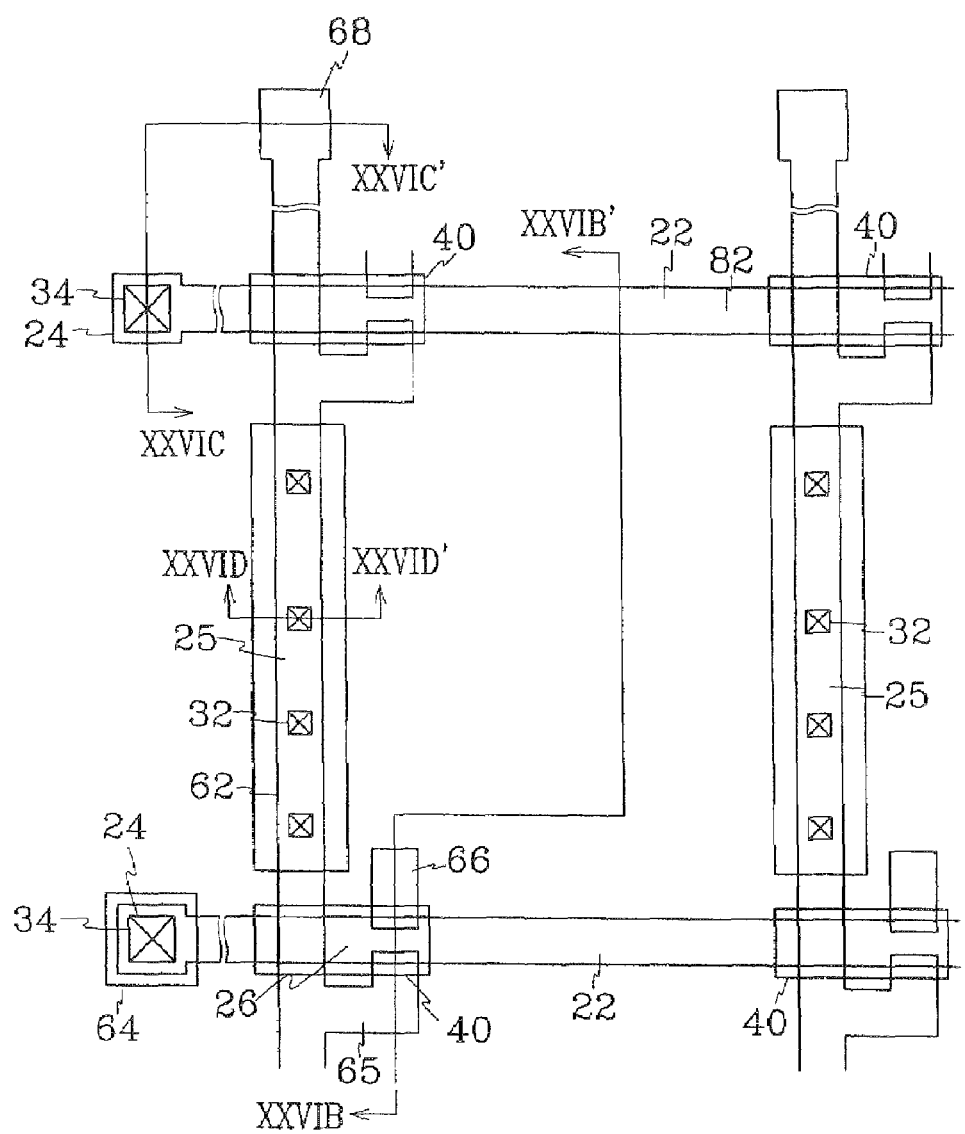
Figure 26B:
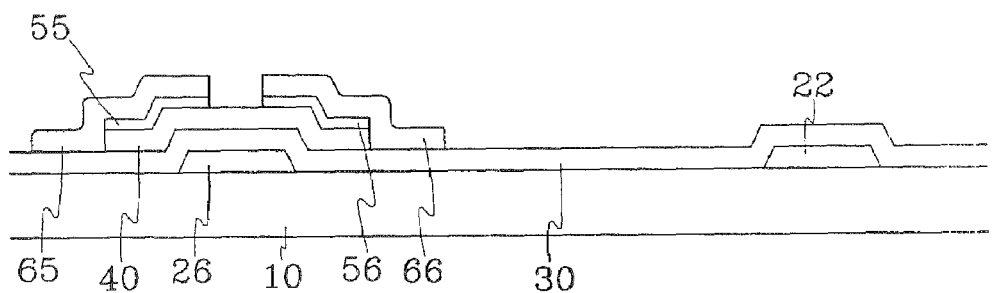
Figure 26C:
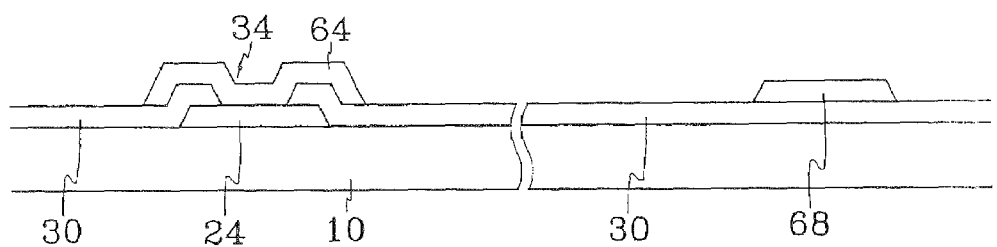
Figure 26D:
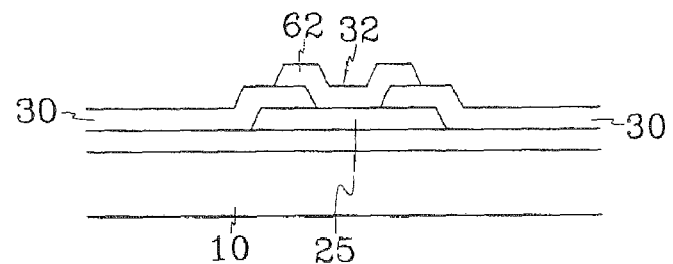
Figure 27A:
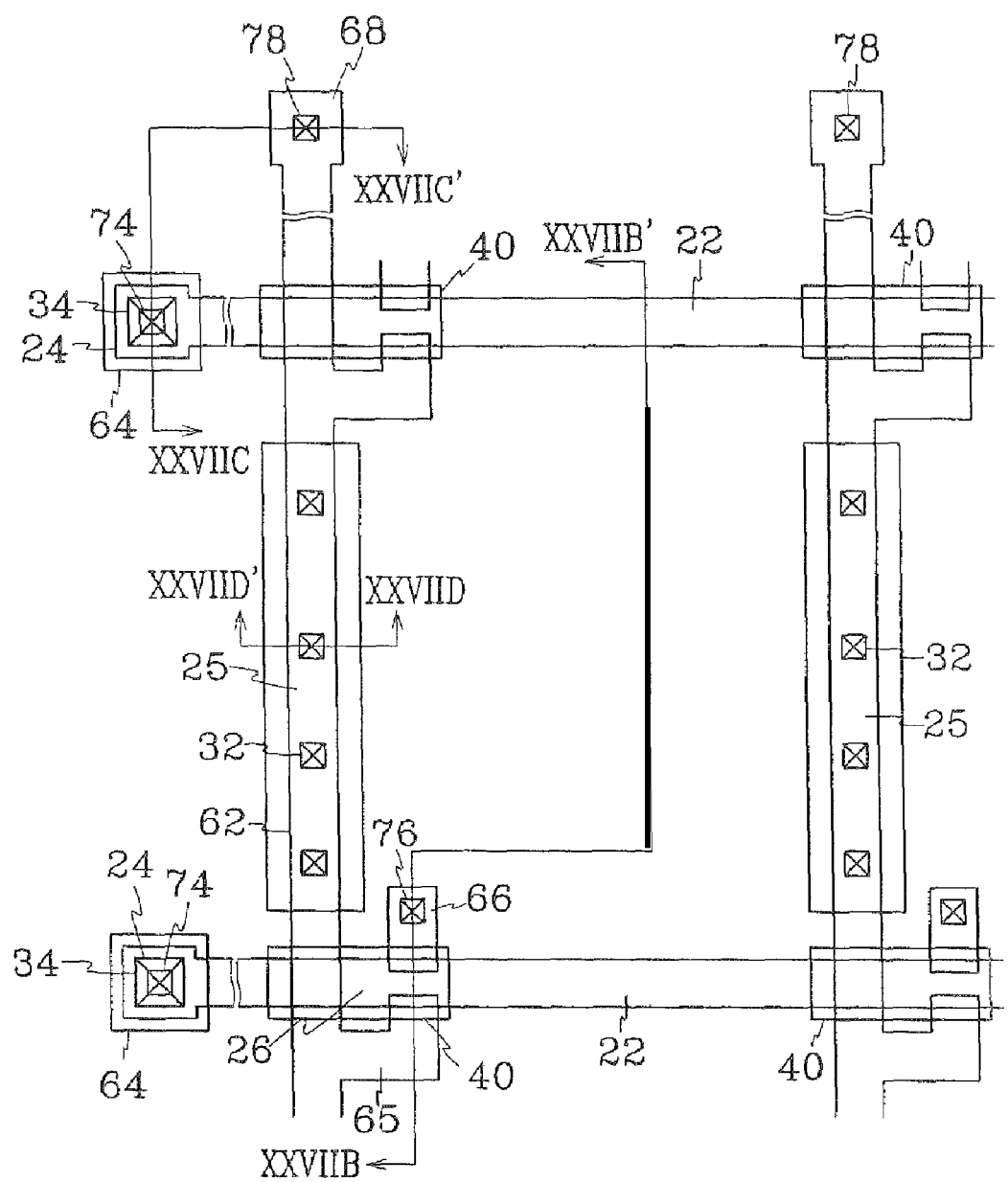
Figure 27B:
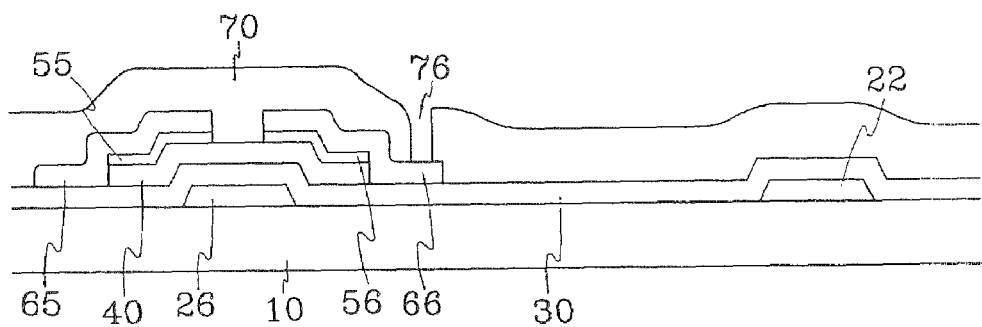
Figure 27C:
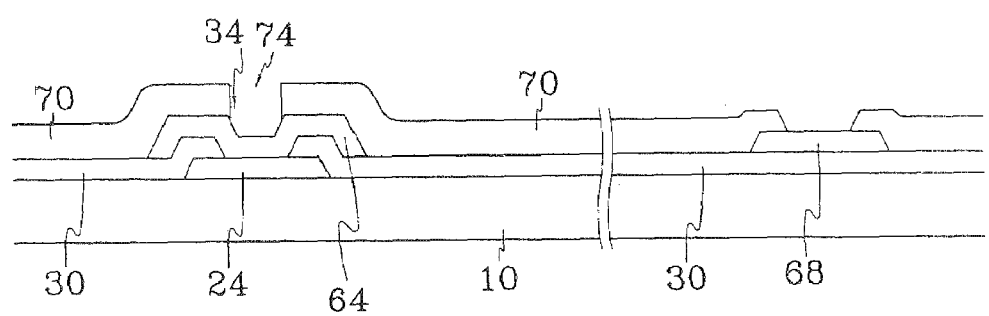
Figure 27D:
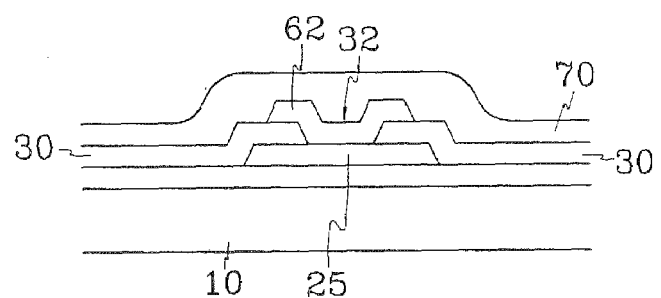

First, as shown in FIGS. 24B, 24C, and 24D, a positive photoresist layer 110 having a thickness of 1 μm to 2 μm is coated on the ohmic contact layer 50, exposed to light through a second mask, and developed to form photoresist patterns 112 and 114, which have different thicknesses indicated as t1 and t2, respectively. At this time, it is preferable that the transmittances of the regions of the mask 100 corresponding to portions A, C, and B are in the ranges of 0-3%, 20-60% (more preferably 25-40%), and more than 90%. A thick reference line D represents the thickness of the photoresist patterns 112 and 114. Here, the portion B may be of substantially zero thickness, but may also have a non-zero thickness. It is preferable that the thickness of the first portion 114 and the second portion 112 are respectively in the range of 2,000-4,000 Å (more preferably 3,000-4,000 Å) and more than 1 μm. At this time, the thickness between the first portion 114 and the second portion 112 depends on the etch condition and on the etch method, which will be described later, as well as the thicknesses of the triple layers 30, 40, and 50. The transmittances of the portions A, B, and C may be different when a negative photoresist layer is used. Next, the underlying layers including the gate insulating layer 30, the ohmic contact layer 50, and the semiconductor layer 40 are etched by using the phctoresist pattern 112 and 114. Then, the gate insulating pattern 30, the semiconductor layer 40, and the ohmic contact layer 50 can be formed.

Thus, in the third embodiment, the semiconductor pattern 40 and the ohmic contact layer pattern 50 are formed along with the gate insulating layer pattern 30 in one photolithography step using a photoresist pattern including at least three portions, having different thickness. This simplifies the manufacturing steps.

At this time, it is preferable that the semiconductor pattern 40 is extended on the portions where it will intersect data line 62, which will be formed later, to prevent the disconnection of the data line 62 due to the step of the gate line 22.

As shown in FIGS. 26A to 26D, a conductive layer of metal such as molybdenum (Mo), MoW alloy layer, or chromium is deposited and patterned to form a data wire including a data line 62, a source electrode 65, a drain electrode 66, and a data pad 68, as well as a first redundant gate pad 64 by photolithography using a third mask. At this time, it is desirable that the first redundant gate pad 64 completely cover the contact hole 34.

Next, the amorphous silicon layer 50, that is not covered by the data wire 62, 65, 66, and 68, is etched out to form ohmic contact layers 55 and 56 and to expose the semiconductor pattern 40 between the ohmic contact layer patterns 55 and 56.

Next, as shown in FIGS. 27A to 27D, a passivation layer 70 of an organic insulator is formed by a spin coating, and is patterned to form contact holes 76, 74, and 78 respectively exposing the drain electrode 66, the first redundant gate pad 64, and the data pad 68, through a photolithography step using a fourth mask.

Next, as shown in FIGS. 19 to 22, an ITO layer is deposited and etched through a photolithography step using a fifth mask to form a pixel electrode 82, a second redundant gate pad 84, and a redundant data pad 88 respectively connecting to the drain electrode 66, a first redundant gate pad 64, and a data pad 68. At this time, the pixel electrode 82 overlaps the previous gate line 22 to make a storage capacitor. If the storage capacitance is not enough, a storage line may be added on the same layer as the gate line 22 to increase the storage capacitance.

In the third embodiment, by forming a passivation layer 70 of an organic insulator with a low dielectric constant, even though the pixel electrode 82, and the data line 62, or the redundant data line 25 are overlapped, the distortion of signals may be minimized while increasing the aperture ratio.

Furthermore, by preventing contact between the aluminum or aluminum alloy of the gate pad 24 and the ITO of the second redundant gate pad 84 by using the first redundant gate pad 64, the gate wire made of a metal having a low resisitivity such as aluminum or aluminum alloy may be formed when the first redundant gate pad 64 is formed of a material having good contact properties.

Also, by forming the redundant data line 25 of a metal having a low resisitivity such as aluminum or aluminum alloy, the delay of signals may be minimized in large scale LCDs.

On the other hand, a pixel electrode may be formed before forming a passivation layer, and this will now be described with reference to drawings.

Figure 28:
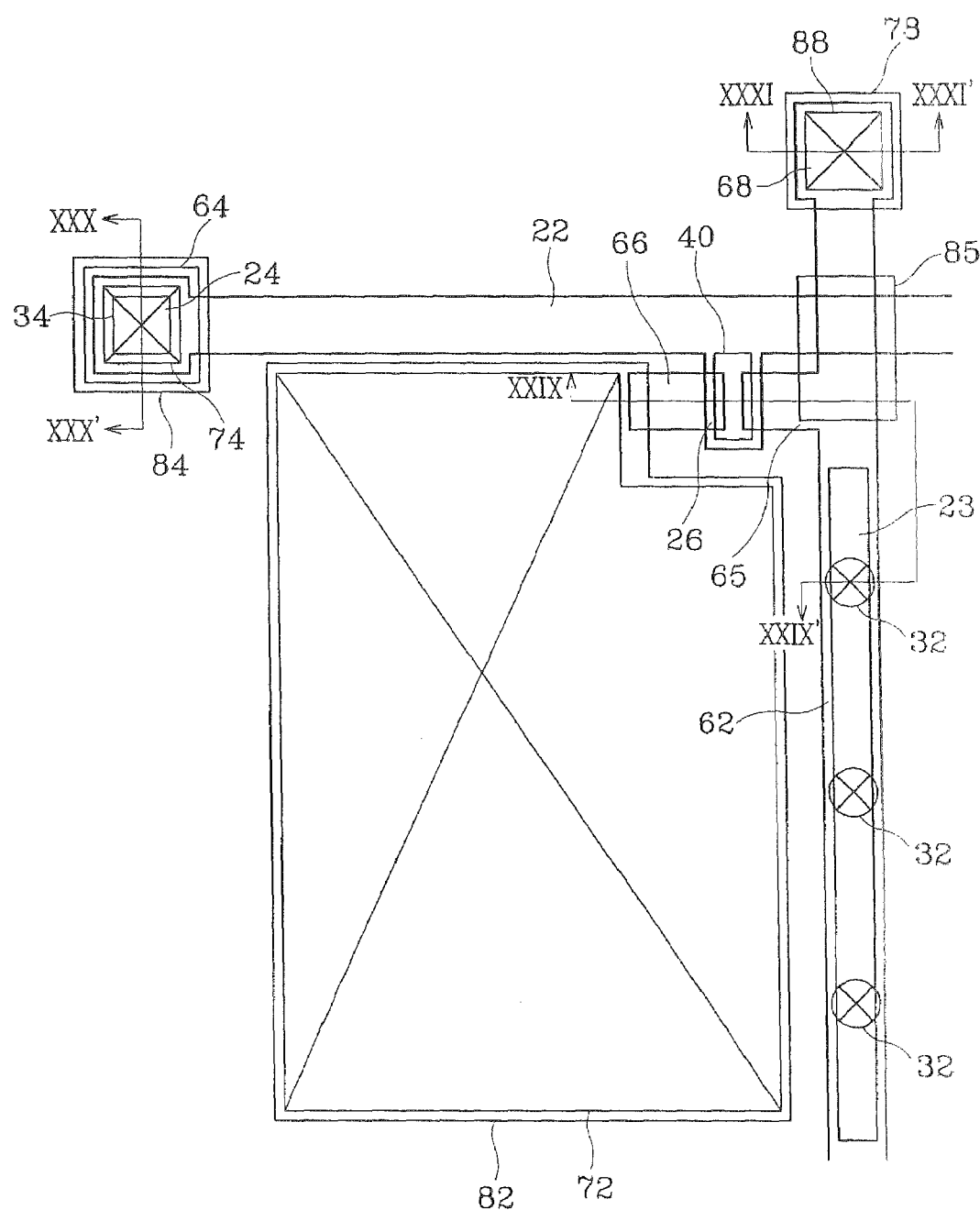
FIG. 28 is a layout view of a thin film transistor array panel for a liquid crystal display according to a fourth embodiment of the present invention.
Figure 29:
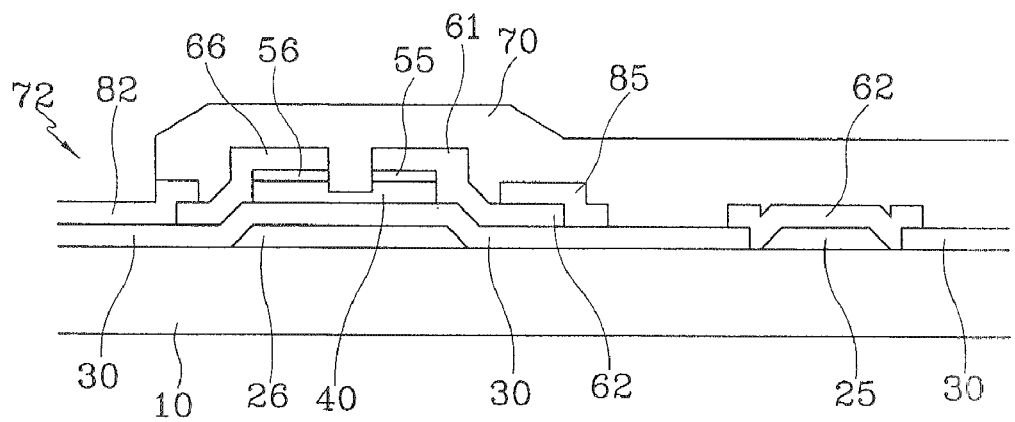
FIGS. 29, 30, and 31 are cross-sectional views taken along lines XXIX-XXIX', XXX-XXX', and XXXI-XXXI' of FIG. 28, respectively.
Figure 30:
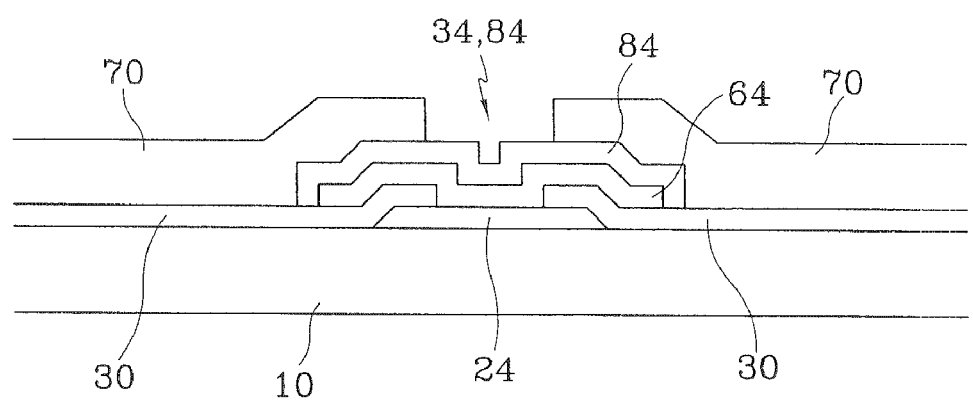
Figure 31:
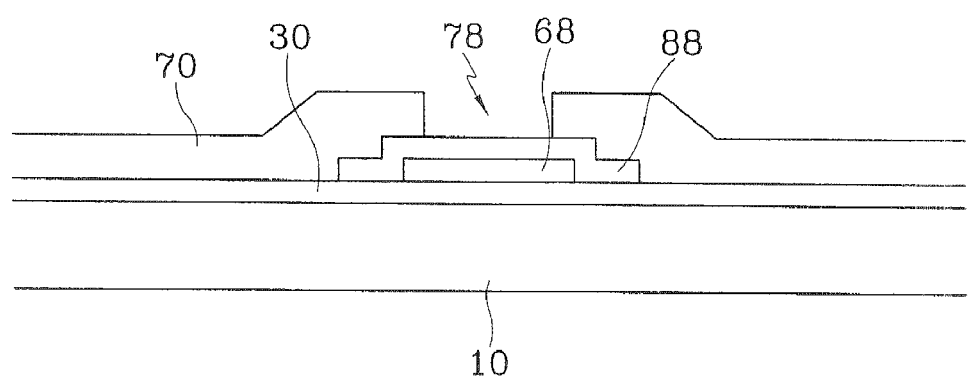
Figure 32A:
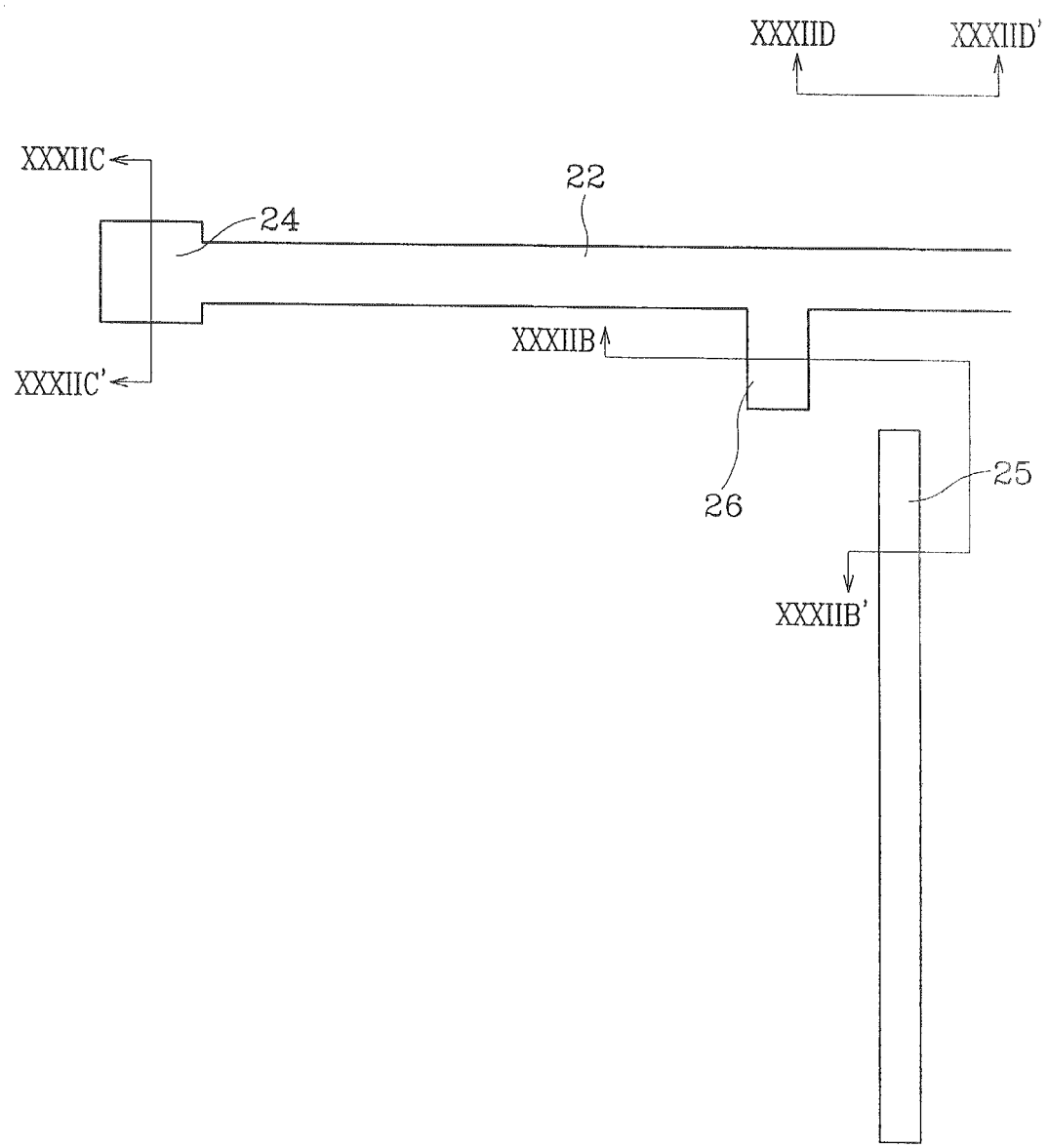
FIGS. 32A to 35D are cross-sectional views illustrating a manufacturing method of the thin film transistor array panel according to the fourth embodiment of the present invention.
Figure 32B:
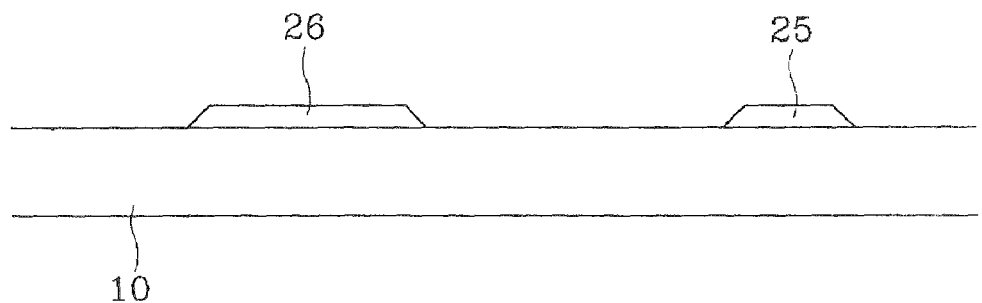
Figure 32C:
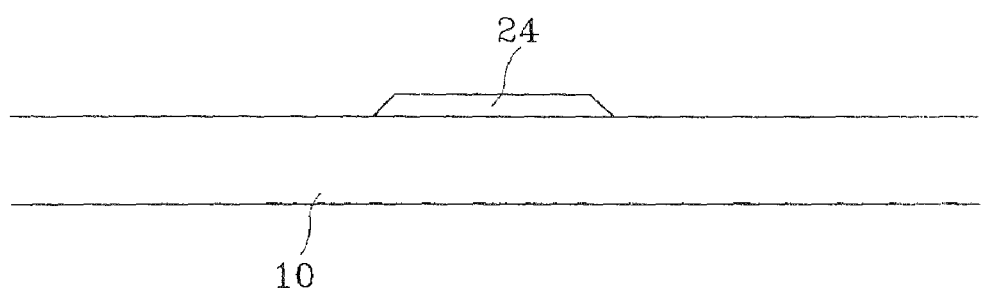
Figure 32D:
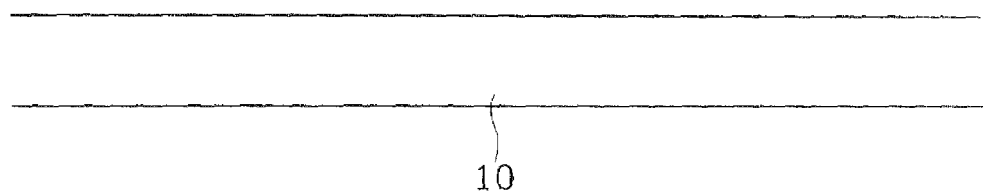
Figure 33A:
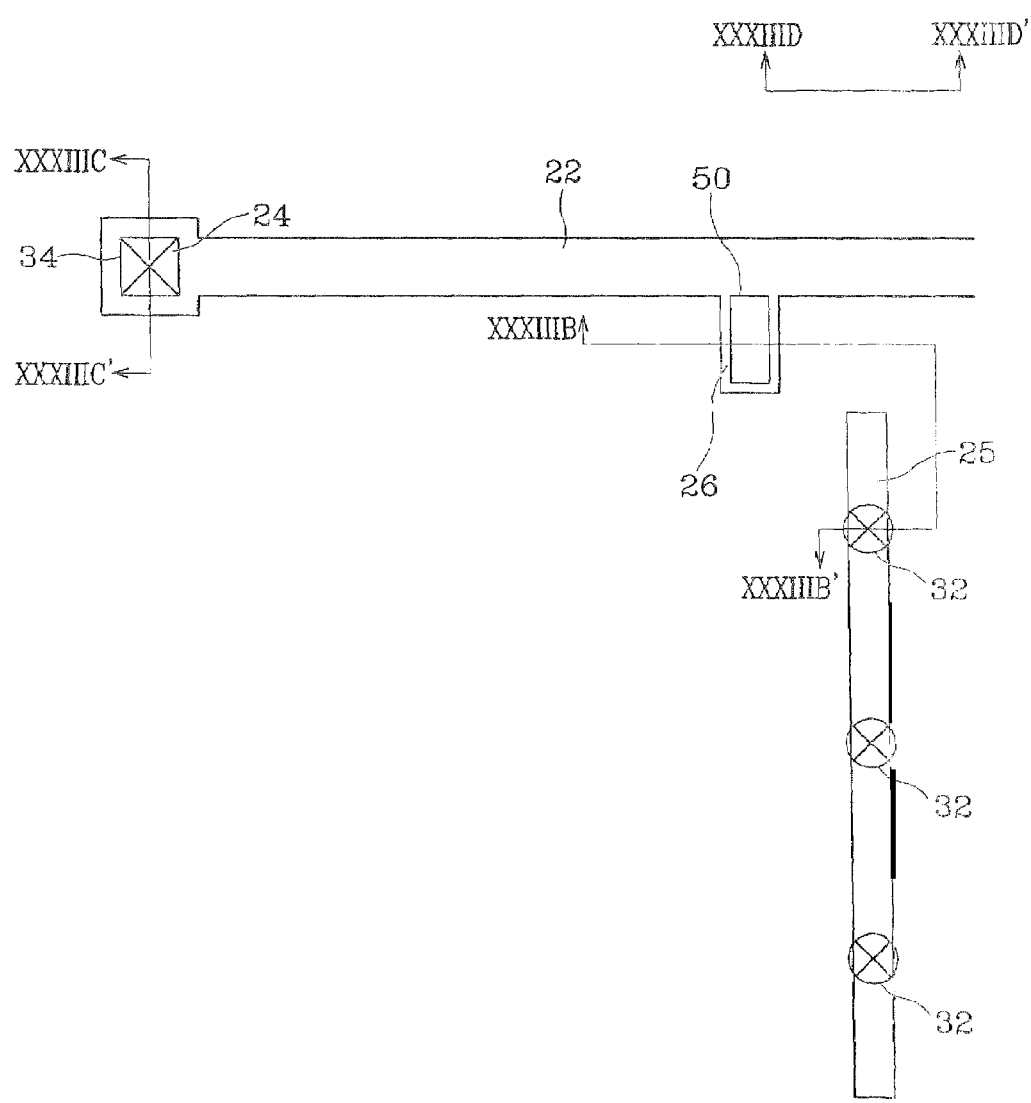
Figure 33B:
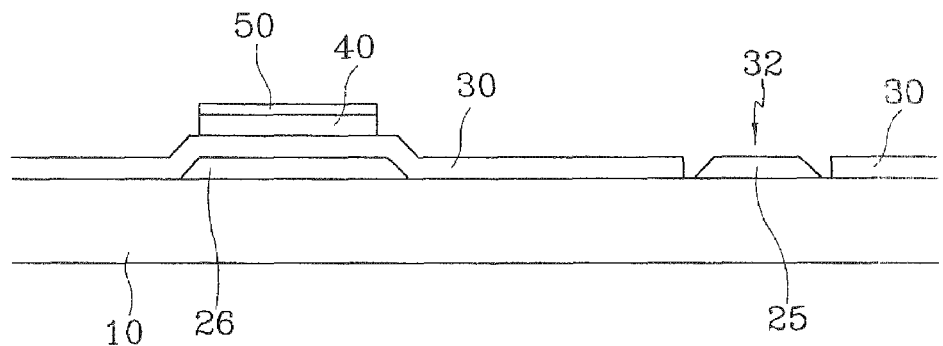
Figure 33C:
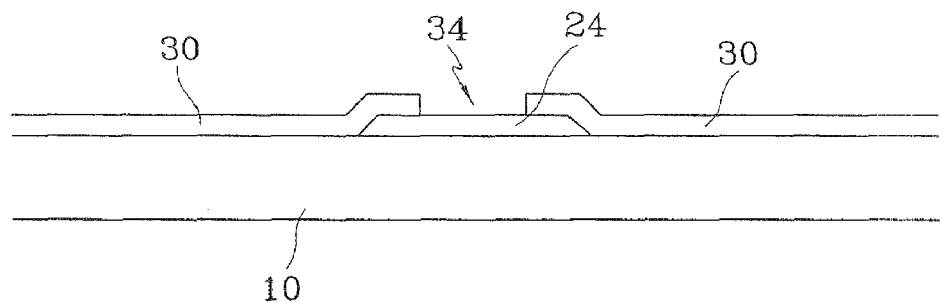
Figure 33D:
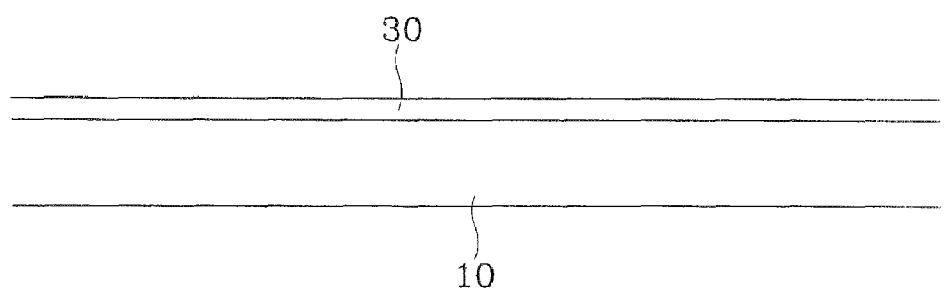
Figure 34A:
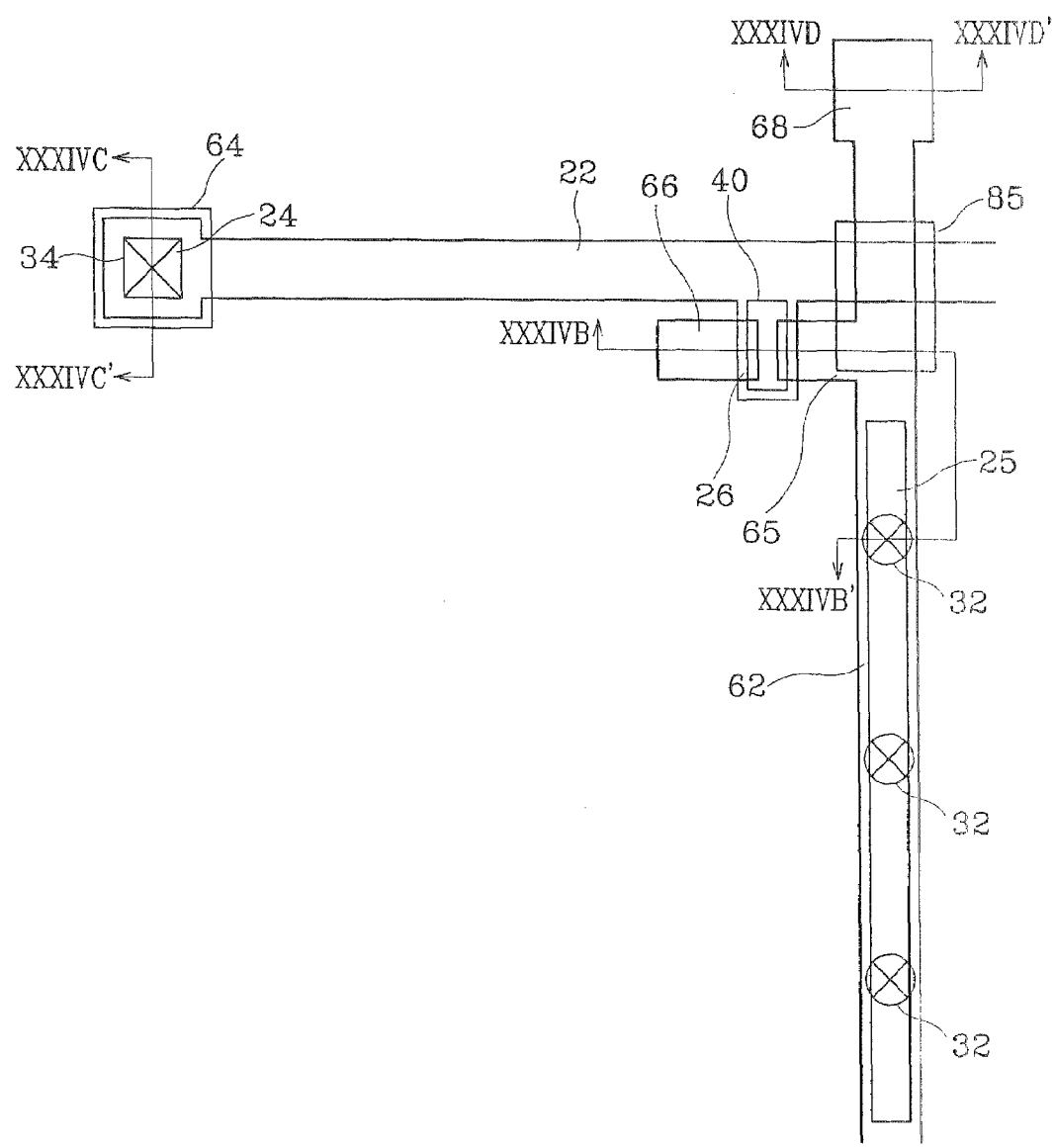
Figure 34B:
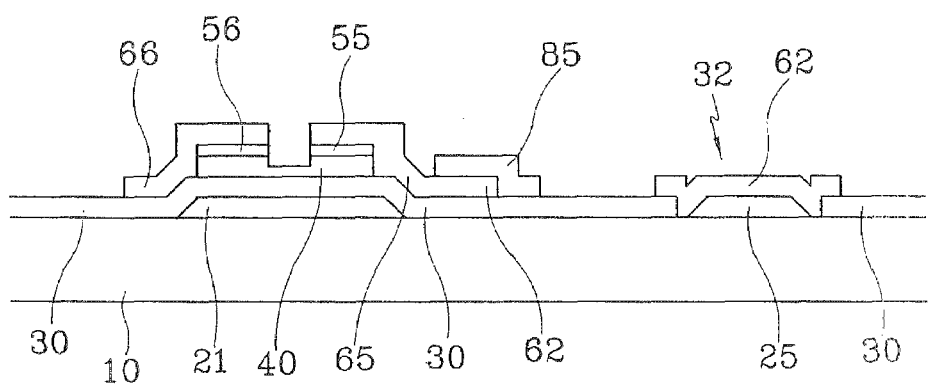
Figure 34C:
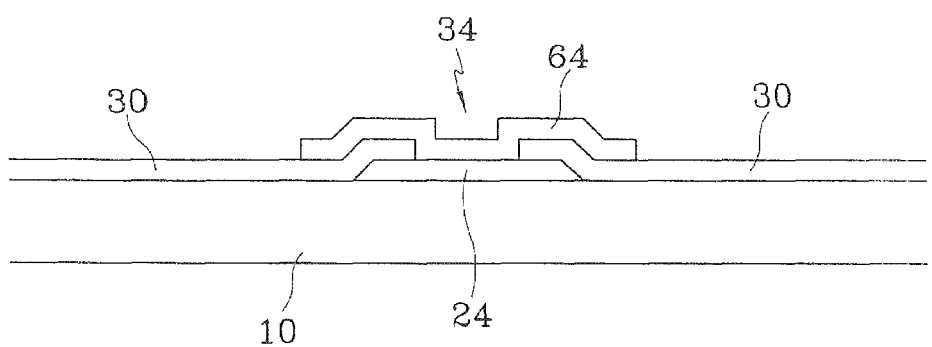
Figure 34D:
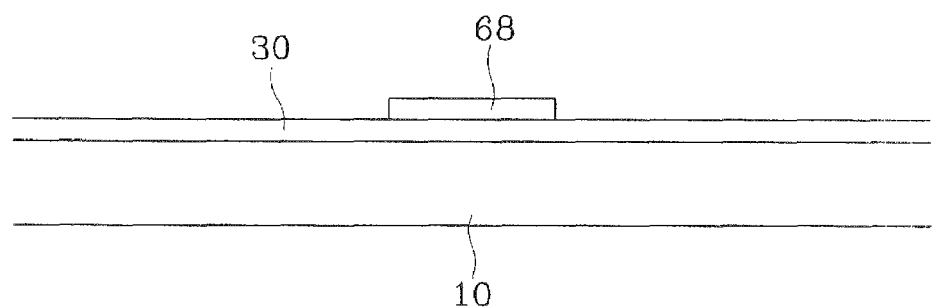
Figure 35A:
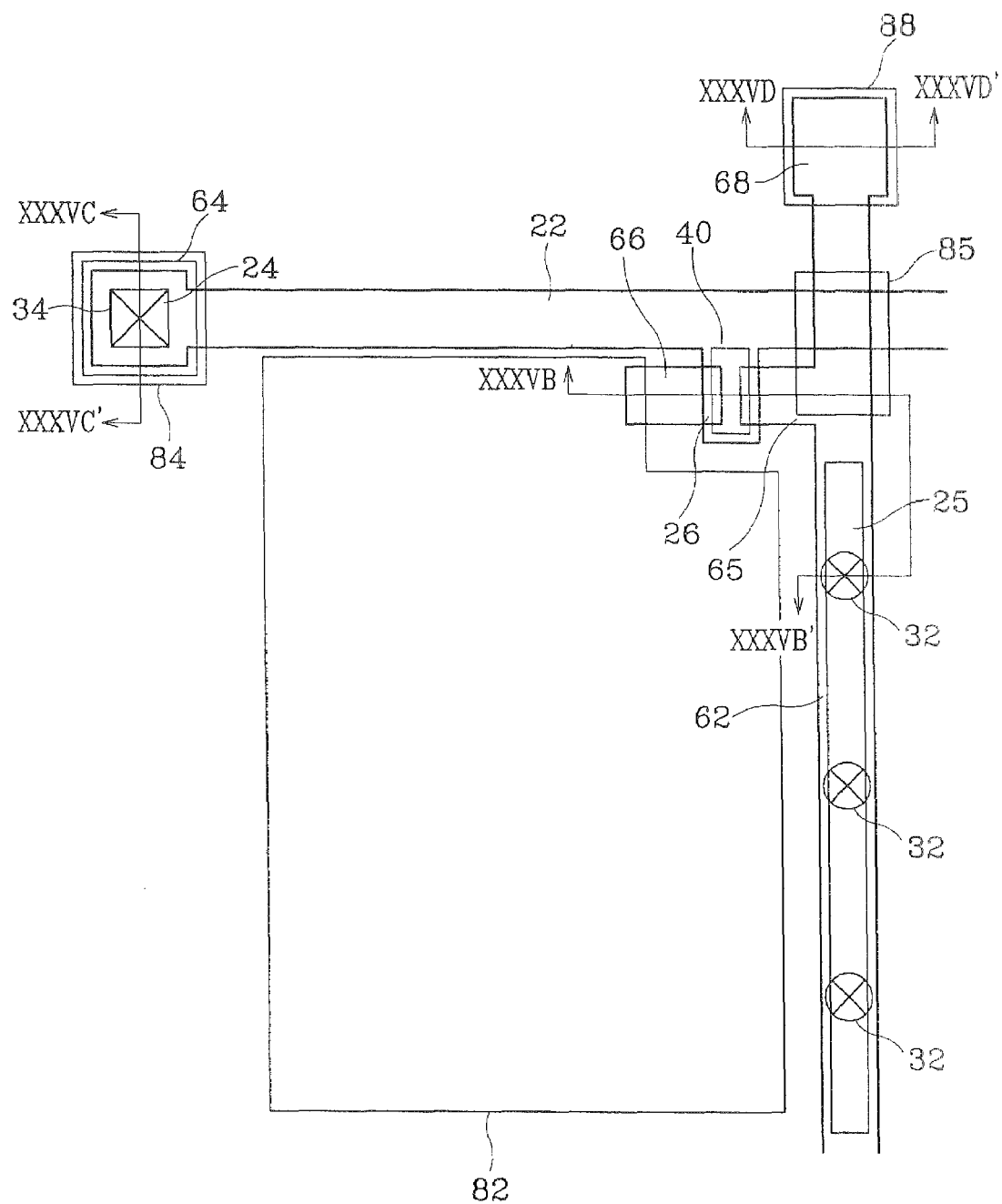
Figure 35B:
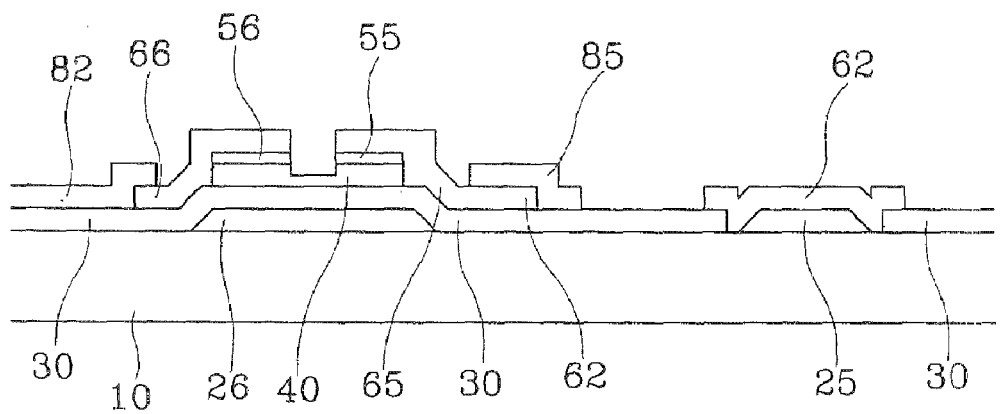
Figure 35C:
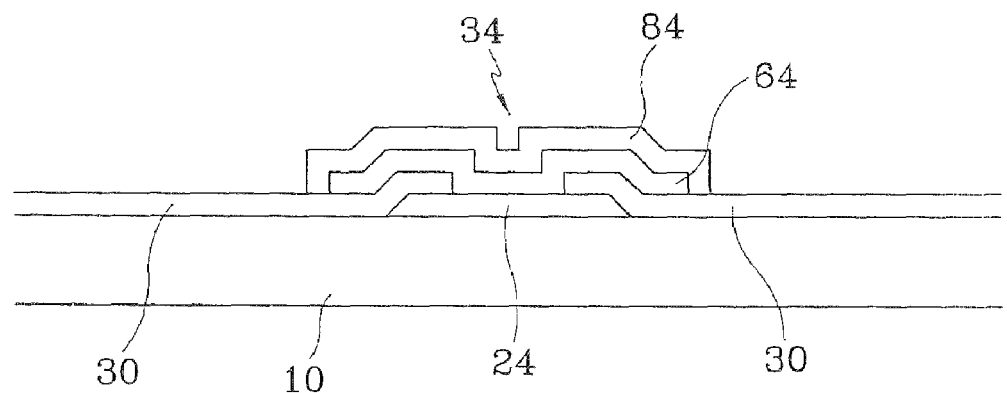
Figure 35D:
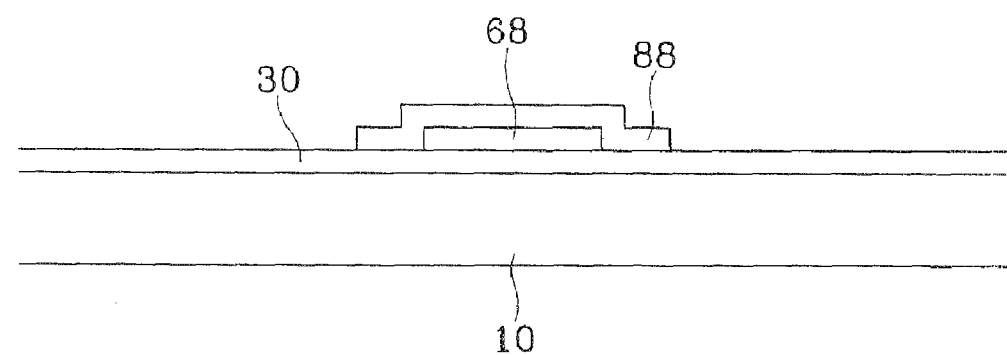

FIG. 28 is a layout view of a thin film transistor array panel for a liquid crystal display according to the fourth embodiment of the present invention, and FIGS. 29, 30, and 31 are cross-sectional views taken along line XXIX-XXIX', XXX-XXX', and XXXI-XXXI' of FIG. 28, respectively.

Most of the structure according to the fourth embodiment is similar to the third embodiment.

However, a pixel electrode 82 of transparent conductive material such as ITO is formed on a gate insulating layer 30 of the pixel enclosed by a gate line 22 and a data line 62, and is connected to the drain electrode 66. A supporting data line 85 is formed on the data line 62 intersecting the gate line 22, and a second redundant gate pad 84 and a redundant data pad 88 are formed on the first redundant gate pad 24 and the data pad 68. The supporting data line 85 prevents the data line 62 from disconnecting due to the steps of the gate line 22

A passivation layer 70 of silicon nitride or silicon oxide is formed on the entire insulating substrate 10. The passivation layer 70 has an opening 72 exposing the greater part of the pixel electrode 82, and has openings 74 and 78 respectively exposing the second redundant gate pad 84 and the data pad 68.

A method for manufacturing a thin film transistor array panel according to the fourth embodiment of the present invention will now be described with reference to the FIGS. 28 to 31 and FIGS. 32A to 35D.

FIGS. 32A to 35D are cross-sectional views illustrating the method for manufacturing the thin film transistor array panel according to the fourth embodiment of the present invention.

As shown in FIGS. 32A to 34D, gate wire parts 22, 24, and 26, a redundant data line 25, a gate insulating layer pattern 30 having contact holes 32 and 34, a semiconductor pattern 40, ohmic contact layer patterns 55 and 56, data wire parts 62, 65, 66, and 68, and a first redundant gate pad 64 are formed on an insulating substrate 10, as in the third embodiment.

Next, as shown in FIGS. 35A to 35D, an ITO layer is deposited and etched through a photolithography step using a mask to form a pixel electrode 82 connected to the drain electrode 66, and to form a second redundant gate pad 84 and a redundant date pad 88 covering the first redundant gate pad 64 and the data pad 68.

Finally, as shown in FIGS. 28 to 31, a passivation layer 70 of silicon-nitride (SiNx) or silicon-oxide (SiOx) is formed and patterned to form opening 72 and contact holes 74 and 78 that respectively expose the second redundant gate pad 84 and the redundant data pad 88 through a photolithography step using a mask.

In the present invention, patterning at least two layers through one photolithography step and forming a gate wire of a single-layered structure simplify the manufacturing process of a thin film transistor panel for a liquid crystal display, and minimize manufacturing costs. Also, a pad portion of conductive material having good contact properties and a wire of aluminum and aluminum alloy make a reliable pad portion and minimize the delay and distortion of signals in a large scale LCD. Covering the wire with the gate insulating layer and the passivation layer prevents corrosion of a wire made of aluminum or aluminum alloy. The passivation layer as the upper most layer prevents a possible short between the data line or the pixel electrode and a common electrode of the upper panel due to conductive particles. Additionally, a supporting portion at the intersection of the gate line and the redundant data line prevents the data line from disconnecting.

In the drawings and specification, typical preferred embodiments of the present invention are disclosed. Although specific terms are employed, they are used in a generic and descriptive sense only and not for purposes of limitation, the scope of the invention being set forth in the following claims.

The invention claimed is:

1. A thin film transistor array panel, comprising:
   a gate line formed on a substrate including a first conductive layer and a second conductive layer on the first conductive layer;
   a storage electrode formed on the substrate and separated from the gate line;
   a first insulating layer formed on the gate line and the storage electrode;
   a semiconductor layer formed on the first insulating layer;
   a data line and a drain electrode formed at least partially on the semiconductor layer;
   a conductor formed on the first insulating layer, overlapping the storage electrode, and separated from the drain-electrode;
   a second insulating layer formed on the data line, the drain electrode and the conductor and having a contact hole exposing the conductor; and
   a pixel electrode formed on the second insulating layer, overlapping the data line, and electrically connected to the drain electrode.

2. A thin film transistor array panel of claim 1, wherein the conductor is made of the same material as the data line.

3. A thin film transistor array panel of claim 1, wherein the semiconductor layer has the same layout as the corresponding data line, the drain electrode and the conductor except for a channel part of a thin film transistor.

4. A thin film transistor array panel of claim 1, wherein the data line is overlapped the pixel electrode.

5. A thin film transistor array panel of claim 1, wherein the gate line comprises a gate pad that is connected to and receives scanning signals from an external circuit.

6. A thin film transistor array panel of claim 5, wherein the gate pad comprises a single-layered structure.

7. A thin film transistor array panel of claim 5, wherein the first insulating layer has a first contact hole exposing the gate pad and the second insulating layer has a second contact hole exposing the gate pad, the first contact hole and the second contact hole have the same form in a plan view.

* * * * *